(12) United States Patent
Yamada et al.

(10) Patent No.: US 9,276,019 B2
(45) Date of Patent: Mar. 1, 2016

(54) METHOD OF MANUFACTURING ELEMENT SUBSTRATE

(75) Inventors: Takaharu Yamada, Osaka (JP); Ryohki Itoh, Osaka (JP); Masahiro Yoshida, Osaka (JP); Hidetoshi Nakagawa, Osaka (JP); Takuya Ohishi, Osaka (JP); Masahiro Matsuda, Osaka (JP); Kazutoshi Kida, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 170 days.

(21) Appl. No.: 14/131,232

(22) PCT Filed: Jul. 12, 2012

(86) PCT No.: PCT/JP2012/067778
§ 371 (c)(1),
(2), (4) Date: Jan. 7, 2014

(87) PCT Pub. No.: WO2013/011911
PCT Pub. Date: Jan. 24, 2013

(65) Prior Publication Data
US 2015/0044789 A1  Feb. 12, 2015

(30) Foreign Application Priority Data
Jul. 19, 2011  (JP) .................................. 2011-157882

(51) Int. Cl.
*H01L 27/12* (2006.01)
*G02F 1/1333* (2006.01)
(Continued)

(52) U.S. Cl.
CPC .......... *H01L 27/1262* (2013.01); *G02F 1/1309* (2013.01); *H01L 22/14* (2013.01); *H01L 22/32* (2013.01); *H01L 27/124* (2013.01); *G02F 1/1345* (2013.01)

(58) Field of Classification Search
CPC ................... H01L 22/10–22/34; H01L 27/24; H01L 27/124; G09G 3/006; G09G 2300/0426; G02F 1/1309
See application file for complete search history.

(56) References Cited

U.S. PATENT DOCUMENTS 7,388,626 B2 * 6/2008 Wu ........................ G09G 3/006
345/87
2008/0088760 A1   4/2008 Kawano et al.
(Continued)

FOREIGN PATENT DOCUMENTS

JP   2000-10063 A   1/2000
JP   2002-9407 A    1/2002
(Continued)

*Primary Examiner* — Marvin Payen
*Assistant Examiner* — Jeremy Joy
(74) *Attorney, Agent, or Firm* — Keating & Bennett, LLP

(57) ABSTRACT

A method of manufacturing an array substrate 20 according to the present invention includes a line forming step, and line forming step includes following performances. A plurality of source lines 27 are formed on a glass substrate GS so as to extend from a first region A1 on the glass substrate GS to a second region A2 that is adjacent to the first region on an outer side thereof. A plurality of source driver side check lines 45A are formed on the glass substrate GS so as to extend from the second region A2 to a third region that is adjacent to the first region A1 on an outer side thereof and adjacent to the second region A2. A plurality of first line connection portions 49 are formed in the second region A2 and the first line connection portions 49 connect the source lines 27 and the first source driver side check lines 45A. A capacity stem line 43 and a common line 44 are formed to extend from the first region A1 to the third region A3. A second source driver side check line 45B and a second line connection portion 50 that connects each of the capacity stem line 43 and the common line 44 and the source driver side check line 45B are formed in the third region A3.

20 Claims, 34 Drawing Sheets

(51) Int. Cl.
*G09G 3/36* (2006.01)
*G02F 1/13* (2006.01)
*H01L 21/66* (2006.01)
*G02F 1/1345* (2006.01)

(56) References Cited

U.S. PATENT DOCUMENTS

2009/0294771 A1* 12/2009 Kim .................. G02F 1/136204
　　　　　　　　　　　　　　　　　　　　　　　　257/59

2010/0149473 A1* 6/2010 Guo ...................... G02F 1/1345
　　　　　　　　　　　　　　　　　　　　　　　　349/122

FOREIGN PATENT DOCUMENTS

| | | |
|---|---|---|
| JP | 2002-090424 A | 3/2002 |
| JP | 2008-70806 A | 3/2008 |
| JP | 2010-181741 A | 8/2010 |

* cited by examiner

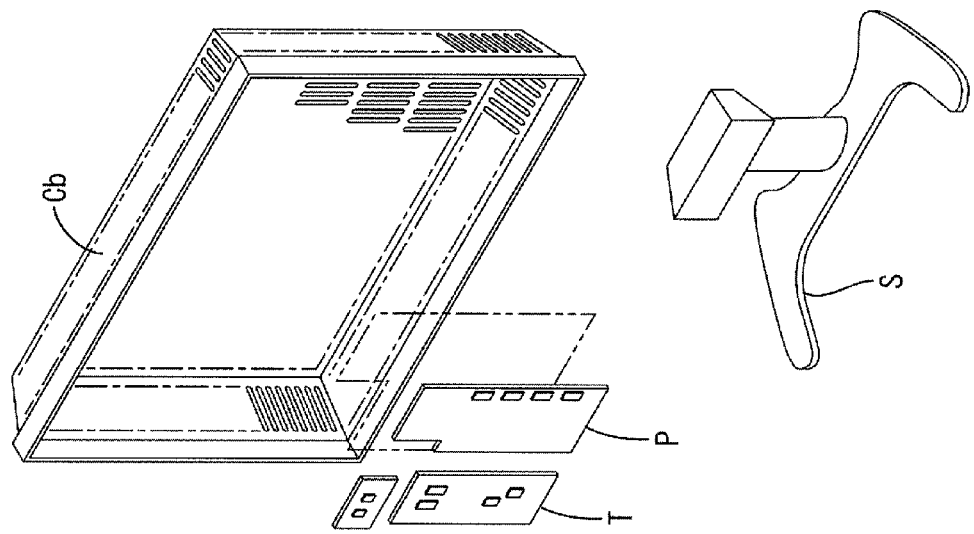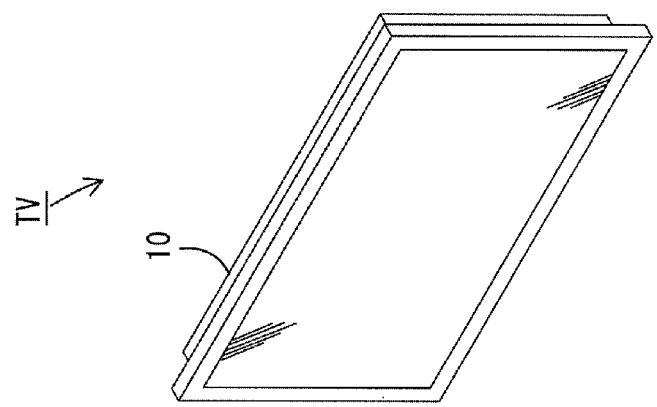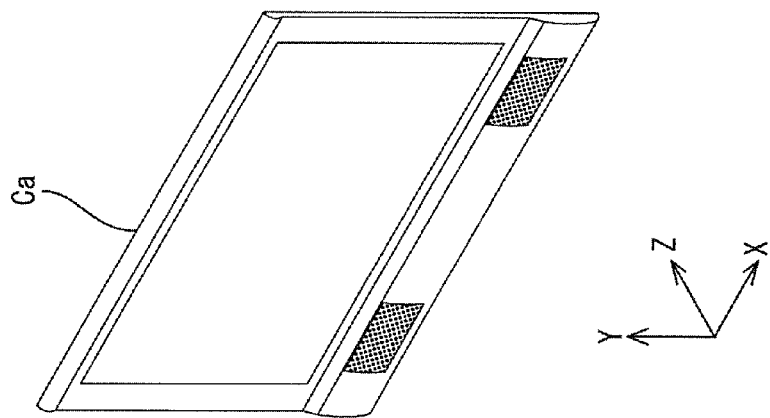

METHOD OF MANUFACTURING ELEMENT SUBSTRATE

TECHNICAL FIELD

The present invention relates to a method of manufacturing an element substrate.

BACKGROUND ART

A liquid crystal panel used in a liquid crystal display device includes a pair of glass substrates and a liquid crystal layer sandwiched between the glass substrates. One of the glass substrates is an array substrate including TFTs as an active element that controls operations of each pixel. A plurality of gate lines and source lines are arranged in a matrix in a display area of the array substrate and the TFT is arranged at each intersection of the gate lines and the source lines. A check line, a line connection portion, and a check signal input portion are arranged in a non-display area that surrounds the display area of the array substrate. The check line is used for checking disconnection or short-circuit of the gate lines or the source lines in the process of manufacturing the array substrate. The line connection portion connects the check line and each line. The check signal input portion is connected to the check line and a check signal is input from via the check signal input portion. The check line, the line connection portion and the check signal input portion are removed after a checking step in the process of manufacturing the array substrate. The method of manufacturing the array substrate is described in Patent Document 1.

Patent Document 1: Japanese Unexamined Patent Application Publication No. 2002-90424

Problem to be Solved by the Invention

If an area of the non-display area of the array substrate is reduced, an area of the display area is increased, and this is useful for increasing a screen size. A plurality of array substrates are manufactured from a large-size mother glass. If an area of the non-display area of each array substrate is reduced, an outer size of each array substrate is also reduced and this increases the number of array substrates obtained from one mother glass. However, if the area of the non-display area is simply reduced, an arrangement space in which the check lines, the line connection portions and the check signal input portions are arranged is also reduced. Accordingly, an enough line width of the check line and an enough area for the check signal input portions may not be ensured, and there are limitations to reduce the area of the non-display area.

DISCLOSURE OF THE PRESENT INVENTION

The present invention was accomplished in view of the foregoing circumstances. An object of the present invention is to provide a method of manufacturing an element substrate having a reduced outer peripheral-side area.

Means for Solving the Problem

To solve the above problem, according to the present invention, a method of manufacturing an element substrate includes a line forming step of forming lines on a substrate, a checking step, and a removing step. The line forming step includes forming a plurality of first lines extending from a first region of the substrate to a second region that is adjacent to the first region on an outer side of the first region, forming a plurality of first check lines extending from the second region to a third region that is adjacent to the first region on the outer side of the first region and adjacent to the second region, forming a plurality of first line connection portions in the second region, the first line connection portions connecting the first lines and the first check lines, forming a second line extending from the first region to the third region, and forming a second check line and a second line connection portion in the third region, the second line connection portion connecting the second line and the second check line. The checking step includes inputting a check signal to the plurality of first check lines and the second check line, and checking the plurality of first lines and the second line. The removing step includes removing at least a part of one of the first check line and the second check line in the second region and the third region, and disconnecting the first line and the first check line and disconnecting the second line and the second check line.

Accordingly, after the lines, check lines, and the line connection portions are formed in the line forming step, it is checked whether disconnection or short-circuit occurs in each line in the checking step. After the checking step, at least a part of each of the check lines is removed in the removing step and the lines and the check lines are disconnected from each other.

In the line forming step, the first check lines are formed to extend from the second region to the third region on the substrate. The first lien connection portions that connect the first check lines and the first lines are formed in the second region, and the second check lines that are connected to the second line and the second line connection portions are formed in the third region. Therefore, compared to a case in which the first check lines, the first line connection portions, and the second check line and the second line connection portion are concentrated in the same region, a distance between the outer end of each of the second region and the third region and the outer end of the first region is maintained to be short. This reduces a size of the second region and the third region, and the first region is increased in its size by the reduced size. In other words, an outer size of the substrate is reduced.

The following configurations may be used in a first aspect of the method of manufacturing an electrode substrate according to the present invention.

(1) In the line forming step, the first check lines may be formed of a same material and formed in a same layer, and the second check line may be formed of a material different from the first check line and may be formed in a layer different from a layer in which the first check line is formed with having an insulation layer between the second check line and the first check line. Accordingly, at least a part of each of the first check line and the second check line may overlap with each other, and therefore, the first check lines and the second check lines may be arranged at a higher density. Accordingly, the second region and the third region may be reduced in size effectively.

(2) In the line forming step, the first lines and the second line may be formed of a same material as the second check line and they may be formed in a same layer, an opening may be formed at a portion of the insulation layer overlapping one of the first line and the first check line, and the first line connection portion may be formed so as to cover the opening. The first line connection portion connects the first line and the first check line that are formed in different layers. Accordingly, the first line connection portion may be formed to cover the opening formed in the insulation layer, and this may effectively connect the first line and the first check line that are formed in different layers. The second line and the second check line may be formed of a same material in a same layer, and therefore they may be effectively connected to each other via the second line connection portion.

(3) In the line forming step, pixel electrodes may be formed and the first line connection portions may be formed with a same material and in a same layer as the pixel electrodes. Accordingly, the first line connection portion may be formed in forming the pixel electrodes, and this may reduce a manufacturing cost.

(4) In the line forming step, an ESD protection circuit that is connected to the plurality of first check lines and the second check line may be formed. Accordingly, the ESD protection circuit may protect the first check line and the second check lines from the ESD (electrostatic discharge).

(5) In the line forming step, a transistor may be formed as the ESD protection circuit. The transistor may connect the first check lines each other and connect the first check line and the second check line, and the transistor may have a threshold voltage value relatively higher than a voltage value of the check signal that is input to the first check line and the second check line in the checking step. Accordingly, if a check signal may be input to one of the first check line and the second check line, the voltage value of the check signal may be relatively lower than a threshold voltage value of the transistor that is the ESD protection circuit. Therefore, the check signal may not be supplied to another one of the first check line and the second check line. Accordingly, the lines may be correctly checked. On the other hand, if the ESD voltage that is greater than the threshold voltage value of the transistor may be applied to one of the check lines, the ESD voltage may be also applied to the other one of the check lines via the transistor. Accordingly, a potential difference may be less likely to be generated between the check lines and between the lines.

(6) In the line forming step, at least a pair of first check lines may be formed so as to be parallel to an outer end of the second region as the plurality of the first check lines, and the plurality of first line connection portions may be arranged between the pair of first check lines that are parallel to the outer end of the second region and along an extending direction in which the first check lines extend. This may shorten a distance between the outer end of the second region and the outer end of the first region and this may further reduce a size of the second region.

(7) In the line forming step, at least a pair of first check lines may be formed so as to be parallel to an outer end of the second region as the plurality of the first check lines, and the plurality of first line connection portions may be formed so as to sandwich at least one of the pair of first check lines that are parallel to the outer end of the second region. Accordingly, the first line connection portions may be arranged at small intervals in an extending direction in which at least the pair of first check lines extend. The pair of first check lines may be parallel to the outer end of the second region. This may reduce a size of the second region in the extending direction in which the pair of first check lines extend.

A second method of manufacturing an element substrate according to the present invention includes a line forming step of forming lines on a substrate, a checking step, and a removing step. The line forming step includes forming a line extending from a non-removing area of the substrate to a first removing area that is adjacent to the non-removing area on an outer side, forming a check line extending from the first removing area to a second removing area that is adjacent to the non-removing area on an outer side and adjacent to the first removing area, forming a line connection portion in the first removing area, the line connection portion connecting the line and the check line, and forming a check signal input portion extending from the non-removing area to the second removing area, the check signal input portion being connected to the check line. In the checking step, a check signal is input to the check signal input portion and checking the line via the check line. In the removing step, at least a part of at least the line check line and the line connection portion is removed and the line is disconnected from the check line and a part of the check signal input portion is removed.

Accordingly, after forming the lines, the check lines, the line connection portion, and the check signal input portion in the line forming step, the checking step is performed to check whether disconnection or short-circuit occurs in each of the lines. After performing the checking step, the removing step is performed to remove at least a part of the line connection portion of at least the check line. Accordingly, the line and the check line are disconnected from each other and a part of the check signal input portion is removed.

In the line forming step, the check line is formed to extend from the first removing area to the second removing area, and the line connection portion connecting the check line and the line is formed in the first removing area, and the check signal input portion is formed in the second removing area. Therefore, compared to a case in which the check line, the line connection portion, and the check signal input portion are concentrated in the same area, a distance between an outer end of each of the first removing area and the second removing area and an outer end of the non-removing area is shortened. This reduces the first removing area and the second removing area and this increases the non-removing area by the reduced size. In other words, the outer size of the substrate is reduced. Further, the check signal input portion extends from the first removing area to the non-removing area, and therefore, compared to a case in which the check signal input portion is formed only in the first removing area, a sufficient large area is provided for the check signal input portion. This improves workability of inputting the check signal to the check signal input portion in the checking step and this effectively reduces a cost for equipments used in the checking step.

A third method of manufacturing an element substrate according to the present invention includes a line forming step of forming lines on a substrate, a checking step, and a removing step. The line forming step includes forming at least a pair of lines extending from an inner peripheral side area of the substrate to a pair of outer peripheral side areas that are located to sandwich the inner peripheral side area from outer sides, forming one check line in one of the pair of outer peripheral side areas, the one check line being connected to one end side of one of the pair of lines, and forming another check line in another one of the pair of outer peripheral side areas, the other check line being connected to another end side of the pair of lines. In the checking step, a check signal is input to the one check line and the other check line and at least the pair of lines are checked. In the removing step, at least a part of each of the one check line and the other check line in the pair of outer peripheral side areas is removed and the one line is disconnected from the one check line and the other line is disconnected from the other check line.

Accordingly, after the lines and the check lines are formed on the substrate via the line forming step, it is checked whether disconnection or short-circuit occurs in each of the lines in the checking step. After performing the checking step, at least a part of each of the check lines is removed in the removing step, the line is disconnected from the check line.

In the line forming step, one check line that is connected to one end of one line is formed in one of the pair of outer peripheral side areas that are located to sandwich the inner peripheral area of the substrate from both outer sides, and another check line that is connected to another end side of the other line is formed in another one of the pair of outer peripheral side areas. Therefore, compared to a complicated connection structure in which the check lines are concentrated in one-side outer peripheral side area, the connection structure of the check lines and the lines is simplified and a distance between the outer end of the outer peripheral side area and the outer end of the inner peripheral side area is kept to be small. This is likely to reduce the outer peripheral side area the inner peripheral side area is increased by the reduced size. In other words, the outer size of the substrate is reduced.

The following configurations may be used in a third aspect of the method of manufacturing an electrode substrate according to the present invention.

(1) A substrate cutting step of cutting a substrate parent material into a plurality of substrates may be performed between the line forming step and the checking step. In the line forming step, at least one of the one check line and the other check line may be formed so as to cross a cutting position of the substrate in the substrate cutting step. Accordingly, before performing the substrate cutting step, the check line that is formed to cross the cutting position of the substrate parent material may have a sufficient line width and a low line resistance. This may be effective for dealing with the electrostatic discharge (ESD). After performing the substrate cutting step, the check line may be located at the outer end of the outer peripheral side area, and the check line may have a sufficient line width and this may be effective for dealing with the ESD.

(2) In the line forming step, a second line may be formed in one of the pair of outer peripheral side areas, a second check line connected to the second line may be formed to cross the cutting position of the substrate in the substrate cutting step, and a check line connection portion may be formed in an area that is on an outer side from the cutting position of the substrate in the substrate cutting step, the check line connection portion being connected to the second check line and one of the one check line and the other check line. In the substrate cutting step, the check line connection portion may be removed from the substrate according to the cutting of the substrate parent material into the substrates. Accordingly, before performing the substrate cutting step, one of the one check line and the other check line that are formed to cross the cutting position of the substrate may be connected to the second check line via the check line connection portion. This lowers a line resistance between the second check line and one of the one check line and the other check line that are connected to each other. This is further effective for dealing with the ESD.

The following configurations may be used in the first to the third aspect of the method of manufacturing an electrode substrate according to the present invention.

(1) In the line forming step, a plurality of removal check signal input portions may be formed in an area of the substrate in which apart of the substrate is not to be removed in the removing step, and a removal check connection line may be formed in a part of the substrate that is to be removed in the removing step, the removal check connection line connecting the removal check signal input portions each other. After the removing step, the removal checking step may be performed and in the removal checking step, it may be judged whether the removing step is correctly performed based on a current flowing state between the removal check signal input portions. Accordingly, if the removing step is correctly performed, the removal check connection line may be removed, and therefore, a current does not flow between the removal check signal input portions in the removal checking step. If the removing step is not correctly performed, the removal check connection line may not be completely removed, and therefore, a current flows between the removal check signal input portions in the removal checking step. The number of defective products is reduced via the removal checking step.

(2) In the removing step, a part of the substrate having a predetermined area ranging from an outer end may be chamfered. Accordingly, compared to a case in which the outer end side portion of the substrate is cut off and removed from the substrate in the removing step, the second region and the third region of the substrate, the first removing area and the second removing area, or the outer peripheral side areas are effectively reduced in size. Further, this reduces a cost for the devices used in the removing step.

(3) A polarizing plate mounting step may be performed prior to the removing step and a polarizing plate may be mounted on a surface of the substrate opposite to a line forming surface thereof. Accordingly, in the polarizing plate mounting step, static electricity may be easily generated in mounting the polarizing plate. However, the check lines formed on the substrate may protect the lines from the electrostatic discharge (ESD).

Advantageous Effects of the Invention

According to the present invention, a method of manufacturing an element substrate having a reduced outer peripheral-side area is provided.

BRIEF DESCRIPTION OF THE DRAWINGS

FIG. 1 is an exploded perspective view illustrating a general construction of a television device according to a first embodiment of the present invention.

MODES FOR CARRYING OUT THE INVENTION

First Embodiment

Figure 2:
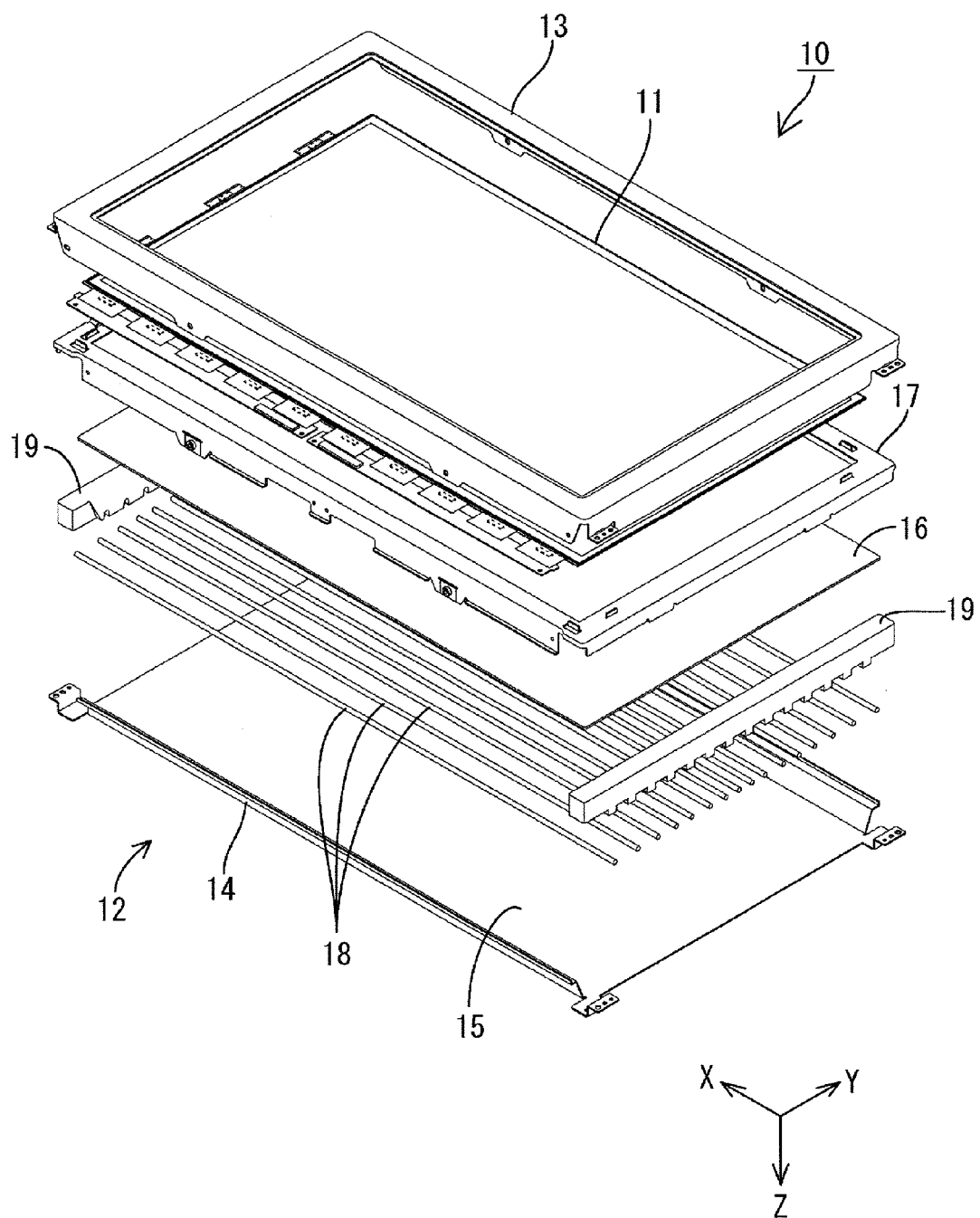
FIG. 2 is an exploded perspective view illustrating a general construction of a liquid crystal display device included in the television device.
Figure 3:
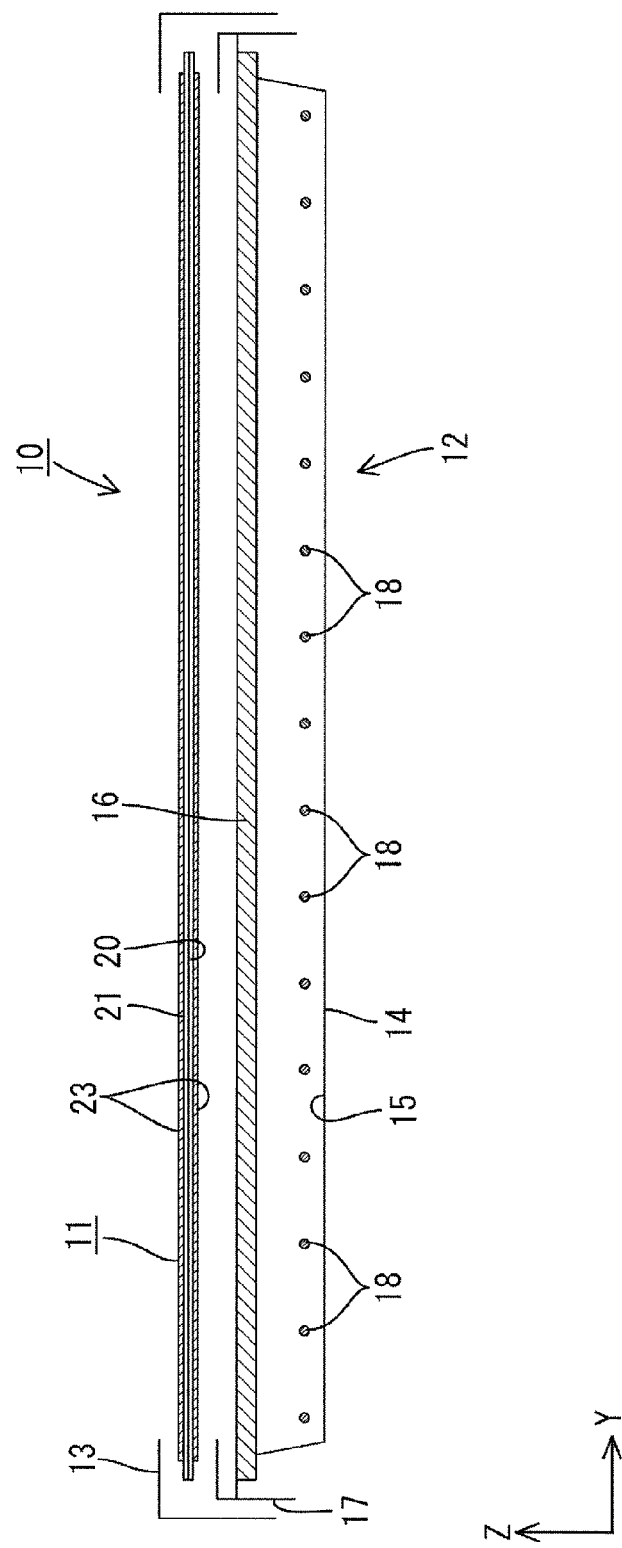
FIG. 3 is a cross-sectional view generally illustrating a cross-sectional configuration of the liquid crystal display device.

A first embodiment of the present invention will be explained with reference to FIGS. 1 to 15. In this embodiment, a method of manufacturing an array substrate 20 included in a liquid crystal panel (a display panel) 11 of a liquid crystal display device 10 will be described as an example. In a part of each drawing, an X-axis, a Y-axis, and a Z-axis are described as necessary and a direction of each axis matches a direction illustrated in each drawing. An upper side in FIG. 3 is a front side and a lower side in FIG. 3 is a rear side.

As illustrated in FIG. 1, a television device TV according to this embodiment includes the liquid crystal display device (the display device) 10, front and rear cabinets Ca, Cb that sandwich the liquid crystal display device 10 therebetween, a power source P, a tuner T, and a stand S. The liquid crystal display device 10 is formed in a rectangular square shape as a whole. As illustrated in FIGS. 2 and 3, the liquid crystal display device 10 includes the liquid crystal panel 11 as a display panel and a backlight device (a lighting device) 12 that is an external light source, and the components are integrally held by a bezel 13.

A general configuration of the backlight device 12 will be explained. The backlight device 12 includes a light source arranged directly below the liquid crystal panel 11 and the backlight device 12 is a so-called direct-type backlight device. The backlight device 12 includes a chassis 14, a reflection sheet (a reflection member) 15, an optical member 16, a frame 17, a plurality of cold cathode tubes (light source) 18, and a lamp holder 19. The chassis 14 has a light exit portion that is open to a front side (a light exit side, a liquid crystal panel 11 side). The reflection sheet 15 is arranged in the chassis 14. The optical member 16 is arranged to cover the light exit portion of the chassis 14. The frame 17 holds the optical member 16. The cold cathode tubes 18 are aligned with each other and arranged in the chassis 14. The lamp holder 19 shields end portions of the cold cathode tubes 18 from light and has light reflectivity.

Figure 4:
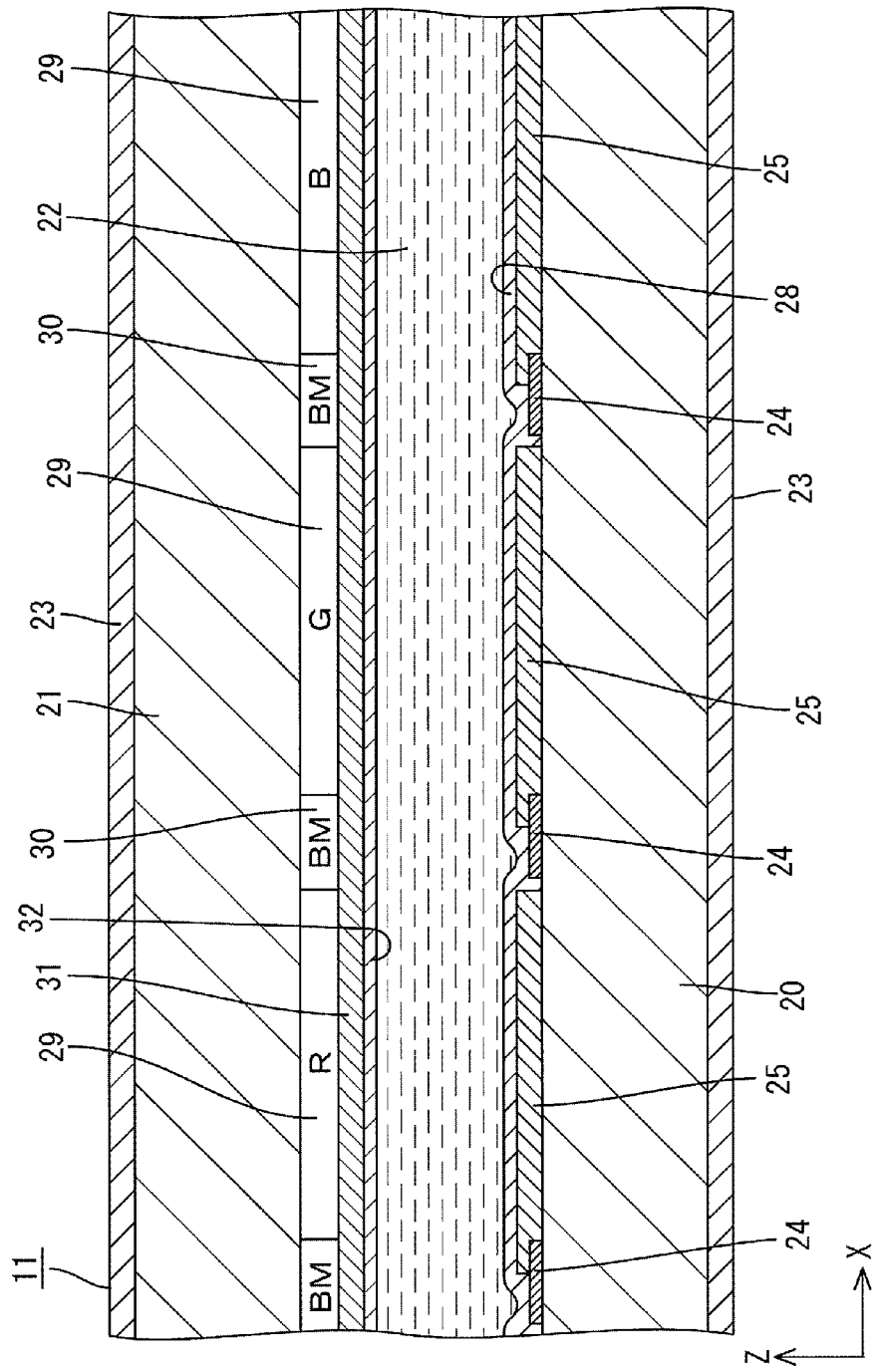
FIG. 4 is a cross-sectional view generally illustrating a cross-sectional configuration of a liquid crystal panel.
Figure 8:
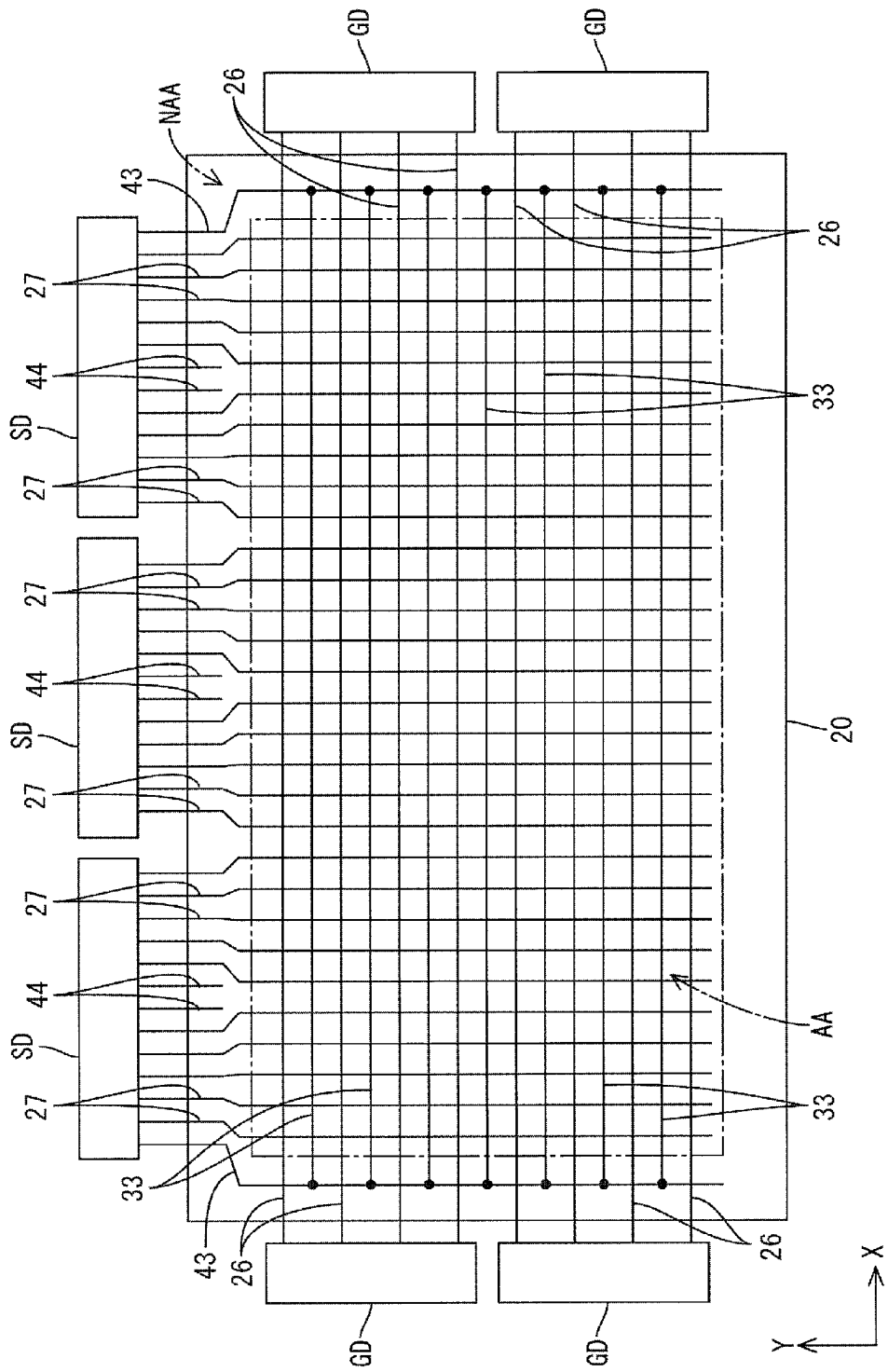
FIG. 8 is a plan view generally illustrating a wiring configuration on the array substrate included in the liquid crystal panel.

Next, the liquid crystal panel 11 will be explained. As illustrated in FIG. 4, the liquid crystal panel 11 includes a pair of substrates 20, 21 and a liquid crystal layer 22 enclosed between the substrates 20, 21. The liquid crystal layer 22 contains liquid crystal materials that change optical characteristics according to impression of an electric field. The liquid crystal layer 22 is enclosed between the substrates 20, 21. The liquid crystal panel 11 includes a display area (an inner peripheral side area) AA and a non-display area (an outer peripheral side area) NAA (refer to FIG. 8). The display area AA is located in a central area in a screen and capable of displaying images. The non-display area NAA is located on an outer peripheral end side of the screen and formed in a frame shape that surrounds the display area AA. The non-display area is incapable of displaying images. In FIG. 8, an area surrounded by an alternate long and short dash line represents the display area AA. A pair of polarizing plates are adhered to outer surfaces of the substrates 20, 21, respectively.

Figure 15:
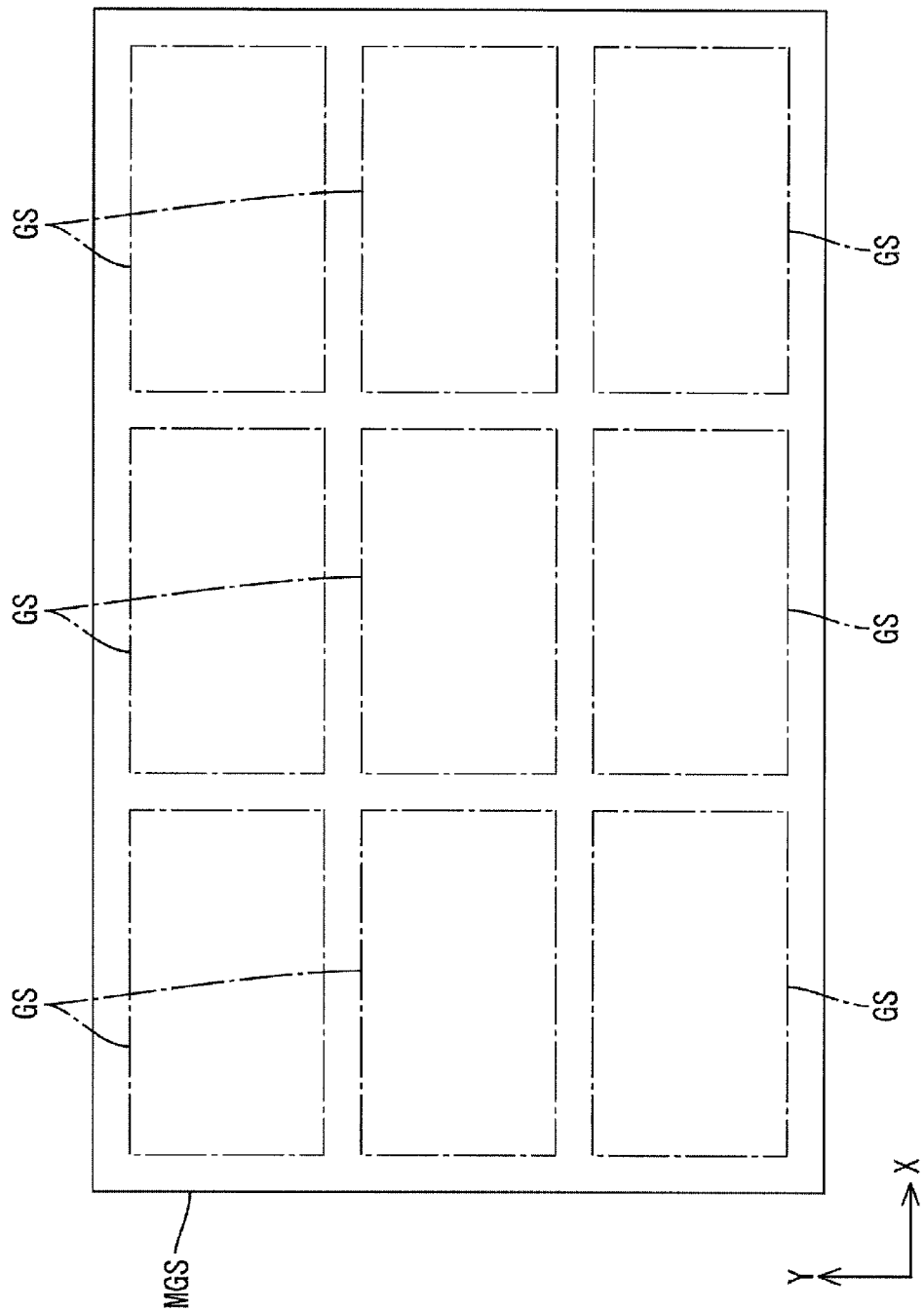
FIG. 15 is a plan view illustrating a mother glass.

One of the pair of substrates 20, 21 included in the liquid crystal panel 11 that is arranged on a rear-surface side (the back light device 12 side) is an array substrate (an element substrate, an active matrix substrate) 20, as illustrated in FIG. 4. Another one of the pair of substrates 20, 21 that is arranged on a front-surface side (a light exit side) is a CF substrate (a counter substrate) 21. Each of the array substrate 20 and the CF substrate 21 includes a transparent (light transmissive) substrate GS made of glass and various structures (thin films) that are laminated on the substrate GS. As illustrated in FIG. 15, in manufacturing the array substrate 20 and the CF substrate 21, a large mother glass (substrate parent material) MGS is used such that a plurality of glass substrates GS are obtained from the large mother glass. Accordingly, manufacturing efficiency is likely to be improved and a cost for manufacturing equipments is likely to be reduced. Specifically, one mother glass MGS is divided into nine pieces and nine glass substrates GS are obtained. A frame surrounded by an alternate long and short dash line in FIG. 15 represents an outer shape of each glass substrate GS.

Figure 5:
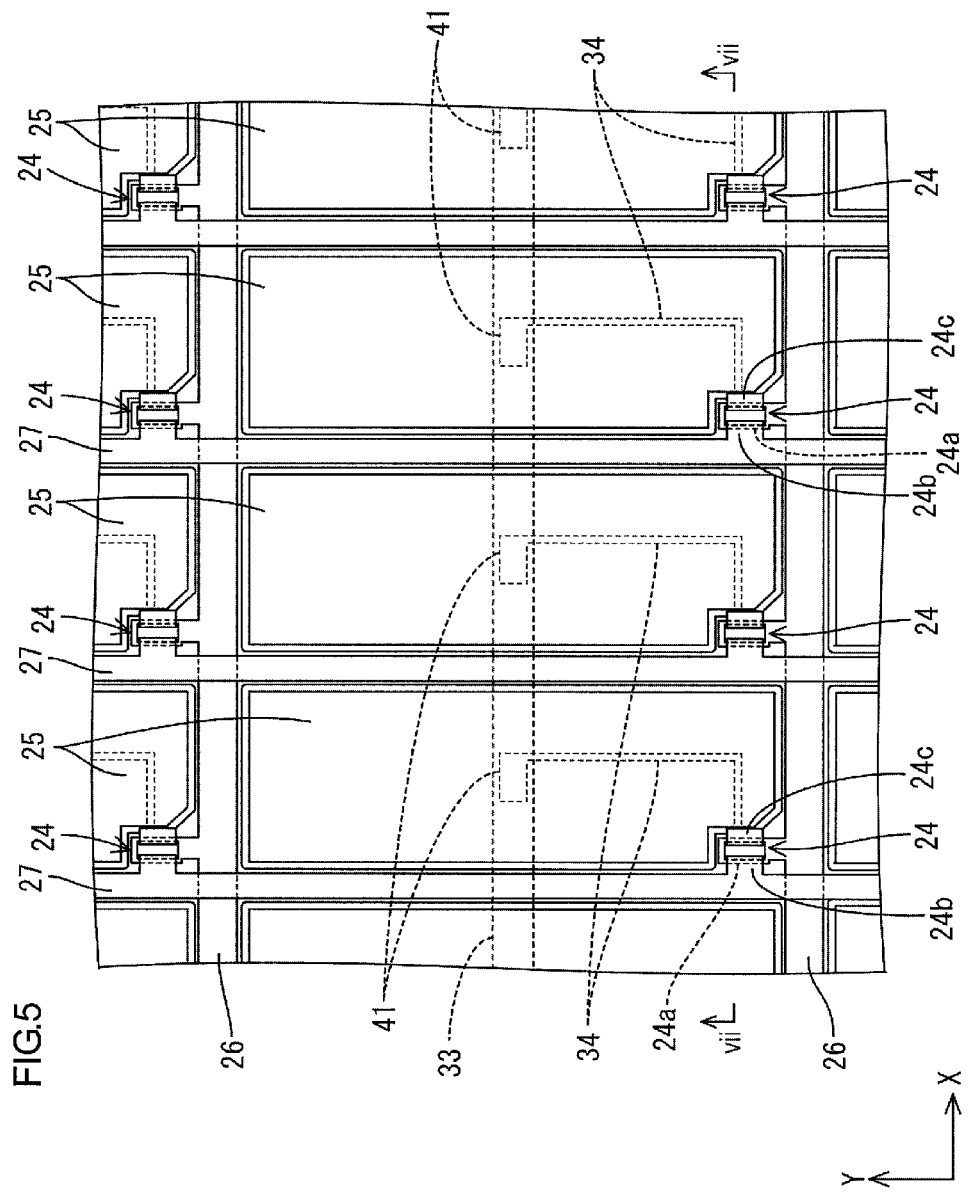
FIG. 5 is a plan view illustrating a plan configuration of a display area of an array substrate included in the liquid crystal panel.

A general configuration of the display area AA in the array substrate 20 will be explained. As illustrated in FIG. 5, in the display area AA on an inner side (the liquid crystal layer 22 side, a surface facing the CF substrate 21, a surface on which lines are arranged) of the array substrate 20, a plurality of TFTs (thin film transistor) 24 that are switching components and each of which includes three electrodes 24a to 24c and a plurality of pixel electrodes 25 are arranged. Gate lines 26 and source lines 27 that are arranged in a matrix are arranged to surround the TFTs 24 and the pixel electrodes 25. The pixel electrode 25 is formed of a light transmissive conductive material (transparent conductive material) such as ITO (Indium Tin Oxide) or IZO (Indium Zinc Oxide). The gate lines 26 and the source lines 27 are formed of a conductive metal material. Specifically, each source line 27 includes different kinds of metal films 39, 40 that are laminated and is formed in a two-layer structure. A lower side metal film 39 is made of titanium (Ti) and an upper side metal film 40 is made of aluminum (Al) (refer to FIG. 7). The gate line 26 and the source line 27 are connected to the gate electrode 24a and the source electrode 24b of the TFT 24, respectively. Accordingly, the pixel electrode 25 is connected to the drain electrode 24c of the TFT 24 via a drain line 34. The array substrate 20 includes capacity lines (auxiliary capacity lines, storage capacity lines, Cs lines) 33 that are parallel to the gate lines 26 and overlap the pixel electrodes 25 in a plan view. The capacity line 33 is formed of the same material as the gate line 26 and they are formed in the same layer in the same step of the manufacturing process. The capacity lines 33 and the gate lines 26 are arranged alternately with respect to the Y-axis direction. The gate line 26 is arranged between the pixel electrodes 25 that are arranged adjacent to each other in the Y-axis direction. Each capacity line 33 is arranged to cross a substantially middle portion of each pixel electrode 25 in the Y-axis direction. An alignment film 28 is formed on an inner surface side of the array substrate 20 (FIG. 4). The alignment film 28 aligns liquid crystal molecules included in the liquid crystal layer 22.

Figure 6:
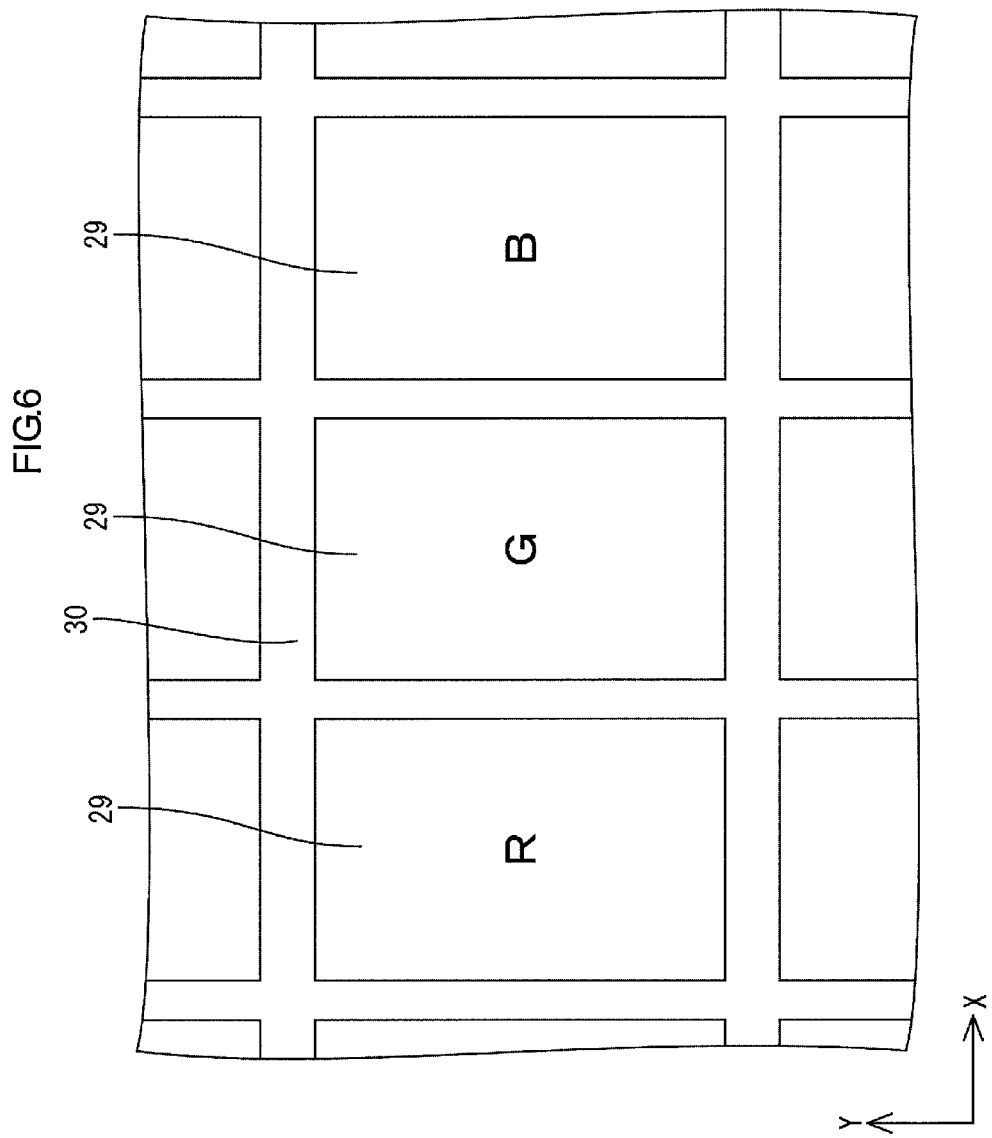
FIG. 6 is a plan view illustrating a plan configuration of a display area of a CF substrate included in the liquid crystal panel.

Next, a general configuration of the display area AA in the CF substrate 21 will be explained. As illustrated in FIGS. 4 and 6, in the display area AA on an inner side (the liquid crystal layer 22 side, a surface facing the array substrate 20) of the CF substrate 21, a plurality of color filters are arranged to overlap the pixel electrodes 25 on the array substrate 20, respectively. The color filters includes coloring sections 29 each provides colors of red (R), green (G), and blue (B) that are arranged in the X-axis direction. Each coloring section 29 has an elongated rectangular outer shape similar to an outer shape of the pixel electrode 25 with a plan view. A light blocking section (a black matrix) 30 is formed between the coloring sections 29 included in the color filter. The light blocking sections 30 are formed in a matrix and prevent the colors from being mixed. The light blocking sections 30 are arranged to overlap the gate lines 26, the source lines 27 and the capacity lines 33 on the array substrate 20 side with a plan view. A counter electrode 31 is arranged on a surface of each coloring section 29 and the light blocking sections 30 so as to face the pixel electrode 25 on the array substrate 29 side. An alignment film 32 is provided on an inner side surface of the CF substrate 21. The alignment film 32 aligns the liquid crystal molecules included in the liquid crystal layer 22.

The alignment films 28, 32 that are formed on the substrate 20, 21, respectively are vertical alignment films that align the liquid crystal molecules included in the liquid crystal layer 22 to be vertical and are light alignment films. Surfaces of the light alignment films are subjected to light alignment processing and alignment restriction force is applied to the liquid crystal molecules. In the manufacturing process of manufacturing each substrate 20, 21, the light alignment processing is performed. Specifically, after each alignment film 28, 32 is formed, light having a specific wavelength range such as a ultraviolet light (UV light) is irradiated to a surface of each alignment film 28, 32 at a specific angle, and accordingly, the liquid crystal molecules are aligned along a light irradiation direction. In the light alignment processing, the light irradiation direction is changed in some ranges on a plane of each of the alignment films 28, 32. Accordingly, while the alignment films 28, 32 are arranged to face each other, one pixel area (for example, one transparent electrode 25) is divided into four areas each having a different alignment direction of the liquid crystal molecules. Namely, the pixel area is divided into four domains. Accordingly, viewing angle characteristics are averaged and good display quality is obtained. Regarding the light alignment processing, for example, the technology described in Japanese Unexamined Patent Application Publication No. 2008-145700 is used.

Figure 7:
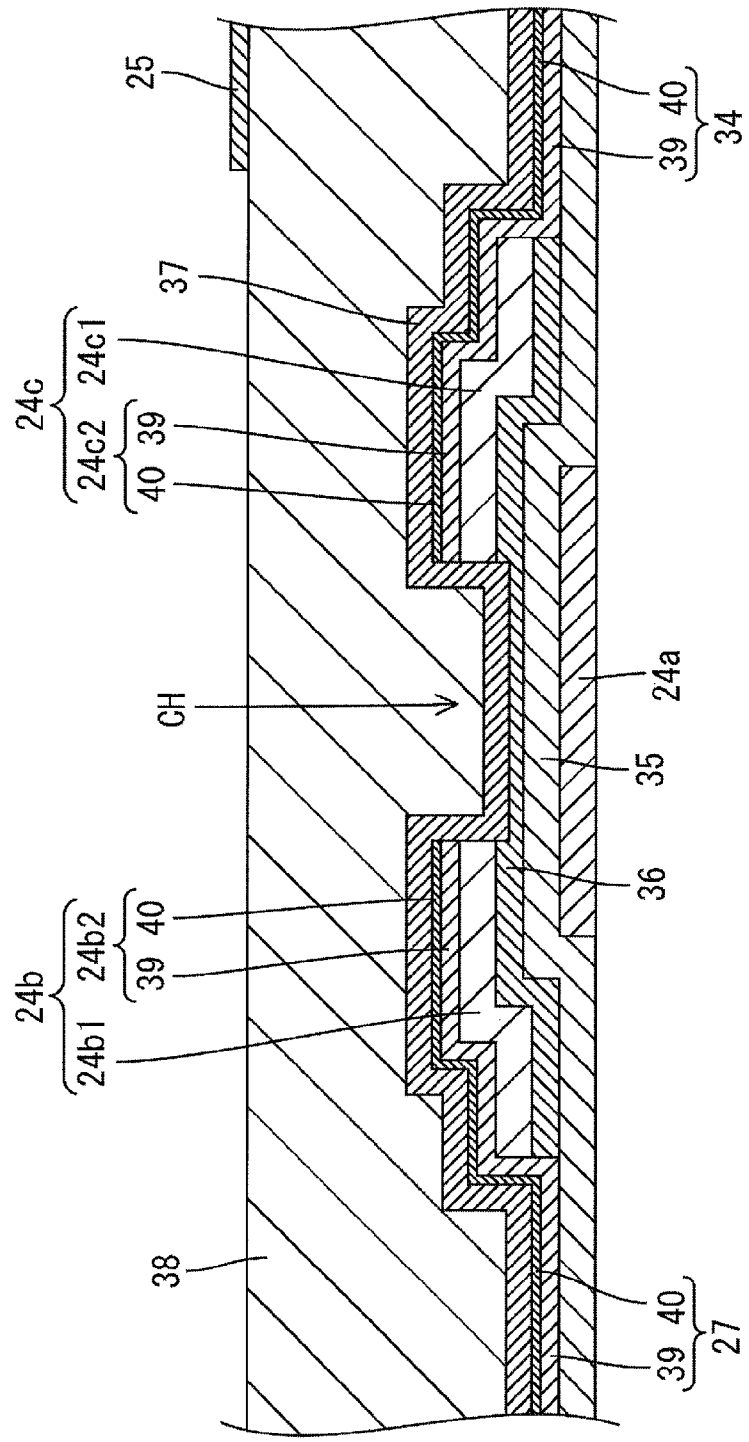
FIG. 7 is a cross-sectional view taken along a vii-vii line in FIG. 5.

The TFT 24 that is one of the structures included in the array substrate 20 will be explained in detail. The TFT 24 is a switching component. As illustrated in FIG. 7, the TFT 24 includes the glass substrate GS that is the array substrate 20 and a plurality of thin films laminated sequentially on the glass substrate GS. Specifically, the gate electrode 24a that is connected to the gate line 26, a gate insulation film 35, a semiconductor film 36, a doping semiconductor film 42, the source electrode 24b and the drain electrode 24c, an in-between insulation film 37 between layers (a passivation film) and a protection film. 38 are laminated on the glass substrate GS in this order from the lower layer side (the glass substrate GS side). The source electrode 24b is connected to the source line 27 and the drain electrode 24c is connected to the drain line 34.

The gate electrode 24a is formed of the same material as the gate lines 26 and is formed by patterning directly on the glass substrate GS in the same manufacturing step of the gate lines 26. For example, the gate electrode 24a is formed of a single metal film or a layered film including a plurality of metal films made of aluminum (Al), chrome (Cr), tantalum (Ta), titanium (Ti), copper (Cu). As illustrated in FIG. 5, a branch line extends along the Y-axis direction from a portion in the vicinity of a cross section of the gate line 26 extending in the X-axis direction and the source line 27. The gate electrode 24a is configured with an extended distal end portion of the extended branch line. The gate insulation film 35 is formed of a silicone nitride film (SiNx) and keeps the gate electrode 24a to be insulated from the semiconductor film 36 that will be described later. The gate insulation film 35 is formed over substantially an entire area of the glass substrate GS including an area in which the TFTs 24 are formed.

The semiconductor film 36 is formed of amorphous silicon (a-Si), for example. As illustrated in FIG. 7, one end of the semiconductor film 36 is connected to the source electrode 24b and another end thereof is connected to the drain electrode 24c. This forms a channel area CH that communicates the source electrode 24b and the drain electrode 24c. The doping semiconductor film 42 is made of amorphous silicone (n+Si) that is obtained by doping n-type impurity such as phosphorous (P) at a high density. The doping semiconductor film 42 extends along the semiconductor film 36 and is not formed on the channel area CH. The portions of the doping semiconductor film 42 arranged to sandwich the channel area CH configure portions of the source electrode 24b and the drain electrode 24c.

As illustrated in FIG. 7, the source electrode 24b and the drain electrode 24c include a same material as the source line 27 and the drain line 34 and are formed by patterning on the glass substrate GS in a same manufacturing step as the source lines 27 and the drain lines 34. The source electrode 24b and the drain electrode 24c are arranged to face with each other and have a predetermined distance therebetween in the X-axis direction. The source electrode 24b and the drain electrode 24c are arranged on an upper layer side with respect to the gate electrode 24a to have the gate insulation film 35 and the semiconductor film 36 therebetween. A part of the source electrode 24b and a part of the drain electrode 24c (the facing portions) are located to overlap the gate electrode 24a with a plan view and the overlapped portions are arranged over the gate electrode 24a. Each of the source electrode 24b and the drain electrode 24c includes a first conductive film 24b1, 24c1 on a lower layer side (the semiconductor film 36 side) and a second conductive film 24b2, 24c2 on an upper layer side (the in-between insulation film 37 side), and the first conductive film and the second conductive film are laminated. The first conductive films 24b1, 24c1 on the lower layer side are configured with end portions of the doping semiconductor film 42 and function as an Ohmic contact layer that is contact with the semiconductor film 36 on the lower layer side with the Ohmic contact. Each of the second conductive films 24b2, 24c2 on the upper layer side includes two laminated metal layers. The metal film 39 on the lower layer side is made of titanium (Ti) and the metal film 40 on the upper layer side is made of aluminum (Al). Namely, the source electrode 24b and the drain electrode 24c are similar to the source line 27 in that they include the second conductive films 24b2, 24c2 each of which includes two layered metal films 39, 40. However, the source electrode 24b and the drain electrode 24c have a different structure from the source line 27 in that they include the first conductive films 24b1, 24c1 configured with the doping semiconductor film 42. As illustrated in FIG. 5, a branch line extends along the X-axis direction from a portion in the vicinity of a cross section of the gate line 26 and the source line 27 extending in the Y-axis direction. The source electrode 24b is configured with an extended distal end portion of the extended branch line.

The in-between insulation film 37 is formed of a silicone nitride film (SiNx) that is a same material as the gate insulation film 35. The protection film is made of an acrylic resin (for example, polymethylmethacrylate resin (PMMA)) or polyimide resin that are an organic material. Therefore, the protection film 38 has a film thickness greater than the gate insulation film 35 and the in-between insulation film 37 that are made from other inorganic material and functions as a flattening film. The in-between insulation film 37 and the protection film 38 are formed on substantially an entire surface area of the glass substrate GS including an area in which the TFTs 24 are formed. In areas other than the areas in which the TFTs 24 are formed, the in-between insulation film 37 and the protection film 38 are located between the source line 27 on the relatively lower layer side and the pixel electrode 25 on the relatively upper layer side and between the drain line 34 on the relatively lower layer side and the pixel electrode 25 on the relatively upper layer side. The in-between insulation film 37 and the protection film 38 keep the upper layer side pixel electrode 25 to be insulated from the upper layer side source line 27 and the drain line 34.

Among the above-structured TFTs 24, the drain line 34 connected to the drain electrode 24c is formed in substantially an L-shape with a plan view as illustrated in FIG. 5. One end of the drain line 34 is connected to the drain electrode 24c and another end thereof is connected to a pixel connection portion 41 that is connected to the pixel electrode 25. As illustrated in FIG. 7, the drain line 34 is formed on the gate insulation film 35 and formed of the same material as the source line 27 and is configured with two-layered structure similar to the source line 27. The drain line 34 includes an lower layer side metal film 39 made of titanium (Ti) and a upper layer side metal film 40 made of aluminum (Al). Therefore, similar to the source line 27, the drain line 34 is configured with only the second conductive films 24b2, 24c2 (39, 40) of the source electrode 24b and the drain electrode 24c and does not include the first conductive films 24b1, 24c1 (42). Accordingly, the drain line 34 has a configuration different from the source electrode 24b and the drain electrode 24c.

Next, a configuration of the non-display area NAA in the array substrate 20 will be explained. The non-display area NAA is located on an inner surface side of the glass substrate GS of the array substrate 20. As illustrated in FIG. 8, gate drivers (gate side drive components) GD for driving the TFTs 24 and source drivers (source side drive components) SD are connected to the non-display area NAA via an anisotropic conductive film. The gate drivers GD and the source drivers SD are connected to a control board (not illustrated) and supply various signals output from the control board to each line of the array substrate 20 and drive the TFTs 24. Three source drivers SD are arranged along the X-axis direction and along a long-side (X-axis direction) end portion (a source driver SD side end portion) of the array substrate 20. The two gate drivers GD are arranged along the Y-axis direction and along each of two short-side (Y-axis direction) end portions (gate driver GD side end portions) of the array substrate 20.

As illustrated in FIG. 8, the gate lines 26, the source lines 27, and the capacity lines 33 arranged in the display area AA extend to the non-display area NAA of the array substrate 20. The gate lines 26 reach connection portions of the gate drivers GD and the source lines 27 reach connection portions of the source drivers SD. Namely, the gate lines 26, the source lines 27, and the capacity lines 33 are arranged over the display area AA and the non-display area NAA. Extended ends of the capacity lines 33 are located in the non-display area NAA and on an inner side (a display area AA side) from the connection portions of the gate drivers GD and connected to a capacity stem line 43. The capacity stem line 43 is arranged on each of the short-side end portions in the non-display area NAA of the array substrate 20. Each capacity stem line 43 extends along the Y-axis direction (to be parallel to the source lines 27) so as to cross all the capacity lines 33. The end portion of each capacity stem 43 reaches the connection portion of each source driver SD that is arranged on each end in the X-axis direction. The end portion of each capacity stem 43 is connected to the source driver SD. Common lines 44 are formed in an end portion of the non-display area NAA of the array substrate 20 that is close to the source drivers SD and on an inner side (the display area AA side) from the connection portions of each source driver SD. The common lines 33 supply a common potential to the counter electrodes 31 on the CF substrate 21 side. The common lines 44 are arranged in a portion of the array substrate 20 corresponding to a middle portion of each source driver SD. One end of each common line 44 is connected to each source driver SD and another end of each common line 44 is connected to the counter electrode 31 on the CF substrate 21 side via conductive particles (not illustrated) that are arranged to penetrate through the liquid crystal layer 22. Therefore, a group of the source lines 27 that are connected to one source driver SD are arranged in the connection portion of the source driver SD on a left side and a right side having the common lines 44 therebetween that are arranged in the middle portion of the source driver SD (refer to FIG. 9). The capacity stem lines 43 and the common lines 44 are made of the same material as the source lines 27 and they are formed in the same layer in the same step of the manufacturing process. The capacity stem lines 43 and the common lines 44 include the lower layer side metal film 39 and the upper layer side metal film 40. Thus, the gate driver GD supplies various signals to the gate lines 26 and the source driver SD supplies various signals to the source lines 27, the capacity lines 33, and the common lines 44. Two ends of each gate line 26 are connected to the gate drivers GD, respectively, and the gate lines 26 are driven at the two ends thereof. Only one end of each source line 27 is connected to the source driver SD and the source lines 27 are driven at one end thereof.

Figure 9:
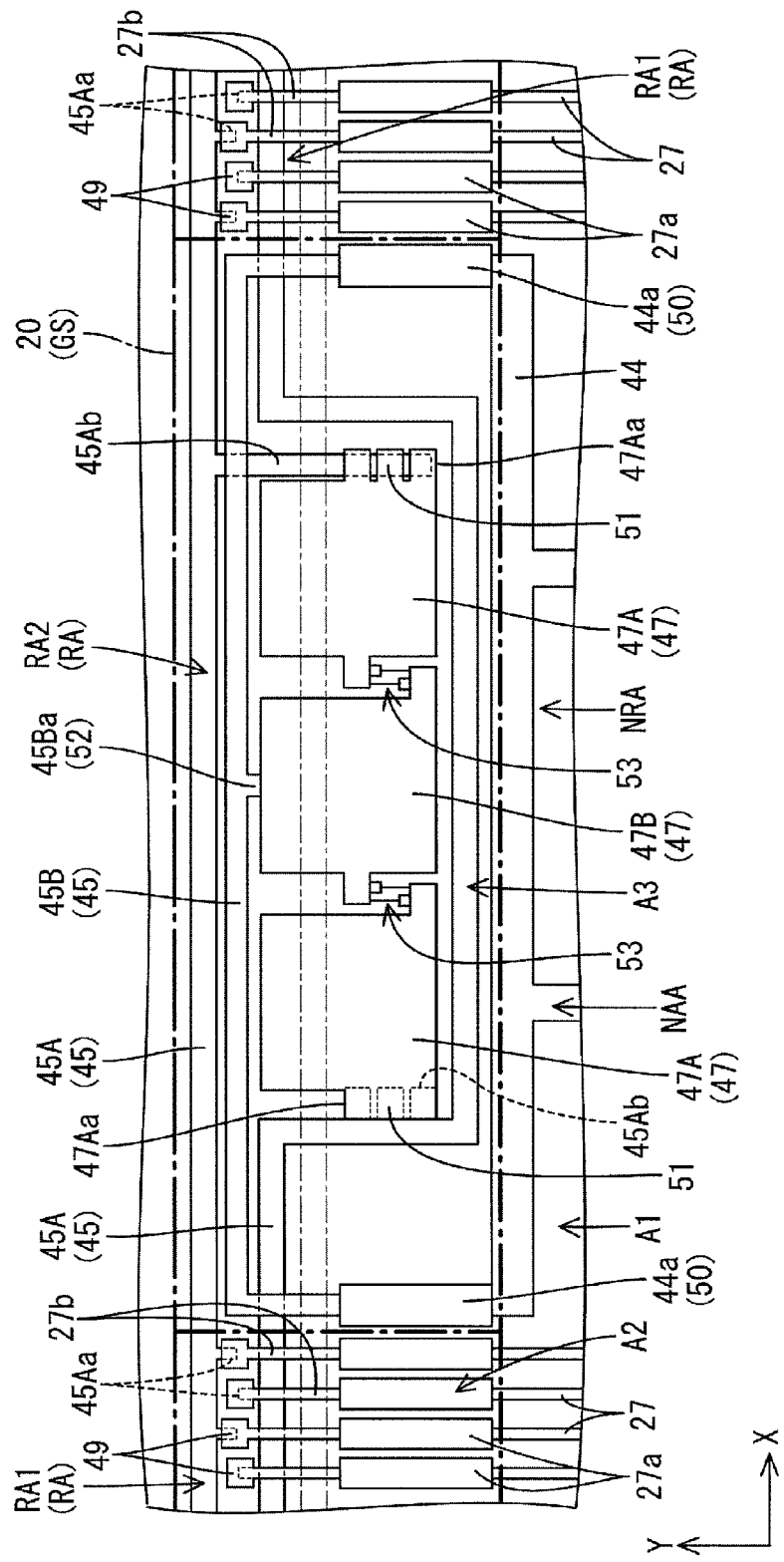
FIG. 9 is a plan view illustrating a wiring configuration on a source driver side end portion of the array substrate.
Figure 10:
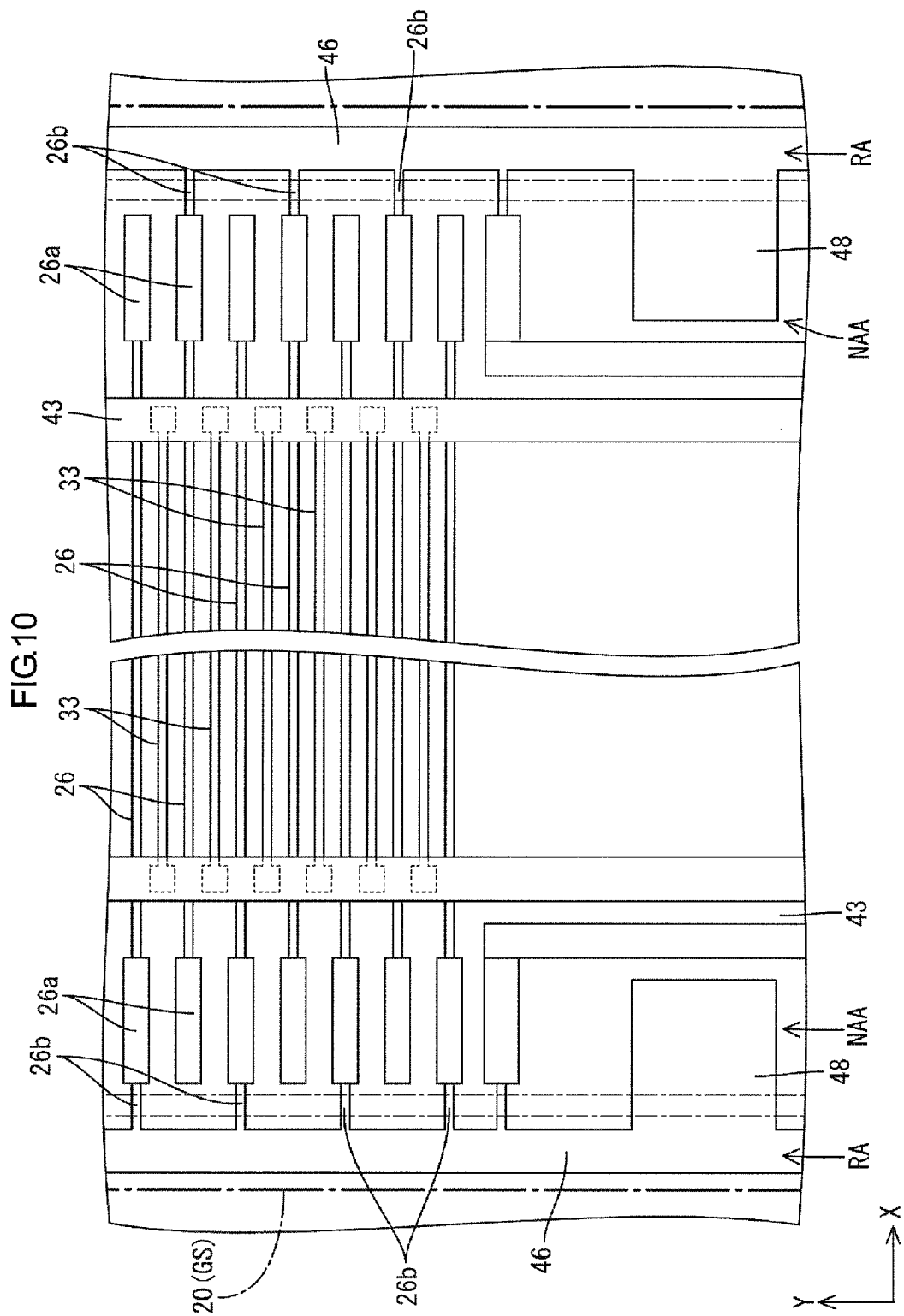
FIG. 10 is a plan view illustrating a wiring configuration on a gate driver side end portion of the array substrate.

As illustrated in FIGS. 9 and 10, the check lines 45, 46 are formed in the non-display area (an outer peripheral side area) NAA of the array substrate 20. The check lines 45, 46 are used to check whether an error occurs in the gate lines 26, the source lines 27, the capacity stem lines 43 (the capacity lines 33) and the common lines 44 such as disconnection or short-circuit. The check lines 45, 46 are used in the check step of the manufacturing process of the liquid crystal panel 11. Therefore, at least a part of the check lines 45, 46 is removed from the glass substrate GS in a chamfering step (a removing step) that is executed after the checking step. Further, the check signal input portions 47, 48 are formed in the non-display area NAA of the array substrate 20. Check signals are input from outside to the check lines 45, 46 via the check signal input portions 47, 48. The check lines 45, 46 include source driver side check lines 45 and gate driver side check lines 46. The source driver side check lines 45 are connected to the source lines 27, the capacity stem lines 43, and the common lines 44. The gate drive side check lines 46 are connected to the gate lines 26. The check signal input portions 47, 48 include source driver side check signal input portions 47 and gate driver side check signal input portions 48. The source driver side check signal input portions 47 are connected to the source driver side check lines 45, and the gate driver side check signal input portions 48 are connected to the gate driver side check lines 46. As illustrated in FIG. 9, the source driver side check lines 45 and the source driver side check signal input portions 47 are arranged on a long-side end portion in the non-display area NAA of the array substrate 20 (an end portion close to the source driver SD). As illustrated in FIG. 10, the gate driver side check lines 46 and the gate driver side check signal input portions 48 are arranged in each short-side end portion in the non-display area NAA of the array substrate 20 (an end portion close to the gate driver GD). In FIGS. 9 and 10, an outer shape (an outer end position, a separated position) of the glass substrate GS is represented by an alternate longer and short bold dash line.

The source driver side check lines 45 and the source driver side check signal input portions 47 will be explained in detail. As illustrated in FIG. 9, the source driver side check lines 45 includes first source driver side check lines 45A that are connected to the source lines 27 and second source driver side check lines 45B that are connected to the capacity stem lines 43 or the common lines 44. The source drive side check signal input portion 47 includes first source driver side check signal input portions 47A that are connected to the first source driver side check lines 45A and second source driver side check signal input portions 47B that are connected to the second source driver side check lines 45B. A pair of first source driver side check lines 45A is arranged for each source driver SD and one first source driver check line 45A is arranged for each source line 27 group. Six first source drier side check lines 45A are arranged (refer to FIG. 8). Namely, a pair of source line 27 groups connected to one source driver SD is connected to a pair of first source driver side check lines 45A. Two second source driver side check lines 45B are arranged for each of the source drivers SD arranged on the long-side ends of the array substrate 20. Each of the second source driver side check lines 45B is arranged for each of the capacity stem lines 43 and the common lines 44 connected to each of the source drivers SD that are arranged on the long-side ends of the array substrate 20. One second source driver side check line 45B is arranged for the source driver SD located in a middle portion, and the one second source driver side check line 45B is arranged for the common line 44 that is connected to the source driver SD located in the middle portion. Five second source driver side check lines 45B are arranged (refer to FIG. 8). The number of the first source driver side check signal input portions 47A is same as that of the first source driver side check lines 45A that are connected to the first source driver side check signal input portions 47A. Similarly, the number of the second source driver side check signal input portions 47B is same as that of the second source driver side check lines 45B that are connected to the second source driver side check signal input portions 47B.

As illustrated in FIG. 9, one first source driver side check line 45A is connected to a plurality of source lines 27 and a plurality of first line connection portions 49 are arranged for the source lines 27. The first source driver side check line 45A is connected to each source line 27 via the corresponding first line connection portion 49. The second source driver side check line 45B is connected to the capacity stem line 43 or the common line 44 via a second connection portion 50. Specifically, the source line 27 has a source terminal 27a that is formed in an elongated rectangular shape and extends to the connection portion of the source driver SD in the non-display area NAA and connected to the source driver SD and also has an extended portion 27b that extends outwardly from the source terminal 27a. Branch lines 45Aa extend from the first source driver side check line 45A so as to overlap the extended portion 27b. A first line connection portion 49 is formed in an overlapped portion in which the extended portion 27b and the branch line 45Aa overlap. The source terminal 27a is configured to cover a surface of the lower layer-side metal film 39 (titanium) with a transparent electrode material such as ITO or IZO similar to the pixel electrode 25. The lower layer-side metal film 39 is included in the two-layered metal films 39, 40 of the source line 27. The source terminal 27a does not include the upper layer-side metal film 40 (aluminum). A detailed connection structure of the first line connection portion 49 will be explained later. The capacity stem line 43 has a capacity terminal (not illustrated) and the common line 44 has a common terminal 44a. The capacity terminal and the common terminal 44a extend to the connection portion of the source driver SD in the non-display area NAA and are connected to the source driver SD. The capacity terminal and the common terminal 44a are directly connected to the second source driver side check line 45B and function as a second line connection portion 50. The capacity terminal and the common terminal 44a are configured to cover a surface of the lower layer-side metal film 39 (titanium) with a transparent electrode material such as ITO or IZO similar to the pixel electrode 25. The lower layer-side metal film 39 is included in the two-layered metal films 39, 40 of the capacity stem line 43 and the common line 44. The capacity terminal and the common terminal 44a do not include the upper layer-side metal film 40 (aluminum). A connection structure of the capacity stem line 43 and the second line connection portion 50 is similar to the connection structure of the common line 44 and the second line connection portion 50 illustrated in FIG. 9, and the connection structure of the capacity stem line 43 and the second line connection portion 50 is not illustrated.

As illustrated in FIG. 9, each source driver side check signal input portion 47 is formed in substantially a square shape with a plan view and has an area relatively greater than the source terminal 27a. The first source driver side check signal input portion 47A is connected to the first source driver side check line 45A via a third line connection portion 51. Specifically, the first source driver side check line 45A that is located on a relatively outer side (close to an outer end of the glass substrate GS) includes extended lines 45Ab that extend toward the first source driver side check signal input portion 47A that is on a right side in FIG. 9 and an object to be connected. The first source driver side check signal input portion 47A has an extended portion 47Aa that extends therefrom to overlap the extended lines 45Ab and has a third line connection portion 51 in an overlapped portion in which the extended lines 45Ab and the overlap portion 47Aa overlap. A detailed connection structure of the third line connection portion 51 will be explained later. The first source driver side check line 45A that is located on a relatively inner side also includes the extended lines 45Ab that extend toward the first source driver side check signal input portion 47A that is on a left side in FIG. 9 and an object to be connected. The first source driver side check signal input portion 47A also has the extended portion 47Aa and is connected to the first source driver side check line 45A via the third line connection portion 51. On the other hand, the second source driver side check signal input portion 47B is connected to the second source driver side check line 45B via a fourth line connection portion 52. Specifically, the second source driver side check line 45B has a branch line 45Ba that extends therefrom toward the second source driver side check signal input portion 46B and is connected directly to the second source driver side check signal input portion 47B. The branch line 45Ba configures a fourth line connection portion 52.

Next, an arrangement of the source driver side check lines 45, the source driver side check signal input portions 47, the first line connection portions 49, the second line connection portions 50, the third line connection portions 51, and the fourth line connection portions 52 in the non-display area NAA of the array substrate 20 will be explained in detail. As illustrated in FIG. 9, one end portion of the non-display area NAA of the array substrate 20 that extends along a long-side direction and is connected to the source drivers SD is divided into three regions including a first region (an inner region) A1, a second region (an outer region) A2, and a third region (an outer region) A3. The first region A1 is located adjacent to the display area AA on an outer side. The second region A2 located adjacent to the first region A1 on an outer side. The third region A3 is located adjacent to the first region A1 on an outer side and adjacent to the second region A2. Namely, the first region is formed in a belt-like shape that extends in the X-axis direction over an entire length of the long side of the array substrate 20. The second regions A2 and the third regions A4 are arranged alternately in the X-axis direction. In FIG. 9, a definition line that defines each of the first region A1, the second region A2, and the third region A3 is illustrated by an alternate long and short dash line having a long line that is shorter than the alternate longer and short dash line representing the outer shape of the glass substrate GS. The source lines 27 are located over the first region A1 and the second region A2. The capacity stem lines 43 and the common lines 44 are located over the first region A1 and the third region A3. The first source driver side check lines 45A are located over the second region A2 and the third region A3. Thus, the first line connection portions 49 are located in the second region A2, and the second source driver side check line 45B, each source driver side check signal input portion 47, and the second line connection portions 50 are located in the third region A3. The third line connection portions 51 and the fourth line connection portion 52 are located in the third region A3. A position relationship between the second region A2 and the third region A3 is as follows. The third region A3 in which a part of the common line 44 is located is located in substantially a middle portion of each source driver SD. Two second regions A2 are located to sandwich the third region A3 from both sides in the X-axis direction. The third region A3 in which a part of the capacity stem line 43 is located is located on an end portion of each of the two source drivers SD arranged on two ends of the array substrate 20.

As illustrated in FIG. 9, the source driver side check signal input portions 47 are arranged in the X-axis direction in a middle portion of the third region A3. The second source driver side check signal input portion 47B is arranged in the middle portion and the two first source driver side check signal input portions 47A are arranged to sandwich the second source driver side check signal input portion 47B therebetween from both ends. The two first source driver side check lines 45A extend in the X-axis direction (along an outer end of the second region A2 and the third region A3, along the outer shape of the glass substrate GS) to be parallel to each other with having a predetermined distance therebetween in the Y-axis direction in the second region A2. In the third region A3, the first source driver side check line 345A that is located relatively on an inner side (close to the first region A1, on a lower side in FIG. 9) is bent around the source driver side check signal input portions 47 to be arranged in an inner portion from the source driver side check signal input portions 47. The bent portion of the first source driver side check line 45A that is arranged on a relatively inner side is formed to follow the outer shape of a group of the three source driver side check signal input portions 47 and extends through a space between the group of the three source driver side check signal input portions 47 and the capacity stem line 43 or the common line 44. The first source driver side check line 45A that is arranged on a relatively outer side (on a side opposite from the first region A1, on an upper side in FIG. 9) extends in the X-axis direction without being bent in the third region A3 and is formed in substantially a straight line over its entire length. Most of the middle part of the second source driver side check line 45B extends in the X-axis direction in the third region A3 and extends through a space between the first source driver side check line 45A on a relatively outer side in the Y-axis direction and each source driver side check signal input portion 47 and a space between the two first source driver side check lines 45A. Two end portions of the second source driver side check line 45B are bent inwardly and extend across the relatively inner side first source driver side check line 45A and connected to the second line connection portions 50.

As illustrated in FIG. 9, the first line connection portions 49 are arranged in a space between the two first source driver side check lines 45A with respect to the Y-axis direction and arranged in the X-axis direction (a direction in which the first source driver side check line 45A extends). Therefore, the adjacent first line connection portions 49 partially overlap each other with respect to the Y-axis direction. Compared to a case in which the adjacent first line connection portions 49 do not overlap, an arrangement space for the first line connection portions 49 is reduced in the Y-axis direction. This reduces a width dimension of the second region A2 that is formed in a belt-like shape extending in the X-axis direction, that is, a distance between the outer end of the second region A2 and the outer end of the first region A1, and this reduces the second region A2 in size. The pair of first source driver side check lines 45A are arranged to sandwich the arranged first line connection portions 49 and the first line connection portions 49 (the source lines 27) are connected alternately to the two first source driver side check lines 45A. Namely, one of the two first source driver side check lines 45A is connected to the odd-numbered first line connection portions 49 (the source lines 27) among the arranged first line connection portions 49. Another one of the two first source driver side check lines 45A is connected to the even-numbered first line connection portions 49 (the source lines 27). The second line connection portion 50 is arranged adjacent to the first line connection portion 49 in the X-axis direction that is located closest to the third region A3. Namely, the second line connection portion 50 is located in an end portion of the third area A3 close to the second region A2.

As described before, as illustrated in FIG. 9, the first source driver side check lines 45A and the second source driver side check line 45B partially overlap in plane. However, they are formed in different layers and insulated from each other via the gate insulation film 35. Therefore, short-circuit does not occur. Specifically, the first source driver side check line 45A is formed of the same material as the gate lines 26 and they are formed in the same layer in the same step of the manufacturing process. The second source driver side check line 45B is formed of the same material as the source line 27, the capacity stem line 43, and the common line 44 and they are formed in the same layer in the same step of the manufacturing process and include the lower layer-side metal film 39 and the upper layer-side metal film 40. Each of the three source driver side check signal input portions 47 includes a same material as the second source driver side check line 45B and the source line 27 and they are formed in the same layer in the same step of the manufacturing process. Specifically, each source driver side check signal input portion 47 is configured such that a surface of the lower layer-side metal film 39 (titanium) is covered with a transparent electrode material such as ITO or IZO similar to the pixel electrode 25. The source line 27 includes two-layered metal films 39, 40. However, the source driver side check signal input portion 47 does not include the upper layer-side metal film 40 (aluminum).

Figure 11:
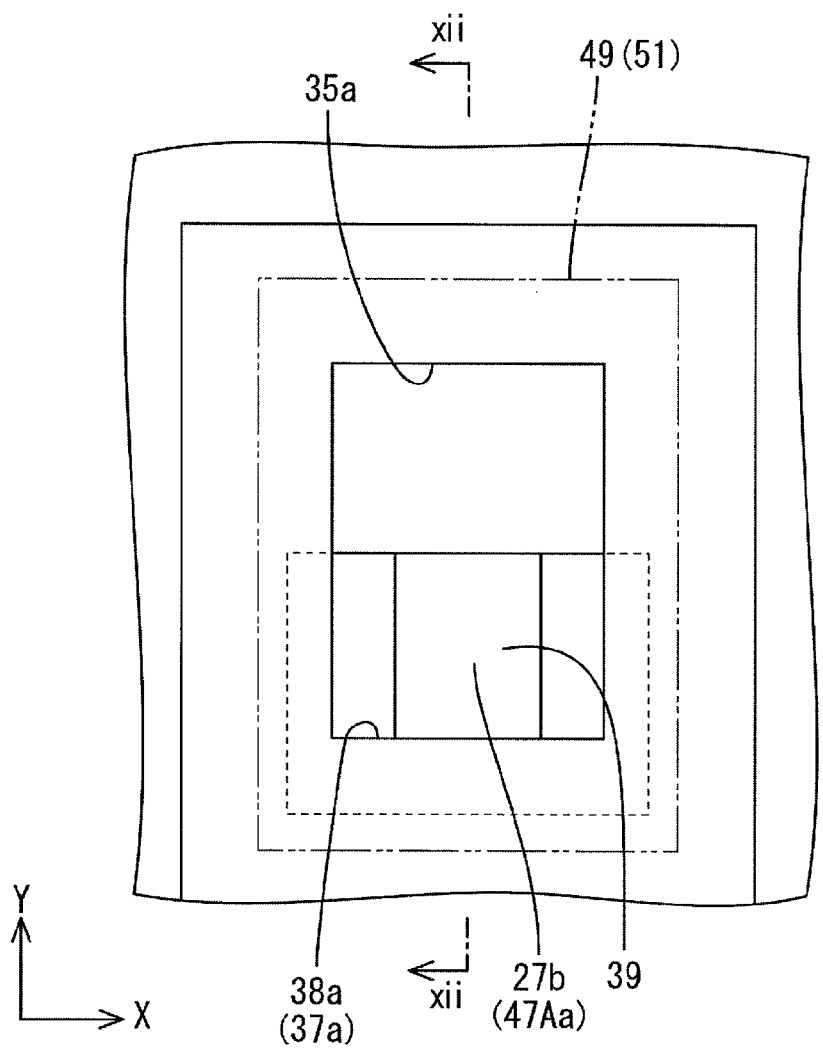
FIG. 11 is a plan view illustrating a plan configuration of a first line connection.
Figure 12:
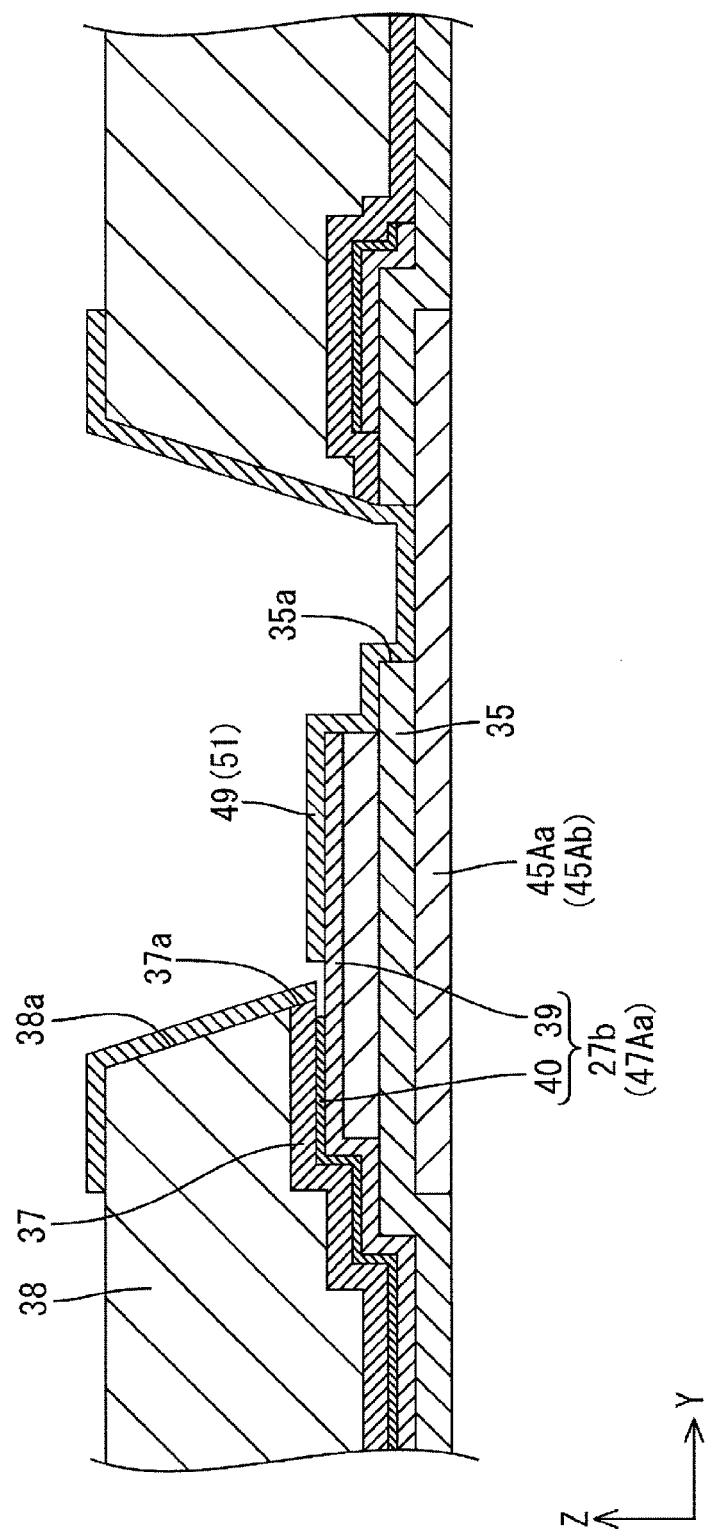
FIG. 12 is a cross-sectional view taken along a xii-xii line in FIG. 11.

Accordingly, the first source driver side check lines 45A are formed in a different layer from the source lines 27 and the first source driver side check signal input portions 47A via the gate insulation film 35. The source lines 27 and the first source driver side check signal input portions 47A are objects to which the first source driver side check lines 45A are connected. Therefore, the first line connection portions 49 that connect the source lines 27 and the first source driver side check line 45A and the third line connection portions 51 that connects the first source driver side check signal input portions 47A have a connection structure as follows. As illustrated in FIGS. 11 and 12, the first line connection portion 49 is formed to cover openings 35*a*, 37*a*, 38*a* formed in the gate insulation film 35, the in-between insulation film 37 and the protection film 38. Accordingly, the branch line 45Aa of the first source driver side check line 45A that is exposed through each opening 35*a*, 37*a*, 38*a* is connected to the extended portion 27*b* of the source line 27. The first line connection portion 49 is formed of the same material as the pixel electrode 25 that is layered on the protection film 38 and they are formed in the same layer in the same step of the manufacturing process. The first line connection portion 49 and each opening 35*a*, 37*a*, 38*a* are located in a position of the overlap portion in which the branch line 45Aa of the first source river side check line 45A overlap the extended portion 27*b* of the source line 27. Among the openings 35*a*, 37*a*, 38*a*, the opening 37*a* of the in-between insulation film 37 and the opening 38*a* of the protection film 38 are formed over an area that is relatively greater than the opening 35*a* of the gate insulation film 35. The extended portion 27*b* of the source line 27 is partially removed in an area that is greater than the opening 35*a* of the gate insulation film 35. The upper layer-side metal film 40 made of aluminum (Al) is removed in an area greater than the lower layer-side metal film 39 made of titanium (Ti). Accordingly, the first line connection portion 49 made of ITO similar to the pixel electrode 25 is in contact only with the lower layer-side metal film 39 made of titanium and is not in directly contact with the upper layer-side metal film 40 made of aluminum. Therefore, galvanic corrosion is less likely to occur and connection reliability is enhanced.

The third line connection portion 51 also has a connection structure substantially similar to the first line connection portion 49. The extended lines 45Ab of the first source driver side check line 45A are connected to the extended portion 47Aa of the first source driver side check signal input portion 47A via the openings 35*a*, 37*a*, 38*a*. The third line connection portion 51 is different from the first line connection portion 49 in that three openings 35*a*, 37*a*, 38*a* are arranged and three connection portions connecting the extended lines 45Ab and the extended portion 47Aa are provided (refer to FIG. 9). In FIGS. 11 and 12, numbers with parentheses are applied to the connection structure of the third line connection portion 51. As is not illustrated in details in the drawings, the capacity stem lines 43 arranged in the same layer as the source lines 27 are connected to the capacity lines 33 that are arranged in the same layer as the gate lines 26 with the same connection structure as the first line connection portion 49 (refer to FIG. 10).

As illustrated in FIG. 9, the source driver side check signal input portions 47 that are arranged in the X-axis direction are connected to each other via an ESD protection circuit 53. Accordingly, the first source driver side check line 45A that is connected to the first source driver side check signal input portion 47A is connected to the second source driver side check line 45B that is connected to the second source driver side check signal input portion 47B via the ESD protection circuit 53. The source lines 27 are connected to the first source driver side check line 45A and the capacity stem line 43 or the common line 44 is connected to the second driver side check line 45B. Accordingly, with the connection between the source driver side check lines 45 via the ESD protection circuit 53, the TFTs 24 connected to the source lines 27, the capacity stem line 43 and the common line 44 are protected from high voltage (surge voltage) caused by ESD (electrostatic discharge).

Figure 13:
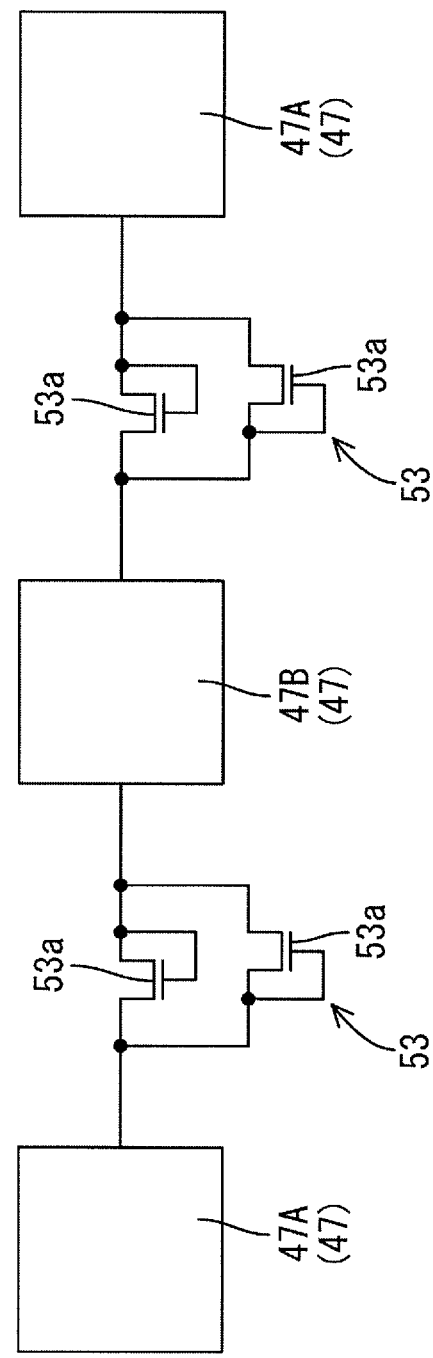
FIG. 13 is a circuit generally illustrating a circuit configuration of an ESD protection circuit.

As illustrated in FIG. 13, the ESD protection circuit 53 includes two protection circuit TFTs 53*a* that are transistor components and are connected in parallel between the adjacent source driver side check signal input portions 47. The protection circuit TFT 53*a* has a same structure as the TFT 24 arranged in the display area AA of the array substrate 20 and the TFTs 53*a*, 24 are collectively formed in the same step. The two protection circuit TFTs 53*a* that are connected in parallel have a same potential with the gate electrodes and the source electrodes being connected on a same line. The two protection circuit TFTs 53*a* are connected in parallel to each other such that the gate electrode and the source electrode of one protection circuit TFT 53a have a same potential as the drain electrode of the other protection circuit TFT 53a and the gate electrode and the source electrode of the other protection circuit TFT 53a have a same potential as the drain electrode of the one protection circuit TFT 53a. A threshold voltage value of each protection circuit TFT 53a is higher than a voltage value of a check signal and is lower than a voltage value (a surge voltage value) that is applied at the occurrence of ESD. Accordingly, if the check signal is input to each source driver side check signal input portion 47 in the check step, the protection circuit TFTs 53a are not activated and therefore, a current is not less likely to flow between the adjacent source driver side check signal input portions 47 via the ESD protection circuit 53. If a high voltage is applied to the source driver side check signal input portion 47 according to the occurrence of the ESD, the protection circuit TFTs 53a are activated and a current flows between the adjacent source driver side check signal input portions 47 via the ESD protection circuit 53. Accordingly, the current flows through all the source driver side check lines 45 and this protects the TFTs 24 that are connected to the source lines 27, the capacity stem lines 43 and the common lines 44.

Next, the gate driver side check line 46 and the gate driver side check signal input portion 48 will be explained in detail. As illustrated in FIG. 10, a pair of gate driver side check lines 46 are arranged in short-side end portions in the non-display area (an outer side area) NAA of the array substrate 20 and are arranged to sandwich the gate lines 26 extending in the X-axis direction from both ends therebetween. One gate driver side check line 46 is arranged for a group of the gate lines 26 that are connected to one gate driver GD and a total number of the gate driver side check lines 46 is four. Specifically, the gate driver side check line 46 is located on an outer side from the connection portion (the gate terminal 26a) of the gate driver GD in the non-display area NAA and extends substantially linearly along the Y-axis direction (along the source line 27 or the capacity stem line 43) so as to cross the gate lines 26. The gate lines 26 extend to the connection portion of each gate driver GD in the non-display area NAA. Each gate line 26 has the elongated rectangular gate terminal 26a that is connected to each gate driver GD and has the extended portion 26b that is extended outwardly from the gate terminal 26a. The extended portion 26b is connected to the gate driver side check line 46. The gate terminal 26a is formed at each end of each gate line 26 and the gate terminals 26a are connected to each of the gate drivers GD that are arranged on two ends of the array substrate 20 in the X-axis direction. Accordingly, the gate lines 26 are driven at two ends thereof. The gate driver side check lines 46 are formed of the same material as the gate lines 26 and they are formed in the same layer in the same step of the manufacturing process. Therefore, the extended portions 26b of the gate lines 26 are directly connected to the gate driver side check line 46.

As illustrated in FIG. 10, the pair of gate driver side check lines 46 are connected alternately to the gate lines 26 arranged in the Y-axis direction. Namely, one of the pair of gate driver side check lines 46 is connected to the odd-numbered gate lines 26, and another one of the pair of gate driver side check lines 46 is connected to the even-numbered gate lines 26. Specifically, each gate line 26 has the gate terminals 26a at each end and the extended portion 26b, and one of the two gate terminals 26a of each gate line 26 has the extended portion 26b. The extended portions 26 connected to the odd-numbered gate lines 26 and the extended portions 26 connected to the even-numbered gate lines 26 extend in opposite sides in the X-axis direction. In other words, the extended portions 26 connected to the odd-numbered gate lines 26 are located on opposite side to the extended portions 26 connected to the even-numbered gate lines 26.

As illustrated in FIG. 10, the gate driver side check signal input portion 48 is formed in substantially a square shape with a plan view and has an area relatively greater than the gate terminal 26a. The gate driver side check signal input portion 48 is arranged adjacent to the gate terminal 26a and the extended portion 26b of the gate line 26 in the Y-axis direction. Namely, the gate driver side check signal input portion 48 overlap the gate terminal 26a and the extended portion 26b in the X-axis direction. The gate driver side check signal input portion 48 is arranged adjacent to the gate driver side check line 46 with respect to the X-axis direction and the end portion of the gate driver side check signal input portion 48 adjacent to the gate driver side check line 46 is connected to the gate driver side check line 46. The gate driver side check signal input portion 48 is formed of the same material as the gate lines 26 and they are formed in the same layer in the same step of the manufacturing process, and the gate driver side check signal input portion 48 is directly connected to the gate driver side check line 46.

In the chamfering step executed in the manufacturing process of manufacturing the liquid crystal panel 11, the components in the non-display area of the array substrate 20 is chamfered and a chamfering area (removing area) thereof will be explained. The components are not removed in the chamfering step at an entire area of the non-display area of the array substrate 20. The components are removed with chamfering in the outer peripheral frame-shaped area (a certain area ranging from the outer end of the glass substrate GS). The outer peripheral frame-shaped area is a removing area RA and the inner peripheral frame-shaped area that is on an inner side of the removing area RA is a non-removing area NRA in which the components are not removed. The removing area RA may change in its size due to an error caused in processing by a chamfering device (a removing device) that is used in the chamfering step. In FIGS. 9 and 10, a border between the removing area RA and the non-removing area NRA is represented by two parallel alternate long and short dash lines (having a line width smaller than the alternate long and short dash line representing the outer shape of the glass substrate GS). A relatively inner one of the two alternate long and short dash lines represents a maximum allowable range of the removing area RA and a relatively outer one represents a minimum allowable range of the removing area RA. Namely, the removing area RA may change its range between the two alternate long and short dash lines illustrated in FIGS. 9 and 10.

The removing area RA and the non-removing area NRA at an end portion of the non-display area NAA of the array substrate 20 close to the source driver SD will be explained. As illustrated in FIG. 9, the removing area RA is smaller in size in the Y-axis direction than the second region A2 and the third region A3, and the non-removing area NRA is greater in size in the Y-axis direction than the first region A1. Namely, the non-removing area NRA includes the first region A1 and inner peripheral side portions of the second region A2 and the third region A3. In the following, the removing area RA includes a first removing area RA1 that overlaps the second region A2 and a second removing area RA2 that overlaps the third region A3.

As illustrated in FIG. 9, a border between the removing area RA and the non-removing area on the source driver SD side end is formed in a linear shape extending along the X-axis direction and located between the source terminals 27a and the first line connection portions 49. Therefore, the source terminals 27a, main portions of the source lines 27, the capacity terminals, the capacity stem lines 43, the common terminals 44a, the common lines 44, the third line connection portions 51, and the ESD protection circuits 53 are entirely arranged in the non-removing area NRA. The extended portions 27b of the source lines 27, the bent portions of the first source driver side check line 45A that is arranged on a relatively inner side, the second source driver side check lines 45B, and the source driver side check signal input portions 47 are partially arranged in the non-removing area NRA. On the other hand, the first line connection portions 49 and the first source driver side check lines 45A that is arranged on a relatively outer side are entirely arranged in the removing area RA. The extended portions 27b of the source lines 27, the first source driver side check lines 45A that is arranged on a relatively inner side, the second source driver side check line 45B, and the source driver side check signal input portions 47 are partially arranged in the removing area RA. Namely, each source driver side check line 45 is arranged over the first removing area RA1 and the second removing area RA2 of the removing area RA. The first line connection portions 49 are arranged in the first removing area RA1 and each source driver side check signal input portion 47s is arranged over the non-removing area NRA and the second removing area RA2. Therefore, the first line connection portions 49 and the source driver side check signal input portions 47 are separately arranged in the first removing area RA1 and the second removing area RA2, respectively. Compared to a case in which the first line connection portions 49 and the source driver side check signal input portions 47 are arranged in the same area, the first removing area RA1 and the second removing area RA2 are reduced in the width dimension. Namely, a distance between an outer end of each of the first removing area RA1 and the second removing area RA2 and an outer end of the non-removing area NRA is reduced. Further, each source driver side check signal input portion 47 extends from the first removing area RA1 to the non-removing area NRA. Therefore, compared to a case in which the source driver side check signal input portion 47 is arranged only in the first removing area RA1, a sufficient large area is provided.

Next, the removing area RA and the non-removing area NRA at the gate driver GD side end of the non-display area NAA of the array substrate 20 will be explained. As illustrated in FIG. 10, a border between the removing area RA and the non-removing area NRA is linear along the Y-axis direction and located between the gate terminals 26a and the gate driver side check line 46. Therefore, the gate terminals 26a, main portions of the gate lines 26, the capacity lines 33, and the capacity stem lines 43 are entirely arranged in the non-removing area NRA. The extended portions 26b and the gate driver side check signal input portions 48 are partially arranged in the non-removing area NRA. On the other hand, the gate driver side check line 46 is entirely arranged in the removing area RA, and the extended portions 26b extending from the gate lines 26 and the gate driver side check signal input portions 48 are partially arranged in the removing area RA. Namely, the gate driver side check signal input portion 48 is arranged to extend over the removing area RA and the non-removing area NRA. Therefore, compared to a case in which the gate driver side check signal input portion 48 arranged only in the removing area RA, the gate driver side check signal input portion 48 ensures a sufficiently large area.

The present embodiment has the above structure and operations of the present embodiment will be explained. First, a method of manufacturing the liquid crystal display device 10 will be briefly explained. In manufacturing the liquid crystal display device 10, the liquid crystal panel 11 and the backlight device 12 are separately manufactured and the liquid crystal panel 11 and the backlight device 12 are assembled together with a bezel 13. In the following, the method of manufacturing the liquid crystal panel 11, especially the method of manufacturing the array substrate 20 will be explained in detail.

Figure 14:
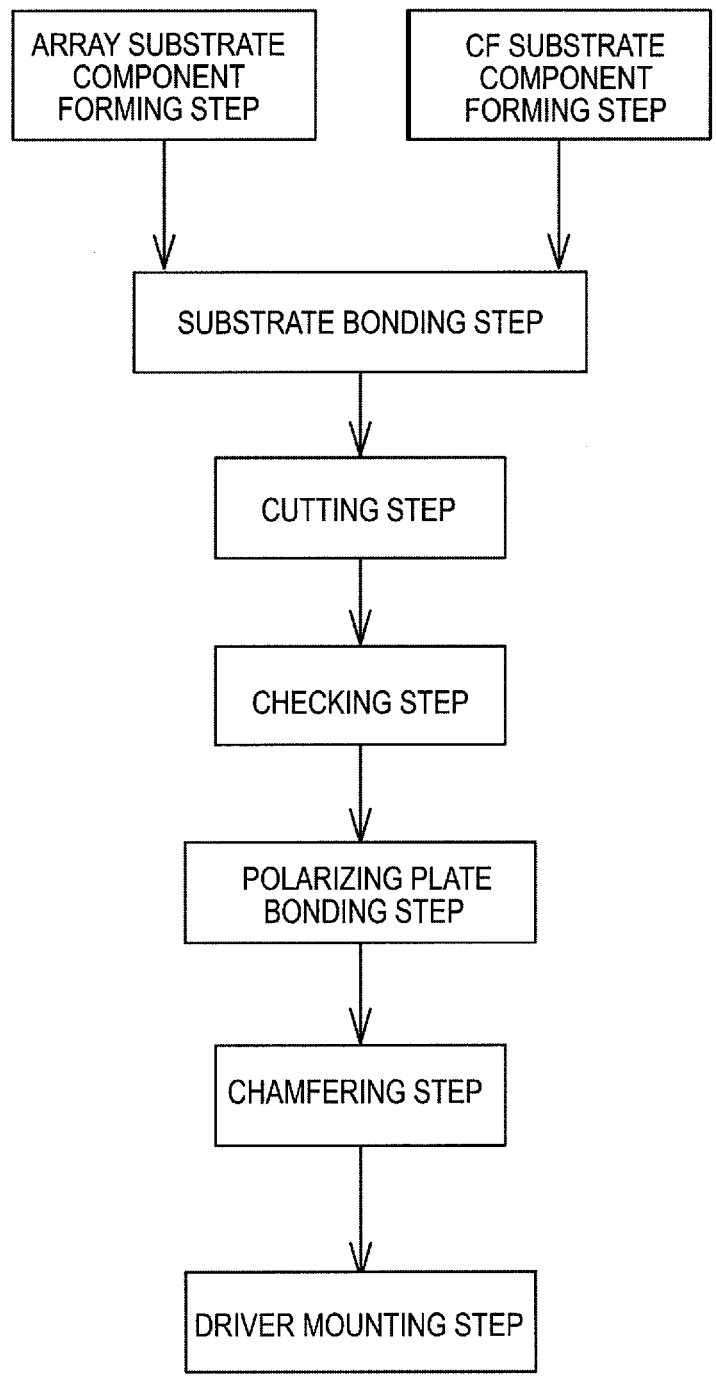
FIG. 14 is a flowchart illustrating a method of manufacturing the liquid crystal panel.

As illustrated in FIG. 14, in manufacturing the liquid crystal panel 11, an array substrate component forming step (a line forming step) and a CF substrate component forming step are performed. In the array substrate component forming step, the components are formed on the mother glass MGS of the array substrate 20. In the CF substrate component forming step, the components are formed on the mother glass MGS of the CF substrate 21. After performing the array substrate component forming step and the CF substrate component forming step, the mother glass MGS of the array substrate 20 and the mother glass MGS of the CF substrate 21 are bonded together with having the liquid crystal layer 22 therebetween in a substrate bonding step. Next, the bonded mother glasses MGS are cut and the liquid crystal panels 11 (the array substrates 20 and the CF substrates 21) are obtained in a cutting step (a substrate cutting step). After the cutting step, a checking step is performed to check whether disconnection or short-circuit occurs in each of the lines 26, 27, 33, 43, 44. Then, a polarizing plate 23 is bonded to an outer surface of each of the glass substrates GS of the liquid crystal panel 11 in a polarizing plate bonding step. After performing the polarizing plate bonding step, the components located in the removing area RA of the array substrate 20 are removed with chamfering in the chamfering step (the removing step). Then, the gate drivers GD and the source drivers SD are mounted in the non-display area NAA of the array substrate 20 in a driver mounting step. Accordingly, the liquid crystal panel 11 is manufactured. Next, each step will be explained in detail.

In the array substrate component forming step, the TFTs 24, the lines 26, 27, 33, 43, 44 and the insulation films 35, 37, 38, and the pixel electrodes 25 are formed with layered sequentially on the mother glass MGS that is the array substrate 20 with a known photolithography method. In the substrate component forming step, when forming the gate lines 26, the first source driver side check lines 45A, the gate driver side check line 46, and the gate driver side check signal input portions 48 are collectively formed in the non-display area NAA (refer to FIGS. 9 and 10). When forming the source lines 26, the second source driver side check line 45B and the source driver side check signal input portions 47 are collectively formed (refer to FIG. 9). When forming the pixel electrodes 25, the first line connection portions 49 and the third line connection portions 51 are collectively formed (refer to FIG. 12). When forming the TFTs 24, the protection circuit TFTs 53a that configure the ESD protection circuit 53 are collectively formed (refer to FIG. 13). Thus, in the array substrate component forming step, in addition to the lines 26, 27, 33 in the display area AA, the lines 43 to 47 and the line connection portions 49-52 are formed in the non-display area NAA, and therefore, it can be said that the array substrate component forming step includes a line forming step. After forming the pixel electrodes 25, the alignment film 28 is formed and the alignment film 28 is subjected to photo-alignment processing. In the photo-alignment processing, ultraviolet rays are irradiated to the alignment film 28 from a certain direction for a certain time period. Thus, it can be said that the array substrate component forming step includes an alignment forming step and a photo-alignment processing step. In the CF substrate component forming step, after sequentially forming the coloring sections 29 of the color filter, the light blocking sections 30 and the counter electrodes 31, the alignment film 32 is formed, and the alignment film 32 is subjected to the photo-alignment processing.

In the substrate bonding step, after one of the mother glasses MGS is covered with a sealing agent and a liquid crystal material is put thereon by drops, the other one of the mother glasses MGS is bonded thereto and the sealing agent is hardened. In the cutting step (a substrate separation step), a laser type cutting device with irradiating laser light or a mechanical cutting device having a groove cutter is used to cut the bonded mother glasses MGS into a plurality of pieces (nine in FIG. 15) and the liquid crystal panels 11 are obtained.

In the checking step, a backlight device for checking (not illustrated) irradiates light to the liquid crystal panel 11. The check signal input portions 47, 48 that are arranged in the non-display area NAA of the array substrate 20 are brought into contact with a probe pin that is connected to a checking device (not illustrated). Accordingly, check signals are input from the checking device to the check lines 45, 46 via the check signal input portions 47, 48. The pair of first source driver side check lines 45A are connected alternately to the source lines 27. Therefore, in the checking step, a different check signal is supplied to each of the adjacent source lines 27. Similarly, the pair of first gate driver side check lines 46 are connected alternately to the gate lines. Therefore, in the checking step, a different check signal is supplied to each of the adjacent gate lines 26. With the check signals being input to the check lines, an image displayed on the liquid crystal panel 11 is seen by an operator with his/her eyes or the displayed image is captured by an image sensor and processed so as to check whether various defects caused by disconnection or short-circuit are caused. Examples of such defects include line defect, bright point defect, or dark point defect. The protection circuit TFTs 53a of the ESD protection circuit 53 that connects the adjacent source driver side check signal input portions 47 has a threshold voltage value that is greater than the voltage value related to the check signal. Therefore, when the check signal is input to the input portion, the protection circuits TFTs 53a are not driven and it is less likely to occur that the same check signals are input to all of the source driver side check lines 45.

In the polarizing plate bonding step, after the polarizing plate 23 with a laminator is adhered to an outer surface of each of the pair of glass substrates GS, the laminator is removed from the polarizing plate 23. Therefore, in the polarizing plate bonding step, ESD is likely to occur. The array substrate 20 includes the ESD protection circuit 53 that connects the adjacent source driver side check signal input portions 47, and all of the source driver side check lines 45 are connected to the source driver side check signal input portions 47 via the ESD protection circuit 53. Therefore, if ESD occurs in the polarizing plate bonding step, and accordingly, high voltage higher than the threshold voltage value of the protection circuit TFTs 53a is applied to any of the source driver side check signal input portions 47, the protection circuit TFTs 53a of the ESD protection circuit 53 are activated, as illustrated in FIG. 13, and current flows between the adjacent source driver side check signal input portions 47 via the ESD protection circuit 53. Accordingly, current flows through all the source driver side check lines 45. This protects the TFTs 24 connected to the source lines 27, the capacity stem lines 43, and the common lines 44 from the high voltage.

In the chamfering step (the removing step), the component arranged in the removing area RA in the non-display area NAA of the array substrate 20 included in the liquid crystal panel 11 is chamfered by a chamfering device (a removing device) such as a grinder. In chamfering, a corner portion of the glass substrate GS of the array substrate 20 that is at an outer end of its inner surface (a line forming surface) side is ground with a grinding material to be removed and the components formed in the removing area RA are also removed. In the chamfering step, among the components arranged in the source driver SD side end portion of the non-display area NAA of the array substrate 2, the first line connection portions 49 and the first source driver side check lines 45A that are arranged on a relatively outer side are entirely removed, as illustrated in FIG. 9. The extended portions 27b of the source lines 27, the first source driver side check lines 45A that are arranged on a relatively inner side, the second source driver side check line 45B and the source driver side check signal input portions 47 are partially removed. Similarly, in the chamfering step, among the components arranged in the gate driver GD side end portion of the non-display area NAA of the array substrate 20, as illustrated in FIG. 10, the gate driver side check line 46 is entirely removed and the extended portions 26b of the gate lines 26 and the gate driver side check signal input portions 48 are partially removed. Accordingly, the source lines 27 are electrically isolated from the short-circuit state by the first source driver side check liens 45A, and the gate lines 26 are electrically isolated from the short-circuit state by the gate driver side check line 46.

During the performance of the chamfering step, external light may enter the liquid crystal panel 11, however, the polarizing plate 23 is already adhered to the outer surface of the liquid crystal panel 11. Therefore, the external light (especially, ultraviolet rays) is less likely to enter inside of the liquid crystal panel 11 due to the polarizing plate 23, and alignment restriction of the alignment films 28, 32 is less likely to be changed due to the external light (refer to FIG. 4).

In the driver mounting step, an anisotropic conductive film is coated over portions of the array substrate 20 in which the source terminals 27a, the capacity terminals and the common terminals 44a are formed, and the source driver SD is connected to thereto with thermocompression bonding and the source driver SD is fixed in the mounted state. Similarly, in the driver mounting step, an anisotropic conductive film is coated over portions of the array substrate 20 in which the gate terminals 26a are formed, and the gate driver GD is connected to thereto with thermocompression bonding and the gate driver GD is fixed in the mounted state.

As is explained before, the method of manufacturing the array substrate (an element substrate) 20 of this embodiment includes the line forming step, the checking step, and the removing step. In the line forming step, the following forming operations are performed. The source lines (first lines) 27 are formed on the glass substrate (substrate) GS over the first region A1 and the second region A2 that is located adjacent to the first region A1 on an outer side. The first source driver side check lines (first check lines) 45A are formed over the second region and the third region A3 that is located adjacent to the first region A1 on an outer side and adjacent to the second region A2. The first line connection portions 49 that connect the source lines 27 and the first source driver side check lines 45A are formed in the second region A2. The capacity stem lines 43 (second line) and the common lines 44 (the second line) are formed over the first region A1 and the third region A3. The second source driver side check lines (second check lines) 45B, and the second line connection portions 50 that connect the second source driver side check line 45B and the capacity stem line 43 or the common line 44 are formed in the third region A3. In the checking step, the check signal is input to the first source driver side check lines 45A and the second source driver side check line 45B to check the source lines 27 and the capacity stem lines 43 and the common lines 44. In the removing step, at least a part of one of the first source driver side check lines 45A and the second source driver side check line 45B is removed such that the source lines 27 is disconnected from the first source driver side check lines 45A and the capacity stem line 43 and the common lines 44 are disconnected from the second source driver side check line 45B.

Thus, after the lines 27, 43, 44 and the check lines 45A, 45B and the line connection portions 49, 50 are formed on the glass substrate GS with the line forming step, the checking step is performed to check whether disconnection or short circuit occurs in the lines 27, 43, 44. After the checking step, the removing step is performed such that at least a part of one of the check lines 45A, 45B is removed to bring the lines 27 to be disconnected from the check lines 45A and the lines 43, 44 to be disconnected from the check line 45B.

In the line forming step, the first source driver side check lines 45A are formed over an area ranging over the second region A2 and the third region A3 on the glass substrate GS. The first line connection portions 49 that connect the first source driver side check lines 45A to the source lines 27 are formed in the second region A2. The second source driver side check line 45B and the second line connection portions 50 that are connected to the capacity stem line 43 and the common lines 44 are formed in the third region A3. Compared to a case in which the second source driver side check line 45B and the second line connection portions 50 are concentrated in the same region as the first source driver side check lines 45A and the first line connection portions 49, a distance between an outer end of the second region A2 and the third region A4 and an outer end of the first region A1 is reduced. This reduces the second region A2 and the third region A3 in size. Accordingly, the first region A1 increases its size by the decreased size of the second region A2 and the third region A3. Namely, an outer shape of the glass substrate GS is reduced in size. Accordingly, with the above manufacturing method, the outer peripheral area of the array substrate 20 is effectively reduced.

In the line forming step, the first source driver side check lines 45A are formed of the same material and formed in the same layer. The second source driver side check line 45B is made of different material from the first source driver side check lines 45A and is formed in a different layer from the first source driver side check lines 45A with having the gate insulation film (the insulation layer) 35 therebetween. Accordingly, the first source driver side check line 45A and the second source driver side check line 45B are arranged to partially overlap each other. The first source driver side check lines 45A and the second source driver side check line 45B are arranged at high density and the second region A2 and the third region A3 are effectively reduced in size.

In the line forming step, the source lines 27, the capacity stem lines 43 and the common lines 44 are formed of the same material and they are formed in the same layer as the second source driver side check line 45B. The gate insulation film 35 has the opening 35a in portions overlapping the source lines 27 or the first source driver side check lines 45A. The first line connection portions 49 connect the source lines and the first source driver side check lines 45 that are formed in different layers and the first line connection portions 49 are formed to cover the openings 35a formed in the gate insulation film 35. Thus, the source lines 27 and the first source driver side check lines 45A that are formed in different layers are effectively connected to each other. The capacity stem line 43, the common lines 44 and the second source driver side check line 45B are formed of the same material and formed in the same layer, and therefore they are effectively connected by the second line connection portions 50.

In the line forming step, the pixel electrodes 25 are formed and the first line connection portions 49 are formed of the same material as the pixel electrodes 25 and they are formed in the same layer. Accordingly, the first line connection portions 49 are formed in forming the pixel electrodes 25, and this reduces a manufacturing cost.

In the line forming step, the ESD protection circuit 53 that is connected to the first source driver side check lines 45A and the second source driver side check line 45B is formed. Accordingly, the ESD protection circuit 53 protects the first source driver side check lines 45A and the second source driver side check line 45B from ESD (electrostatic discharge).

In the line forming step, the protection circuit TFTs (transistors) 53a are formed as the ESD protection circuit 53. The protection circuit TFTs 53a connect the first source driver side check lines 45A each other and connect the first source driver side check line 45A and the second source driver side check line 45B. The protection circuit TFTs 53a has a voltage threshold value that is relatively higher than the voltage value of the check signal input to the first source driver side check lines 45A and the second source driver side check line 45B in the checking step. Accordingly, when the check signal is input to one of the first source driver side check lines 45A and the second source driver side check line 45B in the checking step, the voltage value of the check signal is relatively lower than the voltage threshold value of the protection circuit TFT 53a of the ESD protection circuit 53. Therefore, the check signal is less likely to be supplied to another one of the first source driver side check lines 45A and the second source driver side check line 45B. Therefore, each of the lines 27, 43, 44 is checked normally. On the other hand, if an ESD voltage having a voltage value greater than the voltage threshold value of the protection circuit TFT 53a is applied to any one of the source driver side check lines 45A, 45B, the ESD voltage is applied to another source drive side check line 45A, 45B via the protection circuit TFT 53a. Accordingly, a potential difference is less likely to be generated between the source driver side check lines 45A, 45B and the lines 27, 43, 44.

In the line forming step, at least one pair of the first source driver side check lines 45A that extend along an outer end of the second region A2 are formed. The first line connection portions 49 are arranged between at least one pair of first source driver side check lines 45A that are parallel to an outer end of the second region A2 and the first line connection portions 49 are arranged in the extending direction in which the first source driver side check lines 45A. With this configuration, a distance between an outer end of the second region A2 and an outer end of the first region A1 is further reduced and this further reduces a size of the second region A2.

The method of manufacturing the array substrate (element substrate) 20 of this embodiment includes a line forming step, a checking step, and a removing step. In the line forming step, following operations are performed. The source lines (lines) 27 are formed on the glass substrate GS in the non-removing area NRA and the first removing area RA1 that is located adjacent to the non-removing area NRA on an outer side. The source driver side check lines (check lines) 45 are formed in the first removing area RA1 and in the second removing area RA2 that is adjacent to the non-removing area NRA on an outer side and adjacent to the first removing area RA1. The first line connection portions (line connection portions) 49 that connect the source lines 27 and the source driver side check lined 45 are formed in the first removing area RA1. The source driver side check signal input portions (check signal input portion) 47 that are connected to the source driver side check lines 45 are formed in the non-removing area NRA and the second removing area RA2. In the checking step, the check signal is input to the source driver side check signal input portions 47 to check the source lines 27 via the source driver side check lines 45. In the removing step, at least a part of at least the source driver side check lines 45 and the first line connection portions 49 are removed in the first removing area RA1 and the second removing area RA2. Accordingly, the source lines 27 are disconnected from the source driver side check lines 45 and a part of the source driver side check signal input portion 47 is removed.

Thus, after the source lines 27, the source driver side check lines 45, the first line connection portions 49, and the source driver side check signal input portions 47 are formed on the glass substrate GS with the line forming step, the checking step is performed to check whether disconnection or short circuit occurs in the source lines 27. After the checking step, the removing step is performed such that at least a part of one of the source driver side check lines 45 and the first line connection portions 49 are removed to bring the source lines 27 to be disconnected from the source driver side check lines 45 and a part of the source driver side check signal input portion 47 is removed.

In the line forming step, the source driver side check lines 45 are formed over an area ranging over the first removing area RA1 and the second removing area RA2 on the glass substrate GS. The first line connection portions 49 that connect the source driver side check lines 45 to the source lines 27 are formed in the first removing area RA1. The source driver side check signal input portions 47 that are connected to the source driver side check lines 45 such that the check signals are inputted thereto are formed in the second removing area RA2. Compared to a case in which the source driver side check signal input portions 47 are concentrated in the same region as the source driver side check lines 45 and the first line connection portions 49, a distance between an outer end of the first removing area RA1 and the second removing area RA2 and an outer end of the non-removing area NRA is maintained to be short. This reduces a size of an outer shape of the glass substrate GS. Further, the source driver side check signal input portion 47 extends from the first removing area RA1 to the non-removing area NRA. Therefore, compared to a case in which the source driver side check signal input portion 47 is formed only in the first removing area RA1, the driver side check signal input portion 47 has a sufficient large area. Accordingly, in the checking step, operability is improved in inputting the check signals to the source driver side check signal input portions 47, and this effectively reduces a cost for equipments required for the checking step.

The method of manufacturing the array substrate (element substrate) 20 of this embodiment includes a line forming step, a checking step, and a removing step. In the line forming step, the following operations are performed. At least a pair of gate lines (a pair of lines) 26 are formed in the display area (an inner peripheral area) AA of the glass substrate GS and in a pair of non-display areas (outer peripheral areas) NAA that are located to sandwich the display area AA from two outer ends. In one of the pair of non-display areas NAA, one gate driver side check line (one check line) 46 that is connected to one end of one of the at least pair of gate lines (one line) 26 is formed. In another one of the pair of non-display areas NAA, another gate driver side check line (another line) 46 that is connected to another end of another one of the at least pair of gate lines (another line) 26 is formed. In the checking step, the check signals are input to the gate driver side check line 46 and the other gate driver side check line 46 to check the at least pair of gate lines 26. In the removing step, in the pair of non-display areas NAA, at least a part of the gate driver side check line 46 and a part of the other gate driver side check line 46 are removed such that the one gate line 26 is disconnected from the gate driver side check line 46 and the other gate line 26 is disconnected from the other gate driver side check line 46.

Thus, after the gate lines 26 and the gate driver side check lines 46 are formed on the glass substrate GS with the line forming step, the checking step is performed to check whether disconnection or short circuit occurs in the gate lines 26. After the checking step, the removing step is performed such that at least a part of each of the gate driver side check lines 46 is removed to bring the gate lines 26 to be disconnected from the gate driver side check lines 46.

In the line checking step, the gate driver side check line 46 that is connected to one ends of the one of the pair of gate lines 26 is formed in one of the pair of non-display areas NAA that sandwich the display area AA of the glass substrate GS from both sides. The other gate driver side check line 46 that is connected to the other ends of the other one of the pair of gate lines 26 is formed in the other one of the pair of non-display areas NAA. If the two gate driver side check lines 46 are concentrated in either one of the non-display areas NAA, the connection configurations between the gate driver side check lines 46 and the gate lines are likely to be complicated. Compared to such complicated configurations, in the present embodiment, the connection configurations between each gate driver side check line 46 and each gate line 26 are simplified and the distance between the outer end of each non-display area NAA and the outer end of the display area AA is maintained to be short. Accordingly, each non-display area NAA is reduced in its size and therefore, the display area AA is increased in its size by the reduced area of the non-display areas NAA. Namely, a size of the outer shape of the glass substrate GS is reduced.

In the chamfering step, a part of the glass substrate GS that ranges a predetermined area from the outer end is chamfered. Accordingly, compared to a case in which the outer end side portion of the glass substrate GS is cut away in the removing step, the second region A2, the third region, the first removing area RA1, the second removing area RA2, or the non-display area NAA is effectively reduced in the glass substrate GS. Also, a cost for a device used in the removing step is reduced.

The polarizing plate mount step in which the polarizing plate 23 is mounted on the surface of the glass substrate GS that is opposite to the line forming surface is performed prior to the removing step. Accordingly, in the polarizing mount step, static electricity is easily generated in mounting the polarizing plate 23, however, the lines are protected from the ESD (electrostatic discharge) by the check lines that are arranged on the glass substrate GS.

The first embodiment of the present invention is described before, however, the present invention is not limited to the above embodiment described in the above description and the drawings. The following modifications are also included in the technical scope of the present invention, for example. In the following modifications, the same symbols or numerals as the above embodiment are applied to the same components as the above embodiment and such components will not be explained or illustrated in drawings.

First Modification of First Embodiment

A first modification of the first embodiment will be explained with reference to FIG. 16. The arrangement of first line connection portions 49-1 is altered.

Figure 16:
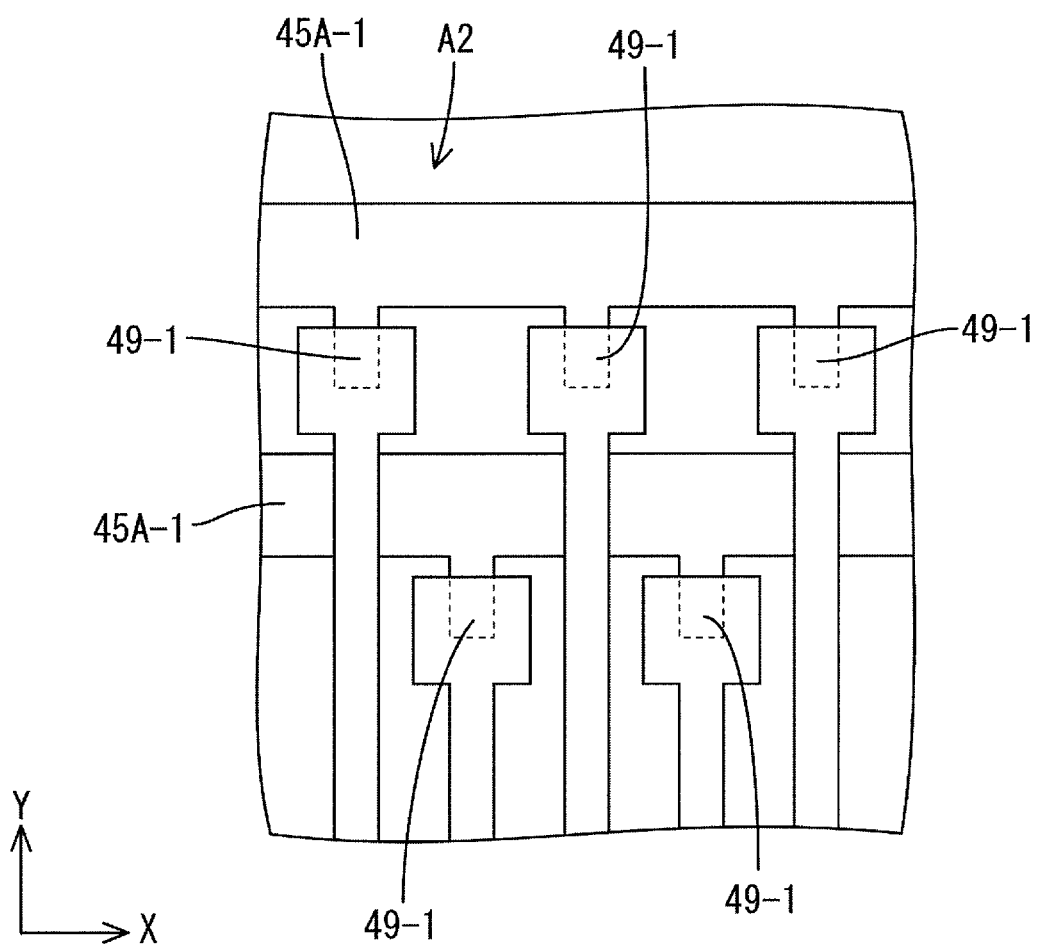
FIG. 16 is a plan view illustrating a plan configuration of a first source driver-side check line and a first wiring connection according to a first modification of the first embodiment.

As illustrated in FIG. 16, according to this modification, some of the first line connection portions 49-1 are arranged between a pair of first source driver side check lines 45A-1 with respect to the Y-axis direction and some of them are arranged on an inner side of the first source driver side check line 45A-1 that is located relatively on an inner side. Namely, some of the first line connection portions 49-1 are arranged on a relatively inner side with respect to the Y-axis direction and some of them are arranged on a relatively outer side with respect to the Y-axis direction. The first line connection portions 49-1 are arranged to sandwich the first source driver side check line 45A-1 that is arranged on a relatively inner side. The relatively outer side first source driver side check line 45-A is connected to the relatively outer side first line connection portions 49-1, and the relatively inner side first source driver side check line 45A-1 is connected to the relatively inner side first line connection portions 49-1. With such a configuration, the relatively inner side first line connection portions 49-1 and the relatively outer side first line connection portions 49-1 partially overlap with respect to the X-axis direction. Therefore, the first line connection portions 49-1 are arranged at small intervals in the X-axis direction, and this reduces an arrangement space for the first line connection portions 49-1 and eventually reduces the second region A2 in the X-axis direction.

As explained above, according to the modification, in the line forming step, at least a pair of first source driver side check lines 45A-1 are formed to be parallel to an outer end of the second region as a plurality of first source driver side check lines 45A-1. A plurality of first line connection portions 49-1 are formed to sandwich one of the pair of first source driver side check lines 45A-1 that are parallel to the outer end of the second region A2. With such a configuration, the plurality of first line connection portions 49-1 are arranged at small intervals with respect to an extending direction in which at least the pair of first source driver side check lines 45A-1 parallel to the outer end of the second region A2 extend. Therefore, the second region A2 is reduced in its size with respect to the extending direction in which the pair of first source driver side check lines 45A-1 extend.

Second Modification of First Embodiment

A second modification of the first embodiment will be explained with reference to FIG. 17. The arrangement of first line connection portions 49-2 is further altered from that of the first modification of the first embodiment.

Figure 17:
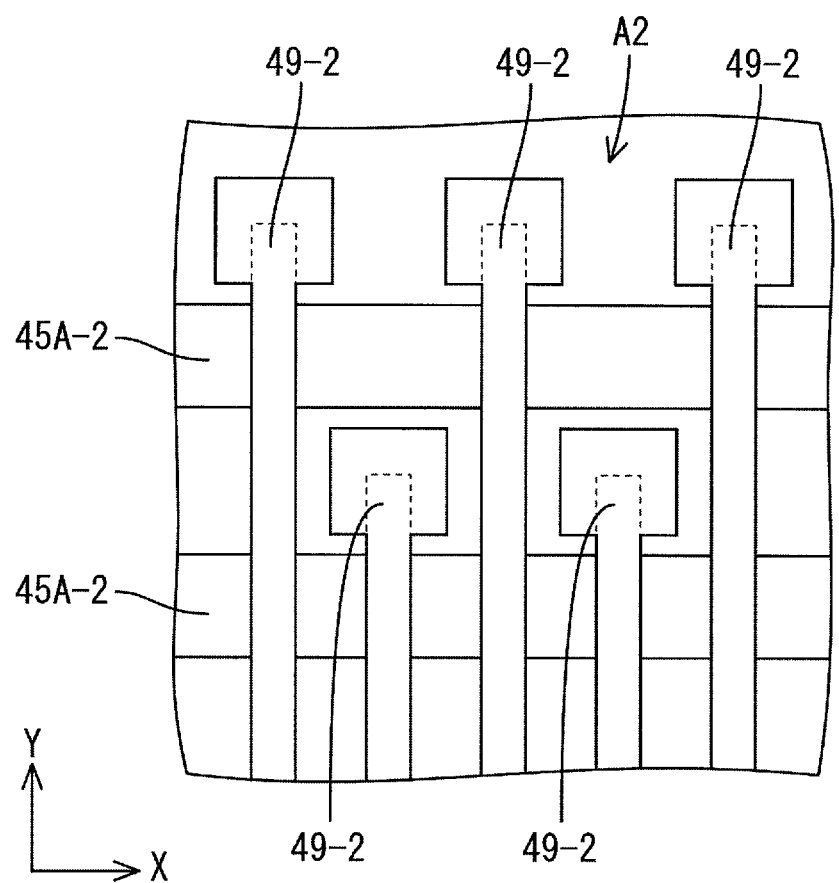
FIG. 17 is a plan view illustrating a plan configuration of a first source driver-side check line and a first wiring connection according to a second modification of the first embodiment.

As illustrated in FIG. 17, according to this modification, some of the first line connection portions 49-2 are arranged between a pair of first source driver side check lines 45A-2 with respect to the Y-axis direction and some of them are arranged on an outer side of the first source driver side check line 45A-2 that is located relatively on an outer side. Namely, some of the first line connection portions 49-2 are arranged on a relatively inner side with respect to the Y-axis direction and some of them are arranged on a relatively outer side with respect to the Y-axis direction. The first line connection portions 49-2 are arranged to sandwich the first source driver side check line 45A-2 that is arranged on a relatively outer side. With such a configuration, the same effects as the first modification of the first embodiment are obtained.

Third Modification of First Embodiment

A third modification of the first embodiment will be explained with reference to FIG. 18. The arrangement of first line connection portions 49-3 is further altered from that of the first modification of the first embodiment.

Figure 18:
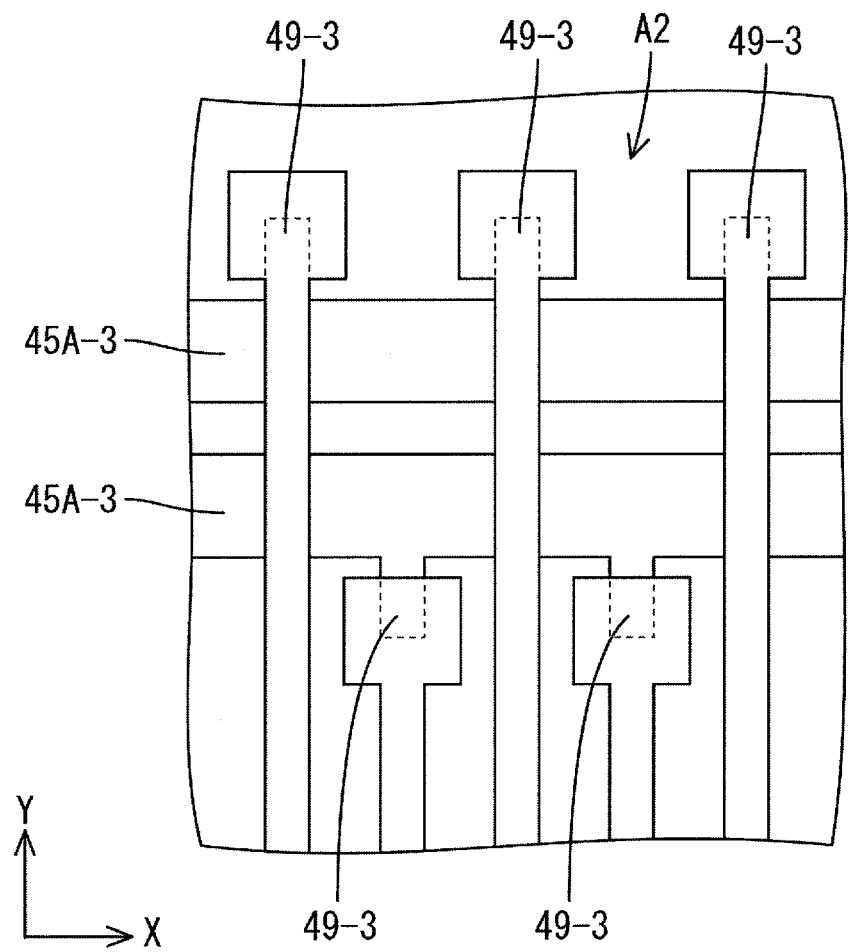
FIG. 18 is a plan view illustrating a plan configuration of a first source driver-side check line and a first wiring connection according to a third modification of the first embodiment.

As illustrated in FIG. 18, according to this modification, some of the first line connection portions 49-3 are arranged on a relatively outer side from the first source driver side check line 45A-3 that is arranged on a relatively outer side and some of them are arranged on a relatively inner side from the first source driver side check line 45A-3 that is arranged on a relatively inner side. Namely, some of the first line connection portions 49-3 that are arranged on a relatively inner side with respect to the Y-axis direction and some of them are arranged on a relatively outer side. The first line connection portions 49-3 are arranged to sandwich collectively the pair of first source driver side check lines 45A-3 therebetween from the inner and outer sides with respect to the Y-axis direction. With such a configuration, the same effects as the first modification of the first embodiment are obtained.

Fourth Modification of First Embodiment

A fourth modification of the first embodiment will be explained with reference to FIG. 19. A configuration of first source driver side check lines 45A-4 and a connection structure of the first source driver side check lines 45A-4 and source lines 27-4 are altered from the first modification of the first embodiment.

Figure 19:
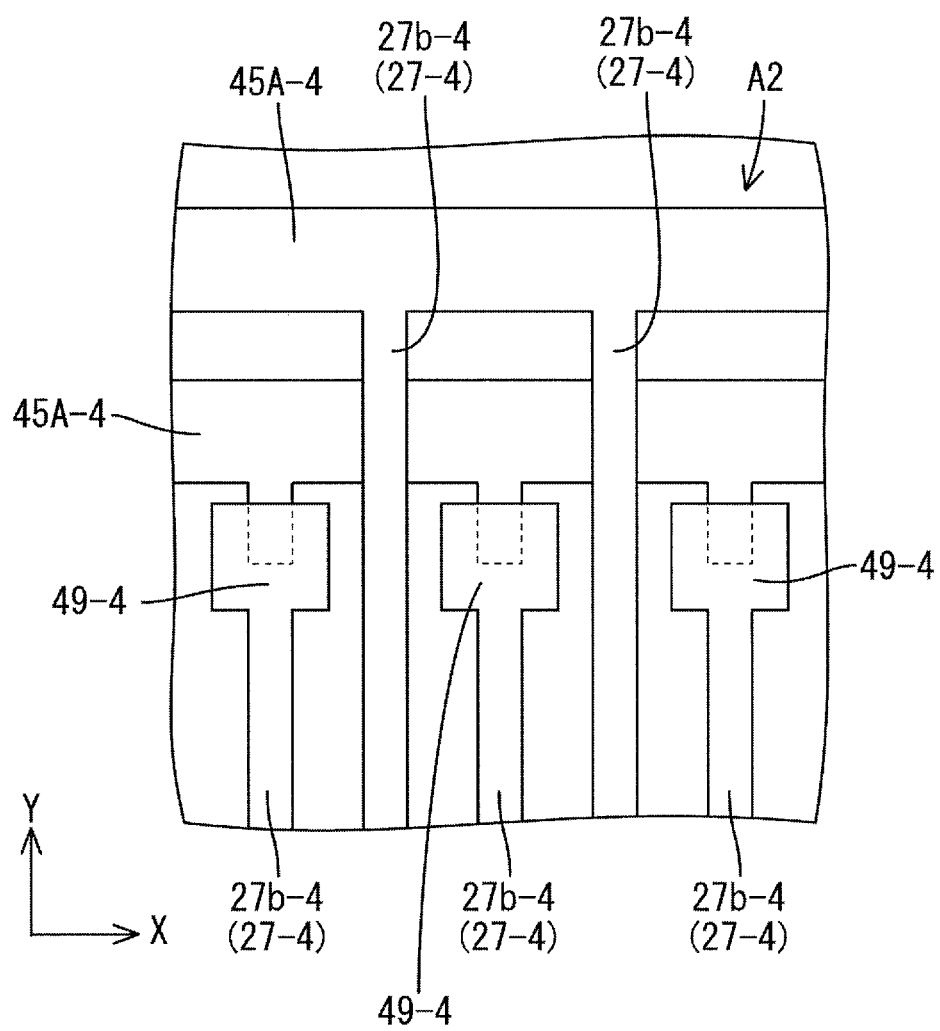
FIG. 19 is a plan view illustrating a plan configuration of a first source driver-side check line and a first wiring connection according to a fourth modification of the first embodiment

As illustrated in FIG. 19, according to this modification, one of the pair of first source driver side check lines 45A-4 that is arranged on a relatively outer side is formed of the same material as the source lines 27-4 and they are formed in the same layer in the same step of the manufacturing process. Therefore, the relatively inner side first source driver side check line 45A-4 is connected to extended portions 27b-4 of the source lines 27-4 that are formed in a different layer via the first line connection portions 49-5 similar to the first embodiment. The relatively outer side first source driver side check line 45A-4 is directly connected to the extended portions 27b-4 of the source lines 27-4 that are formed in the same layer. Specifically, the extended portions 27b-4 of the source lines 27-4 are extended to reach the relatively outer side first source driver side check line 45A-4 to be connected thereto. This simplifies the connection configuration between the first source driver side check lines 45A-4 and the source lines 27-4.

Fifth Modification of First Embodiment

A fifth modification of the first embodiment will be explained with reference to FIG. 20. The arrangement of first source driver side check lines 45A-5 is altered further from the first modification of the first embodiment.

Figure 20:
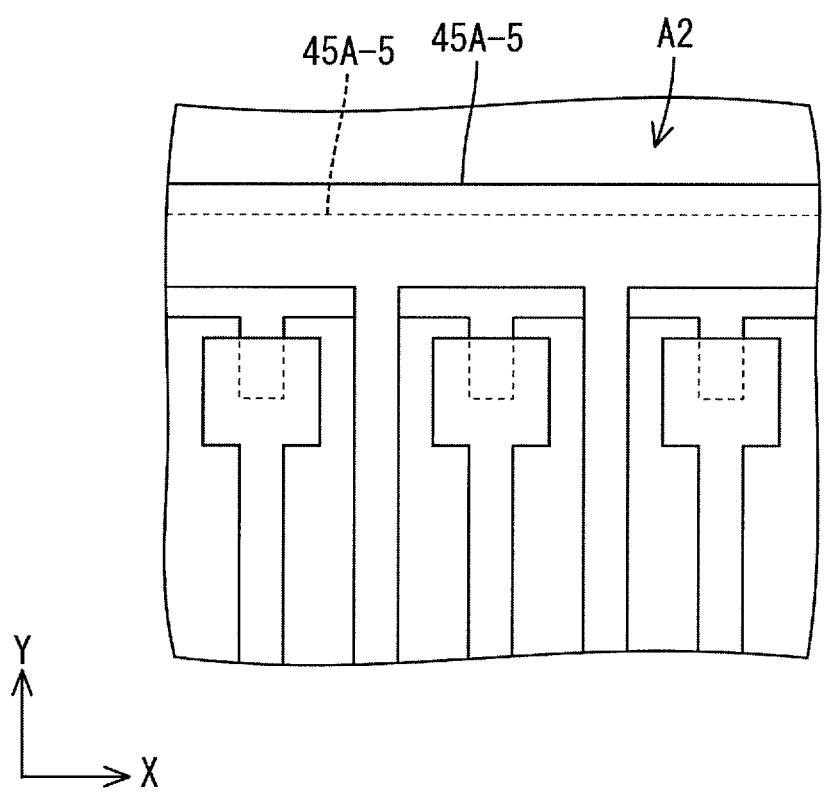
FIG. 20 is a plan view illustrating a plan configuration of a first source driver-side check line and a first wiring connection according to a fifth modification of the first embodiment.

As illustrated in FIG. 20, according to this modification, a pair of first source driver side check lines 45A-5 are arranged to overlap each other with a plan view. As is explained in the fourth modification of the first embodiment, the relatively outer side first source driver side check line 45A-5 and the relatively inner side first source driver side check line 45A-5 are formed in different layers, and a gate insulation film (not illustrated) is arranged therebetween. Therefore, the relatively inner side first source driver side check line 45A-5 and the relatively outer side first source driver side check line 45A-5 that is arranged in the upper layer are arranged to overlap each other. With such a configuration, the arrangement space for the first source driver side check line 45A-5 is reduced in the Y-axis direction and the second region A2 is further reduced in size.

Second Embodiment

A second embodiment of the present invention will be explained with reference to FIG. 21. In the second embodiment, the arrangement of the gate driver side check line 146 is altered. Configurations, operations, and effects same as those in the first embodiment will not explained.

Figure 21:
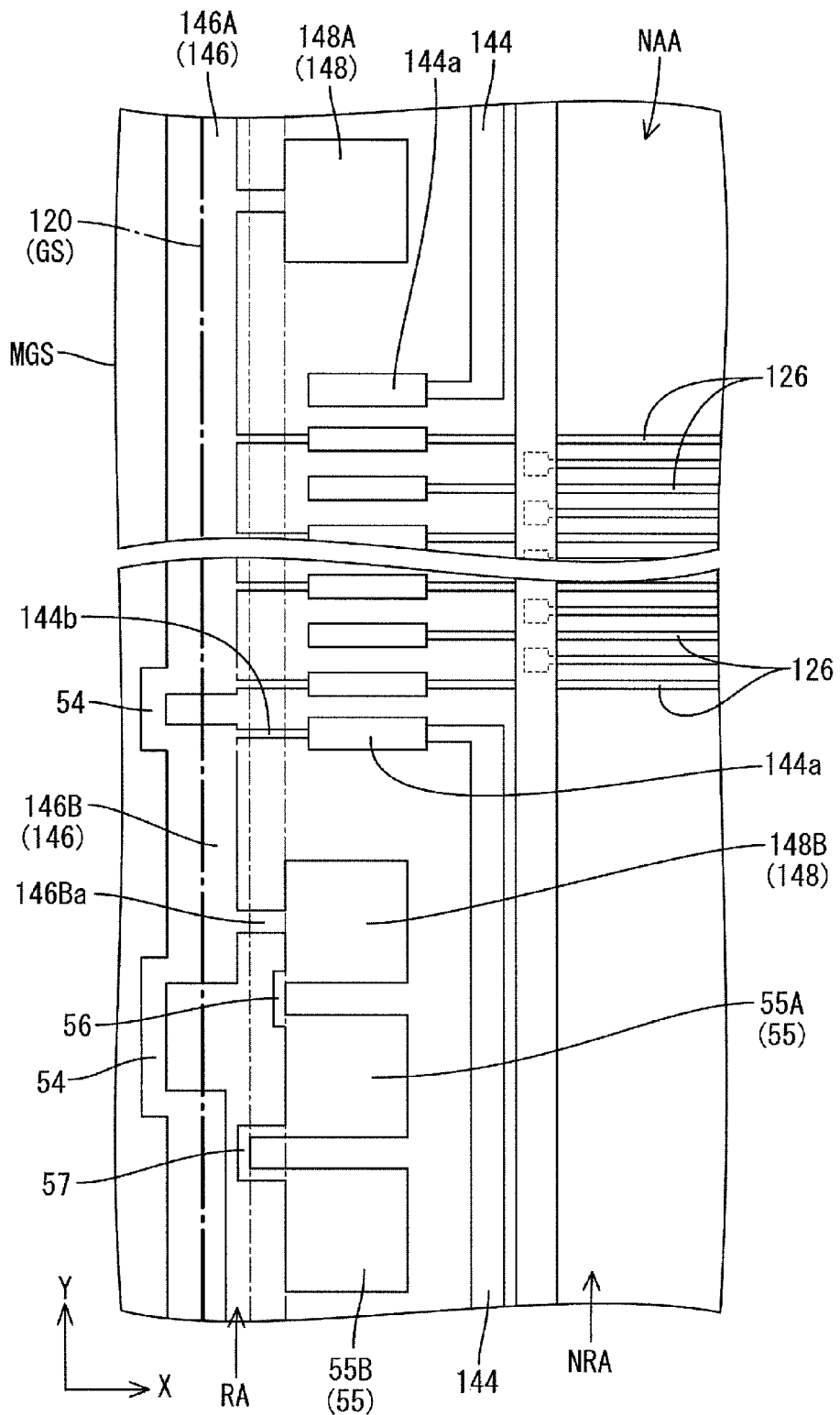
FIG. 21 is a plan view illustrating a wiring configuration of a gate driver-side end portion of an array substrate according to a second embodiment of the present invention.

As illustrated in FIG. 21, an array substrate 120 of this embodiment includes common lines (second line 9) 144 that are formed in an end portion of the non-display area NAA close to the gate driver GD side. The common lines 144 are arranged adjacent to the gate lines 126 in the Y-axis direction, and the gate lines 136 are arranged in the Y-axis direction. Most of a middle portion of the common line 144 extends in the Y-axis direction and two ends of the common line 144 are bent outwardly and extend to the connection portions of the gate driver GD. The end of the common line 144 has a common terminal 144a that is connected to the gate driver GD. The common line 144 is formed of the same material as the gate lines 126 and they are formed in a same layer in the same step of the manufacturing process.

Gate driver side check lines 146 include a first gate driver side check line (one check line or another check line) 146A that is connected to the gate lines 126 (lines) and a second gate driver side check line (second check line) 146B that is connected to the common lines 144. Each of the first gate driver side check line 146A and the second gate driver side check line 146B linearly extends along the Y-axis direction. They are arranged on a substantially same position with respect to the X-axis direction, that is, they are arranged on a substantially a same line (adjacent to each other in the Y-axis direction). The second gate drive side check line 146B is formed of the same material as the gate lines 126 and the first gate driver side check line 146A and they are formed in the same layer in the same step of the manufacturing process. The second gate driver side check line 146B is connected directly to the extended portions 144b that is extended outwardly from the common terminal 144a of the common line 144. A gate driver side check signal input portion 148 includes a first gate driver side check signal input portion 148A and a second gate driver side check signal input portion (removal check signal input portion) 148B. The second gate driver side check signal input portion 148B is formed of the same material as the gate lines 126 and the first gate driver side check signal input portion 148A, and they are formed in the same layer in the same step of the manufacturing process. The second gate driver side check signal input portion 148B is connected directly to the branch lines 146Ba that extend inwardly from the second gate driver side check line 146B. Accordingly, in the checking step, a check signal is input to the second gate driver side check line 146B and the common lines 144 via the second gate driver side check signal input portions 148B to check the common lines.

The first gate driver side check line 146A and the second gate driver side check line 146B are formed as described in FIG. 21 before cutting the mother glass MGS and obtaining the glass substrates GS therefrom. In FIG. 21, the first gate drive side check line 146A and the second gate driver side check line 146B are formed to cross a separation position (an outer shape, an outer end) of the glass substrate GS represented by a bold alternate longer and short dash line. Namely, before cutting the glass substrate GS, each of the first gate driver side check line 146A and the second gate driver side check line 146B has a line width that is greater than the line width after cutting the glass substrate GS. In FIG. 21, the line width before cutting is approximately twice as that after cutting. After cutting the glass substrate GS, the first gate driver side check line 146A and the second gate driver side check line 146B are also located on an outer end of the glass substrate GS. Before cutting the glass substrate GS, the first gate driver side check line 146A and the second gate driver side check line 146B are connected to each other by the check line connection portions 54. The check line connection portions 54 are located on an outer side from the cutting position of the mother glass BGS for obtaining glass substrates GS. The check line connection portions 54 are arranged outside of the first gate driver side check line 146A and the second gate driver side check line 146B. Therefore, entire areas of the check line connection portions 54 are removed after cutting the mother glass MGS to obtain the glass substrates GS. With the above configurations, before cutting and obtaining the glass substrates GS, the gate driver side check line 146 has wiring resistance smaller than that after cutting and obtaining the glass substrates GS. Therefore, even if ESD is generated during the manufacturing process and high voltage is applied to the gate driver side check lines 146, the TFTs 24 and the common lines 144 that are connected to the gate lines 126 are protected from the high voltage.

In this embodiment, a chamfering checking step (removal check step) is performed to check whether an actual chamfered area (removing area) of an array substrate 120 after the chamfering step (the removing step) is correct. In FIG. 21, a border between the removing area RA and the non-removing area NRA is illustrated by two parallel alternate long and short dash lines (having a line width thinner than the longer and short dash line representing the separation position of the glass substrate GS). One of the two alternate long and short dash lines that is on a relatively inner side represents an allowable maximum area of the removing area RA and another one thereof that is on a relatively outer side represents an allowable minimum area of the removing area RA. Removal check signal input portions 55 that are used in the chamfering checking step is formed in the non-removing area NRA of the array substrate 120. The removal check signal input portions 55 are arranged along the Y-axis direction with respect to the second gate driver side check signal input portion 148B. The removal check signal input portions 55 include a first removal check signal input portion 55A and a second removal check signal input portion 55B. The first removal check signal input portion 55A is located adjacent to the second gate driver side check signal input portion 148B and the second removal check signal input portion 55B is located adjacent to the first removal check signal input portion 55A. The first removal check signal input portion 55A, the second removal check signal input portion 55B, and the second gate driver side check signal input portion 148B are arranged such that outer ends thereof in the X-axis direction are on a substantially same plane and align with the alternate long and short dash line representing the allowable maximum area of the removing area RA (the inner one of the two thin alternate long and short dash lines). Each of the first removal check signal input portion 55A and the second removal check signal input portion 55B is formed in substantially a square shape with a plan view and has an area substantially equal to an area of the second gate driver side check signal input portion 148B.

The first removal check signal input portion 55A and the second gate driver side check signal input portion 148B are connected to each other by a first removal check connection line 56. The first removal check signal input portion 55A and the second removal check signal input portion 55B are connected to each other by a second removal check connection line 57. The first removal check connection line 56 extends along the Y-axis direction and is connected to an outer end of each of the second gate driver side check signal input portion 148B and the first removal check signal input portion 55A in the X-axis direction. An entire area of the first removal check connection line 56 is located between the alternate long and short dash line representing the allowable maximum area of the removing area RA and the alternate long and short dash lien representing the allowable minimum area. On the other hand, the second removal check connection line 57 is formed in substantially a ring shape that connects outer ends of the first removal check signal input portion 55A and the second removal check signal input portion 55B in the X-axis direction. A pair of parts of the second removal check connection line 57 extending along the X-axis direction cross the alternate long and short dash line representing the allowable maximum area of the removing area RA and the alternate long and short dash line representing the allowable minimum area. A part of the second removal check connection line 57 extending along the Y-axis direction is arranged outside of the alternate long and short dash line representing the allowable minimum area.

With such a configuration, if the removal area of the array substrate 120 is correct in the chamfering step and the border between the non-removing area NRA and the removing area RA is located between the two thin alternate long and short dash lines illustrated in FIG. 21, the second removal check connection line 57 is disconnected. However, the first removal check connection line 56 is not disconnected and the second gate driver side check signal input portion 148B and the first removal check signal input portion 55A are kept in the connected state. Therefore, in the chamfering checking step, if a current flows between the second gate driver side check signal input portion 148B and the first removal check signal input portion 55A and a current does not flow between the first removal check signal input portion 55A and the second removal check signal input portion 55B, it is judged that the chamfering step is correctly performed.

On the other hand, in the chamfering step, if the removing area of the array substrate 120 is too large (excessive), the border between the non-removing area NRA and the removing area RA is located on an inner side from the inner one of the two thin alternate long and short dash lines illustrated in FIG. 21. Therefore, the first removal check connection line 56 and the second removal check connection line 57 are disconnected. Accordingly, in the chamfering checking step, if a current does not flow between the second gate driver side check signal input portion 148B and the first removal check signal input portion 55A and a current does not flow between the first removal check signal input portion 55A and the second removal check signal input portion 55B, it is judged that the removing area in the chamfering step is too large.

Further, if the removing area RA of the array substrate 120 is too small (insufficient) in the chamfering step, the border between the non-removing area NRA and the removing area RA is located on an outer side from the outer one of the two thin alternate long and short dash lines illustrated in FIG. 21. Therefore, the first removal check connection line 56 and the second removal check connection line 57 are not disconnected. Accordingly, the second gate driver side check signal input portion 148B and the first removal check signal input portion 55A are kept in a connected state and the first removal check signal input portion 55A and the second removal check signal input portion 55B are kept in a connected state. Therefore, in the chamfering checking step, if a current flows between the second gate driver side check signal input portion 148B and the first removal check signal input portion 55A and a current flows between the first removal check signal input portion 55A and the second removal check signal input portion 55B, it is judged that the removing area in the chamfering step is too small.

As explained above, according to this embodiment, a substrate cutting step is performed between the line forming step and the checking step to cut the mother glass (substrate parent material) MGS into pieces and obtain a plurality of glass substrates GS. In the line forming step, one of the one gate driver side check line 146 and the other gate driver side check line 146 is formed to cross the cutting position for the glass substrates GS in the substrate cutting step. Accordingly, before performing the substrate cutting step, the gate driver side check line 146 that is formed to cross the cutting position on the mother glass MGS for the glass substrates GS has a sufficient large width and has a low wiring resistance, and this is effective for dealing with the ESD (electrostatic discharge). After the substrate cutting step, the gate driver side check line 146 is located on an outer end of the non-display area NAA. Therefore, the gate driver side check line 146 has a sufficient large width and this is effective for dealing with the ESD.

In the line forming step, lines are formed as follows. The common line 144 is formed in at least one of the pair of non-display areas NAA. The second gate driver side check line 146B that is connected to the common line 144 is formed to cross the cutting position for the glass substrates GS in the substrate cutting step. The check line connection portion 54 that is connected to the first gate driver side check line 146A and the second gate driver side check line 146B is formed in an outer side area from the cutting position for the glass substrates GS in the substrate cutting step. In the substrate cutting step, the check line connection portion 54 is removed from the glass substrate GS according to the cutting of the mother glass MGS to obtain glass substrates GS. Accordingly, before performing the substrate cutting step, the first gate driver side check line 146A and the second gate driver side check line 146B that are formed to cross the cutting position for the glass substrate GS are connected to each other via the check line connection portions 54. This lowers wiring resistance in the first gate driver side check line 146A and the second gate driver side check line 146B that are connected to each other. This is further effective for dealing with the ESD.

In the line forming step, the removal check signal input portions 55 are formed in a part of the glass substrate GS that is not to be removed in the removing step, and the removal check connection line 57 that connects the removal check signal input portions 55 are formed in the position of the glass substrate GS that is to be removed in the removing step. After performing the removing step, the removal checking step is performed to judge whether the removing step is performed correctly based on a current flowing state between the removal check signal input portions 55. Accordingly, if the removing step is performed correctly, the removal check connection line 57 is removed, and therefore a current does not flow between the removal check signal input portions 55 in the removal checking step. On the other hand, if the removing step is not preformed correctly, the removal check connection line 57 is not completely removed, and therefore a current flows between the removal check signal input portions 55 in the removal checking step. Performing such removal checking step reduces the number of defective products.

Third Embodiment

A third embodiment of the present invention will be explained with reference to FIG. 22. In the third embodiment, an extended line 58 is formed in a source driver SD side end portion in the non-display area NAA of an array substrate 220, and a second source driver side check line 245B for checking the extended line 58 is formed. The configurations, operations, and effects same as the first embodiment will not be explained.

Figure 22:
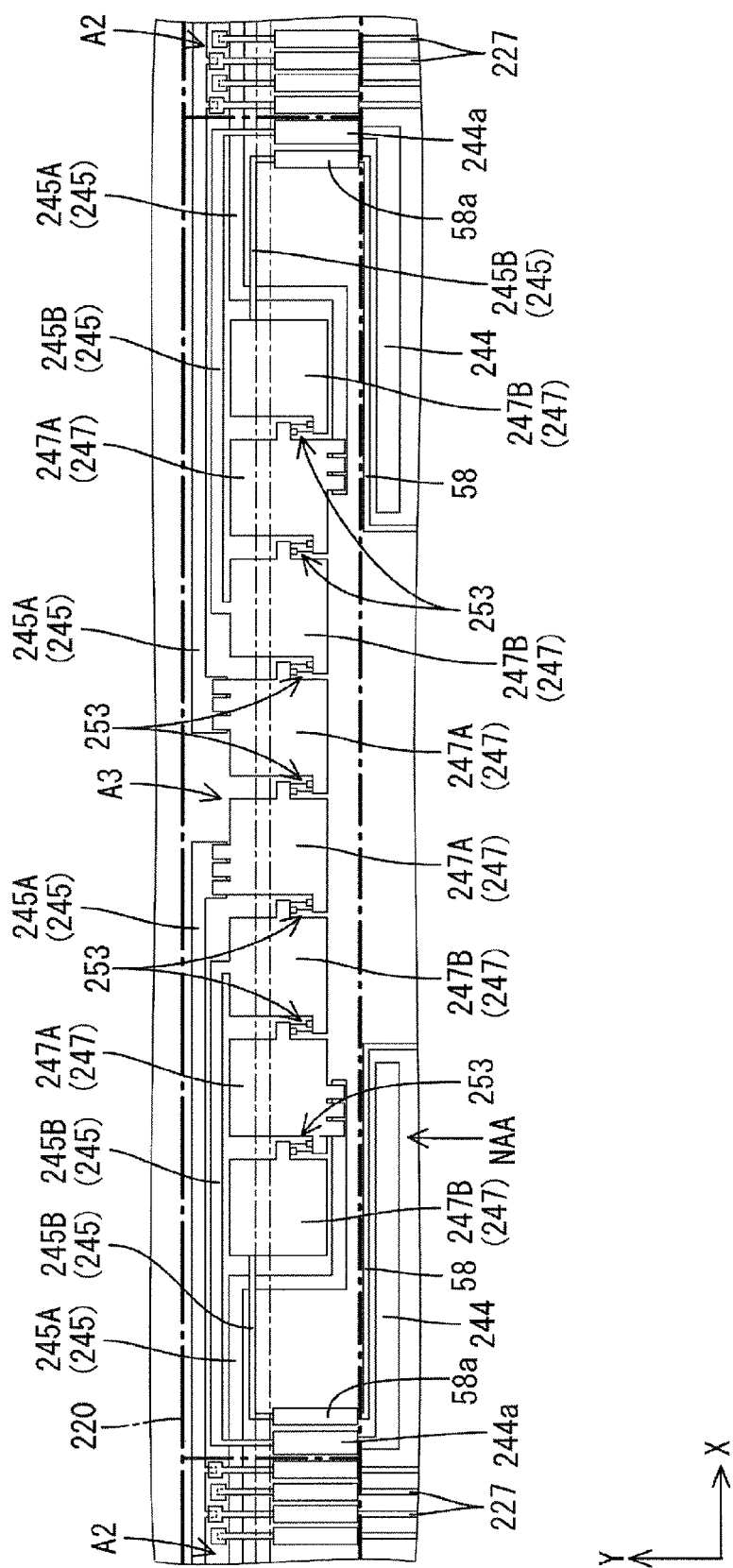
FIG. 22 is a plan view illustrating a wiring configuration of a source driver-side end portion of an array substrate according to a third embodiment of the present invention.

As illustrated in FIG. 22, the extended line (auxiliary line) 58 is formed in the source driver SD side end portion of the non-display area NAA of the array substrate 220. If a source line 227 is disconnected, the disconnection is repaired with the extended line 58. The extended line 58 is arranged adjacent to a common line 244 and almost parallel to the common line 244. An extended terminal 58a is formed on one end of the extended line 58 and the extended terminal 58a is connected to the source driver SD. The extended terminal 58a is arranged adjacent to a common terminal 244a. The extended line 58 is formed of the same material as the common line 244 and the source line 227 and they are formed in the same layer in the same step of the manufacturing process. As is not illustrated in the drawings, another end of the extended line 58 is connected to a line that extends in the X-axis direction to cross the source lines 27 and is formed in the same layer as the gate lines 26. An overlap portion of the line and the disconnected source line 227 is short-circuited and a signal is supplied to the disconnected source line 227 via the extended line 58.

The second source driver side check lines 245B and the second source driver side check signal input portions 247B are connected to the common line 244 and the extended line 58, respectively. The second source driver side check line 245B that is connected to the extended line 58 is formed in an L-shape as a whole so as to extend from the extended terminal 58a outwardly in the Y-axis direction and extend in the X-axis direction. The second source driver side check signal input portion 247B that is connected to the extended line 58 is arranged between the extended terminal 58a and the first source driver side check signal input portion 247A that is connected to the first source driver side check line 245A that is arranged on a relatively inner side. Namely, the first source driver side check signal input portions 247A and the second source driver side check lines 245B are arranged alternately in the X-axis direction.

Further, in this embodiment, the source lines 227, the common line 244, and the extended line 58 that are connected to each of the source drivers SD are defined into two groups, and the source driver side check lines 245 and the source driver side check signal input portions 247 are arranged for each group. Namely, the number of the source driver side check lines 245 and the source driver side check signal input portions 247 arranged for each source driver SD is twice as that in the first embodiment. Specifically, four first source driver side check signal input portions 247A and four second source driver side check signal input portions 247B are arranged in the X-axis direction in the third region A3 of the non-display area NAA. Eight source driver side check signal input portions 247 in total are connected to each other by ESD protection circuits 253. Four first source driver side check lines 245A and four second source driver side check lines 245B are arranged to be symmetrical in FIG. 22 and cross the second region A2 and the third region A3.

Fourth Embodiment

A fourth embodiment of the present invention will be explained with reference to FIG. 23. In the fourth embodiment, the number of first source driver side check lines 345A is altered. The configurations, operations, and effects that are same as those in the first embodiment will not be explained.

Figure 23:
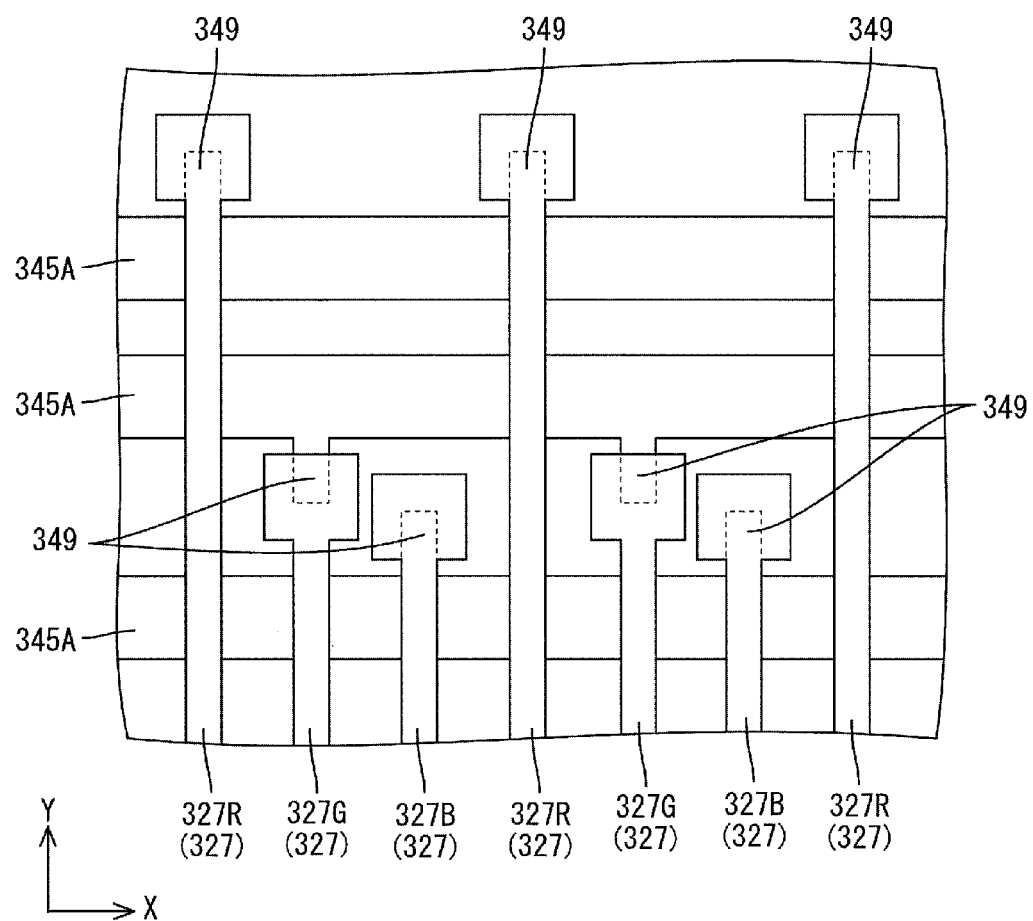
FIG. 23 is a plan view illustrating a plan configuration of a first source driver-side check line and a first wiring connection according to a fourth embodiment of the present invention.

As illustrated in FIG. 23, three first source driver side check lines 345A are arranged for a group of the source lines 327. The three first source driver side check lines 345A includes one that is arranged on the outer side in the second range A2 with respect to the Y-axis direction, one that is arranged on the inner side in the second range A2 with respect to the Y-axis direction, and one that is arranged in the middle. The source lines 327 included in the group of the source lines 327 are connected alternately to the three first source driver side check lines 345A. Specifically, among the group of the source lines 327, the first source line 327 from the left side in FIG. 23 is connected to the outer side first source driver side check line 345A, and the second source line 327 from the left side is connected to the middle first source driver side check line 345A, and the third source line 327 from the left side is connected to the inner first source driver side check line 345A, and the fourth source line 327 is connected to the outer first source driver side check line 345A. Namely, if "n" is a natural number, the outer first source driver side check line 345A is connected to the (3n−2)th source lines 327, and the middle first source driver side check line 345A is connected to the (3n−1)th source lines 327, and the inner first source driver side check line 345A is connected to the 3nth source lines 327.

Each source line 327 is connected to each of the TFTs 24 that are connected to the pixel electrodes 25 that face the coloring sections 29 of three colors R, G, and B of the color filter on the CF substrate 21 side (refer to FIG. 4). Therefore, the source lines 327 are defined into source lines 327R for R-pixels, source lines 327G for G-pixels, and source lines 327B for B-pixels. The three first source driver side check liens 345A are connected to the source lines 327R for R-pixels, the source liens 327G for G-pixels, and the source lines 327B for B-pixels, respectively. For example, the outer first source driver side check line 345A is connected to the source lines 327R for R-pixels, and the middle first source driver side check line 345A is connected to the source lines 327G for G-pixels, and the inner first source driver side check line 345A is connected to the source lines 327B for B-pixels. Therefore, in the checking step, a check signal is independently input to each of the three first source driver side check lines 345A such that the checking is performed by displaying an image of a single color on the liquid crystal panel 11. Specifically, if a check signal for white display (for example, a maximum gradation value) is input to the outer first source driver side check line 345A and a check signal for black display (for example, a minimum gradation value) is input to the other first source driver side check lines 345A, a red single colored image is displayed on the liquid crystal panel 11. If the check signal for white display is input to the middle first source driver side check line 345A and the check signal for black display is input to other first source driver side check lines 345A, a green single colored image is displayed on the liquid crystal panel 11. If the check signal for white display is input to the inner first source driver side check line 345A and the check signal for black display is input to other first source driver side check lines 345A, a blue single colored image is displayed on the liquid crystal panel 11.

Next, arrangement of first line connection portions 349 that connect the first source driver side check lines 345A and the source lines 327 will be explained. The first line connection portions 349 that connect the outer first source driver side check line 345A and the source lines 327 are arranged on an outer side from the outer first source driver side check line 345A with respect to the Y-axis direction. The first line connection portions 349 that connect the middle first source driver side check line 345A and the source lines 327 and the first line connection portions 349 that connect the inner first source driver side check lines 345A and the source lines 327 are arranged between the middle first source driver side check line 345A and the inner first source driver side check line 345A with respect to the Y-axis direction and arranged in the X-axis direction to overlap each other in the Y-axis direction.

The fourth embodiment of the present invention is described before, however, the present invention is not limited to the above embodiment described in the above description and the drawings. The following modifications are also included in the technical scope of the present invention, for example. In the following modifications, the same symbols or numerals as the above embodiment are applied to the same components as the above embodiment and such components will not be explained or illustrated in drawings.

First Modification of Fourth Embodiment

A first modification of the fourth embodiment will be explained with reference to FIG. 24. Arrangement of first line connection portions 349-1 is different from that of the fourth embodiment.

Figure 24:
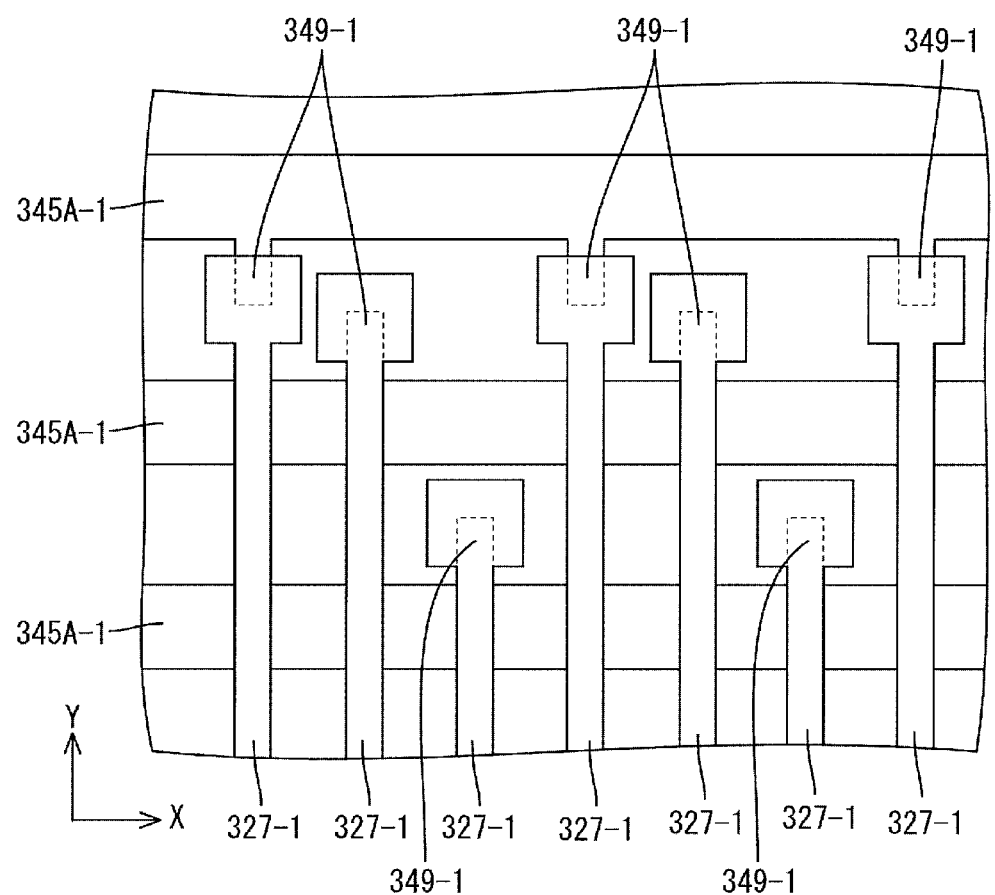
FIG. 24 is a plan view illustrating a plan configuration of a first source driver-side check line and a first wiring connection according to a first modification of the fourth embodiment of the present invention.

As illustrated in FIG. 24, the first line connection portions 349-1 of this modification are arranged between adjacent first source driver side check lines 345A-1. Specifically, the first line connection portions 349-1 that connect the outer first source driver side check line 345A-1 and the source lines 327-1 and the first line connection portions 349-1 that connect the middle first source driver side check line 345A-1 and the source lines 328-1 are arranged between the outer first source driver side check line 345A-1 and the middle first source driver side check line 345A-1 with respect to the Y-axis direction and arranged in the X-axis direction to overlap each other with respect to the Y-axis direction. The first line connection portions 349-1 that connect the inner first source driver side check line 345A-1 and the source lines 327-1 are arranged between the middle first source driver side check line 345A-1 and the inner first source driver side check line 345A-1 with respect to the Y-axis direction.

Second Modification of Fourth Embodiment

A second modification of the fourth embodiment will be explained with reference to FIG. 25. Arrangement of first line connection portions 349-2 is altered from that of the fourth embodiment.

Figure 25:
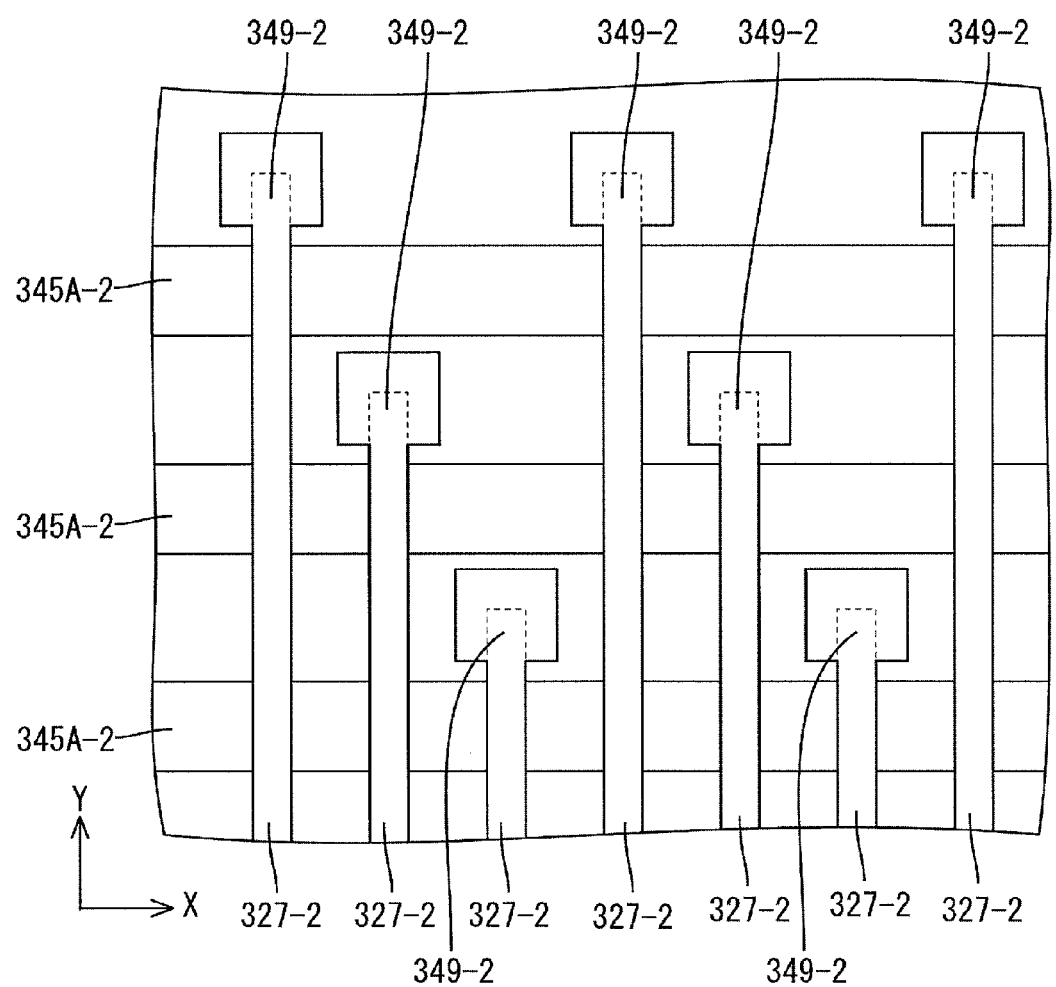
FIG. 25 is a plan view illustrating a plan configuration of a first source driver-side check line and a first wiring connection according to a second modification of the fourth embodiment of the present invention.

As illustrated in FIG. 25, the first line connection portions 349-2 of this modification do not overlap each other with respect to the Y-axis direction. Specifically, the first line connection portions 349-2 that connect the outer first source driver side check line 345A-2 and the source lines 327-2 are arranged on an outer side from the outer first source driver side check line 345A-2 with respect to the Y-axis direction. The first line connection portions 349-2 that connect the middle first source driver side check line 345A-2 and the source lines 327-2 are arranged between the outer first source driver side check line 345A-2 and the middle first source driver side check line 345A-2 with respect to the Y-axis direction. The first line connection portions 349-2 that connect the inner first source driver side check line 345A-2 and the source lines 327-2 are arranged between the middle first source driver side check line 345A-2 and the inner first source driver side check line 345A-2.

Third Modification of Fourth Embodiment

A third modification of the fourth embodiment will be explained with reference to FIG. 26. A configuration of first source driver side check lines 345-A and a connection structure between the first source driver side check lines 345-A and source lines 327-3 are altered from the second modification of the fourth embodiment.

Figure 26:
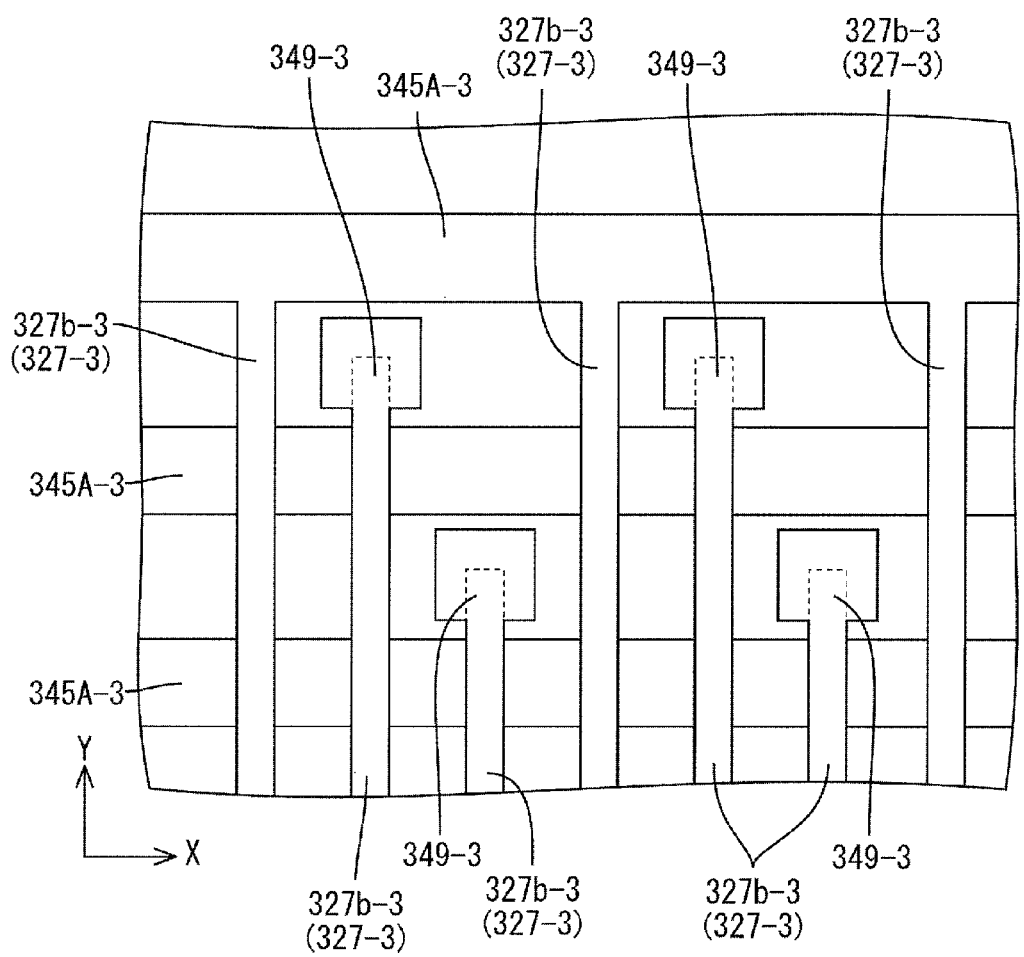
FIG. 26 is a plan view illustrating a plan configuration of a first source driver-side check line and a first wiring connection according to a third modification of the fourth embodiment of the present invention.

Among the three first source driver side check lines 345A-3, an outer first source driver side check line 345A-3 is formed of the same material as the source lines 327-3 and formed in the same layer as the source lines 327-3 in the same step in the manufacturing process, as illustrated in FIG. 26. Therefore, other two first source driver side check lines 345A-3 are connected via the first line connections 349-3 to extended portions 327b-3 of the source lines 327-3 that are formed in a different layer from the two first source driver side check lines 345A-3. The outer first source driver side check line 345A-3 is connected directly to the extended portions 327b-3 of the source lines 327-3 that are formed in the same layer as the outer first source driver side check line 345A-3. Specifically, the extended portions 327b-3 of the source lines 327-3 extend to the outer first source driver side check line 345A-3 to be connected thereto. This simplifies the connection structure of the first source driver side check lines 345A-3 and the source lines 327-3.

Fourth Modification of Fourth Embodiment

Figure 27:
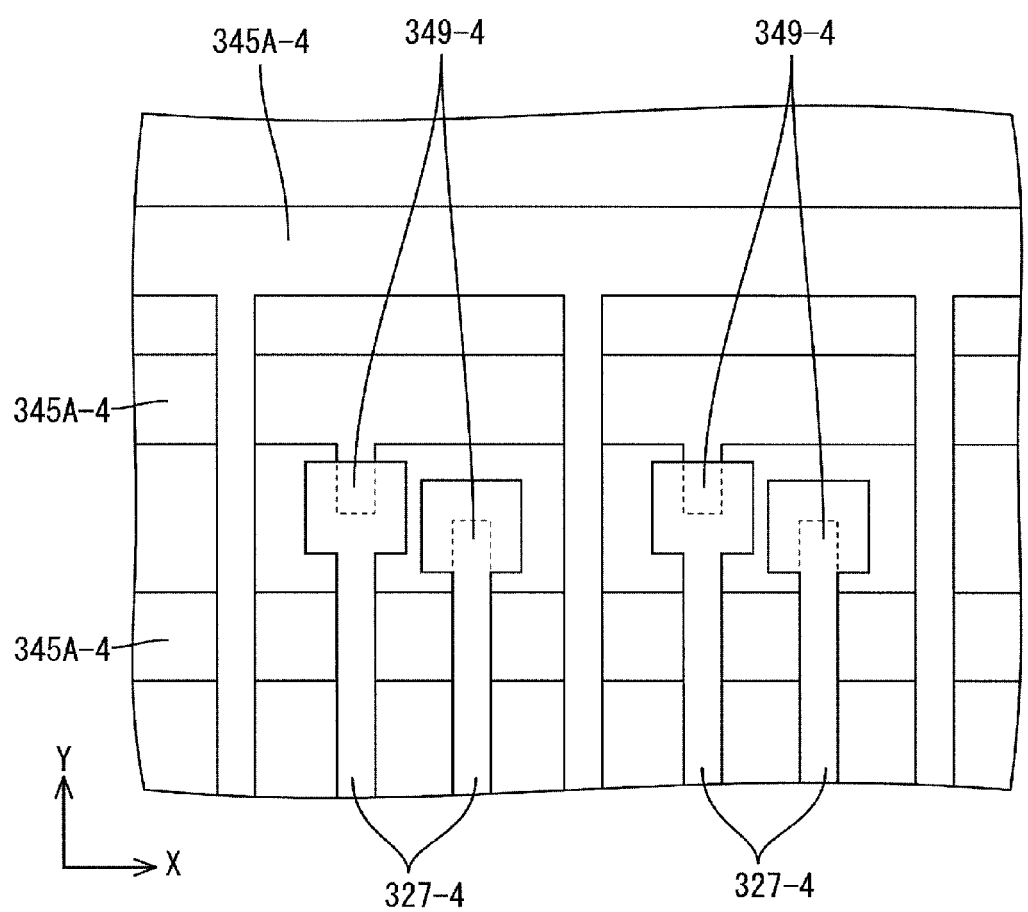
FIG. 27 is a plan view illustrating a plan configuration of a first source driver-side check line and a first wiring connection according to a fourth modification of the fourth embodiment of the present invention.

A fourth modification of the fourth embodiment will be explained with reference to FIG. 27. An arrangement of first line connection portions 349-4 is altered from that of the third modification of the fourth embodiment.

In this modification, first line connection portions 349-4 that connect the middle first source driver side check line 345A-4 and the source lines 327-4 and the first line connection portions 349-4 that connect the inner first source driver side check line 345A-4 and the source lines 327-4 are arranged between the middle first source driver side check line 345A-4 and the inner first source driver side check line 345A-4 with respect to the Y-axis direction and arranged in the X-axis direction to overlap each other with respect to the Y-axis direction.

Fifth Embodiment

A fifth embodiment of the present invention will be explained with reference to FIG. 28. In the fifth embodiment, power source lines 59, clock lines 60, and ground lines 61 are arranged in the non-display area NAA of an array substrate 420. The configurations, operations, and effects that are same as the first embodiment will not be explained.

Figure 28:
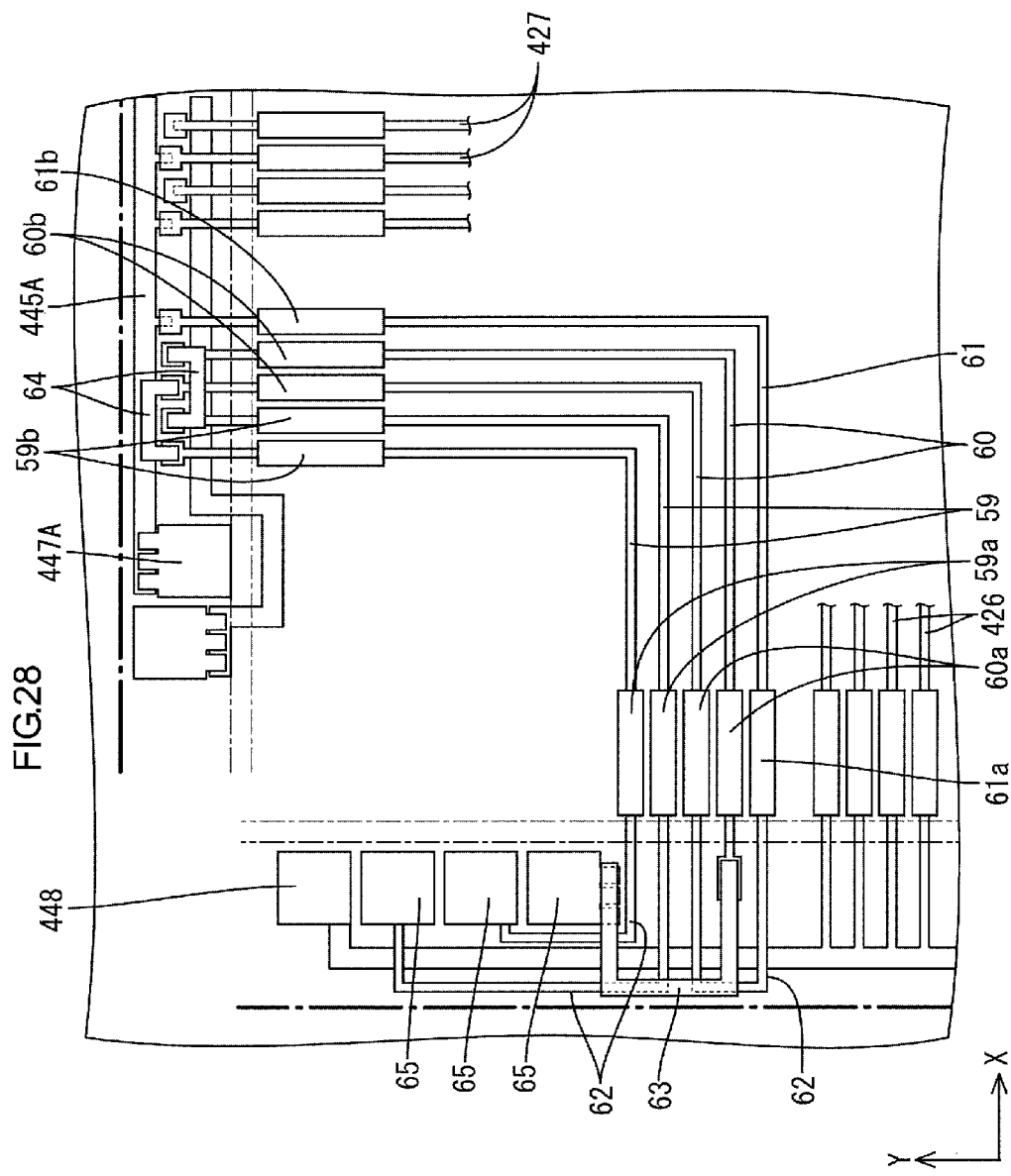
FIG. 28 is a plan view illustrating a wiring configuration of a corner of an array substrate according to a fifth embodiment of the present invention.

As illustrated in FIG. 28, the power source lines 59, the clock lines 60, and the ground lines 61 are arranged in a corner portion of the non-display area NAA of the array substrate 420 according to this embodiment. A power source potential, a clock signal, and a ground potential are supplied from the source driver SD to the gate driver GD via the power source lines 59, the clock lines 60, and the ground lines 61, respectively. Each of the power source line 59, the clock line 60, and the ground line 61 is formed in an L-shape as a whole and formed to extend from the connection portion of the source driver SD to the connection portion of the gate driver GD. The power source line 59 has a gate driver side power source terminal 59a at its gate driver GD side end, and the clock line 60 has a gate driver side clock terminal 60a at its gate driver GD side end, and the ground line 61 has a gate driver side ground terminal 61a at its gate driver GD side end. The power source line 59 has a source driver side power source terminal 59b at its source driver SD side end, and the clock line 60 has a source driver side clock terminal 60b at its source driver SD side end, and the ground line 61 has a source driver side ground terminal 61*b* at its source driver SD side end. The power source lines 59, the clock lines 60, and the ground lines 61 are formed of the same material as the source lines 427 and formed in the same layer as the source lines 427 in the same step of the manufacturing process. In FIG. 28, two power source lines 59, two clock lines 60, and one ground line 61 are illustrated.

Check lines 62 to 64 are arranged in the corner portion of the non-display area NAA of the array substrate 420. The check lines 62 to 64 are used to check whether disconnection or short-circuit is caused in the power source lines 59, the clock lines 60, and the ground lines 61. The check lines 62 to 64 include first check lines 62 and second check lines 63, 64. The first check lines 62 are formed of the same material as the source lines 427 and they are formed in the same step of the manufacturing process. The second check lines 63, 64 are formed of the same material as the pixel electrodes 25 and they are formed in the same step of the manufacturing process. On the other hand, check signal input portions 65 are formed in the corner portion of the non-display area NAA of the array substrate 420. The check signal input portions 65 are connected to the check lines 62 to 64 and check signals are input via the check signal input portions 65. Three check signal input portions 65 are formed of the same material as the source lines 427 and they are formed in the same layer in the same step of the manufacturing process.

Specifically, one of the first check lines 62 connects a most upper gate driver side power source terminal 59*a* among the five gate driver side terminals 59*a* to 61*a* in FIG. 28 and a middle check signal input portion 65 of the three check signal input portions 65. Another one of the first check lines 62 connects a second upper gate driver side power source terminal 59*a* among the five gate driver side terminals 59*a* to 61*a* and a most upper check signal input portion 65 of the three check signal input portions 65. Another one of the first check lines 62 connects a third upper gate driver side clock terminal 60*a* among the five gate driver side terminals 59*a* to 61*a* and a fifth upper gate driver side ground terminal 61*a* among the five gate driver side terminals 59*a* to 61*a*. The first check lines 62 are formed in the same layer as the gate driver side terminals 59*a* to 61*a* and the check signal input portions 65, and therefore they are connected directly to each other.

On the other hand, among the second check lines 63, 65, the second check line 63 that is arranged on the connection portion side of the gate driver GD connects a fourth upper gate driver side clock terminal 60*a* among the five gate driver side terminals 59*a* to 61*a* in FIG. 28 and a most lower check signal input portion 65 of the three check signal input portions 65. The second check line 63 is formed in a different layer from the one in which the gate driver side clock terminals 60*a*, the check signal input portions 65, and the first check lines 62 are formed (in an upper layer above the in-between insulation film 37 and the protection film 38). Therefore, The second check line 63 is in contact with the gate driver side clock terminals 60*a* and the check signal input portions 65 through an opening (not illustrated) formed in the in-between insulation film 37 and the protection film 38. The second check line 63 is arranged to partially overlap the first check lines 62 with a plan view.

Further, among the second check lines 63, 64, one of the second check lines 64 arranged on the source driver SD connection portion side connects a left end-side source driver side power source terminal 59*b* among the five source driver side terminals 59*b* to 61*b* in FIG. 28 and a third source driver side clock terminal 60*b* from the left. Another one of the second check lines 64 connects a second source driver side power source terminal 59*b* from the left and a fourth source driver side clock terminal 60*b* from the left. Each of the source driver side power source terminals 59*b* and the source driver side clock terminals 60*b* has an extended portion extending therefrom to the connection portion of each second check line 64. The second check line 64 is formed in a different layer from the one in which the source driver side power source terminals 59*b*, the source driver side clock terminals 60*b*, and the first source driver side check line 445A are formed (in an upper layer above the in-between insulation film 37 and the protection layer 38). Therefore, The second check line 64 is in contact with the source driver side power source terminals 59*b* and the source driver side clock terminals 60*b* through an opening (not illustrated) formed in the in-between insulation film 37 and the protection film 38. The second check line 64 is arranged to partially overlap the first source driver side check line 445A with a plan view.

A right end-side source driver side ground terminal 61*b* among the five source driver side terminals 59*b* to 61*b* in FIG. 28 has an extended portion extending outwardly, and the extended portion is connected to the first source driver side check line 445A. Therefore, the ground line 61 is connected to the first driver side check signal input portion 447A via the first source driver side check line 445A.

In the checking step, it is checked whether a current flows between the middle check signal input portion 65 of the three check signal input portions 65 in FIG. 28 and the first source driver side check signal input portion 447 that is connected to the ground line 61. If a current does not flow, it is detected that disconnection occurs in any one of the most upper (left) side power source line 59, the third clock line 60 from the upper (left) side, and the lowest (right) side ground line 61 in FIG. 28. If a current flows, it is detected that no disconnection occurs in any of the lines 59 to 61. In the checking step, it is checked whether a current flows between the most upper side check signal input portion 65 and the lowest side check signal input portion 65 among the three check signal input portions 65 in FIG. 28. If a current does not flow, it is detected that disconnection occurs in any one of the second power source line 59 from the upper (left) side and the fourth clock line 60 from the upper (left) side in FIG. 28. If a current flows, it is detected that no disconnection occurs in any of the lines 59, 60. Further, in the checking step, it is checked whether a current flows between the most upper side check signal input portion 65 and the middle check signal input portion 65 among the three check signal input portions 65 in FIG. 28. If a current flows, it is detected that short-circuit occurs in any two of the lines 59 to 61. If a current does not flow, it is detected no short-circuit occurs in any of the liens 59 to 61.

Sixth Embodiment

A sixth embodiment of the present invention will be explained with reference to FIG. 29 or FIG. 30. The sixth embodiment does not include the gate driver GD. The configurations, operations, and effects that are same as those of the first embodiment will not be explained.

Figure 29:
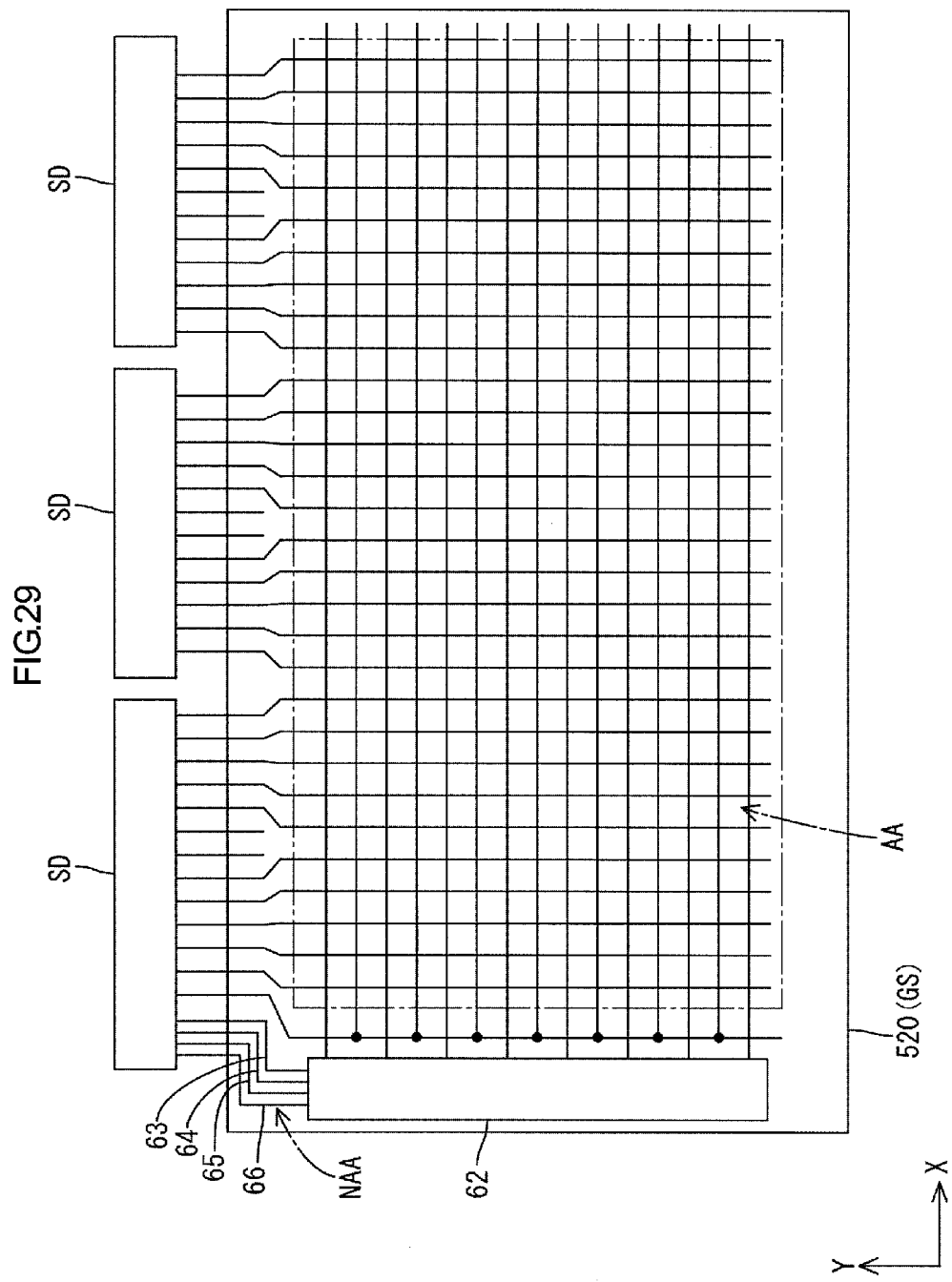
FIG. 29 is a plan view generally illustrating a wiring configuration of an array substrate according to a sixth embodiment of the present invention.
Figure 30:
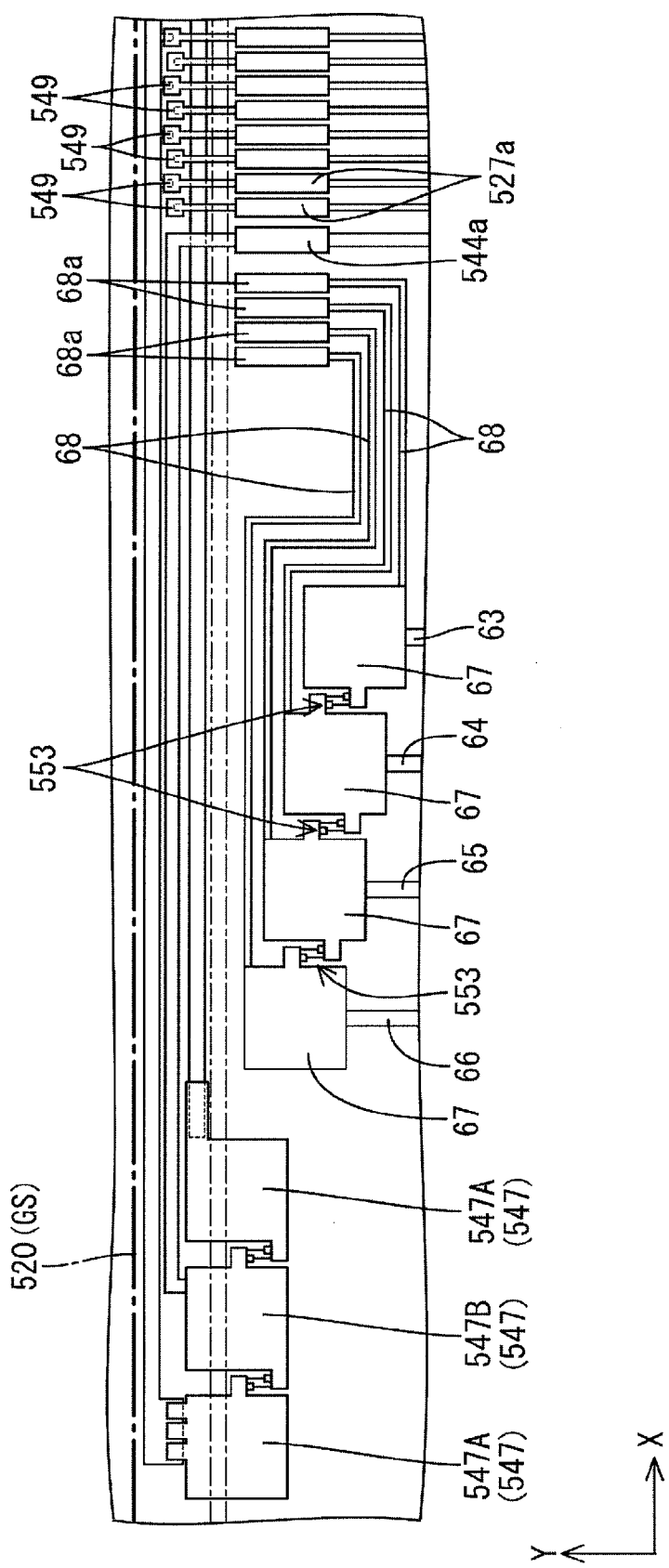
FIG. 30 is a plan view illustrating a wiring configuration of a source driver-side end portion of the array substrate.

As illustrated in FIG. 29, the gate driver GD as is in the first embodiment is not arranged on an array substrate 520 of this embodiment, and a gate driving unit 62 is arranged instead of the gate driver GD. The gate driving unit 62 is formed directly on the glass substrate GS of the array substrate 520 and is formed collectively with the TFTs 24 that are formed in the display area AA in the manufacturing process. Lines 63 to 66 are formed in a corner portion of the non-display area NAA of the array substrate 520. Various signals are supplied to the gate driving unit 62 from the source driver SD via the lines 63 to 66.

The lines 63 to 66 include a STV line for supplying a start signal, a CKV line 64 for supplying a first clock signal, a CKVB line 65 for supplying a second clock signal, and a VSS line 66 for supplying a ground potential. One end of each line 63 to 66 is connected to the gate driving unit 62 and another end thereof is connected to a corresponding check signal input portion 67 as illustrated in FIG. 30. An extended line 68 extends from each of the check signal input portions 67 and an end of each extended line 68 is connected to each extended terminal 68a. The extended terminals 68 are arranged in the X-axis direction with respect to source terminals 527a and a common terminal 544a. The extended terminals 68a are connected to the source driver SD such that the signals from the source driver SD are supplied to the lines 63 to 66. The check signal input portions 67 that are arranged in the X-axis direction are connected to each other via ESD protection circuits 553. The lines 63 to 66, the check signal input portions 67, the extended lines 68, and the extended terminals 68a are arranged between an arrangement area in which the source driver side check signal input portions 547 are arranged and an arrangement area in which the first line connection portions 549 are arranged with respect to the X-axis direction.

Seventh Embodiment

A seventh embodiment of the present invention will be explained with reference to FIG. 31. The seventh embodiment may be a modification of the first embodiment, and the number of source drivers SD and the arrangement of common lines 644 are altered from the first embodiment. The configurations, operations, and effects same as those in the first embodiment will not be explained.

Figure 31:
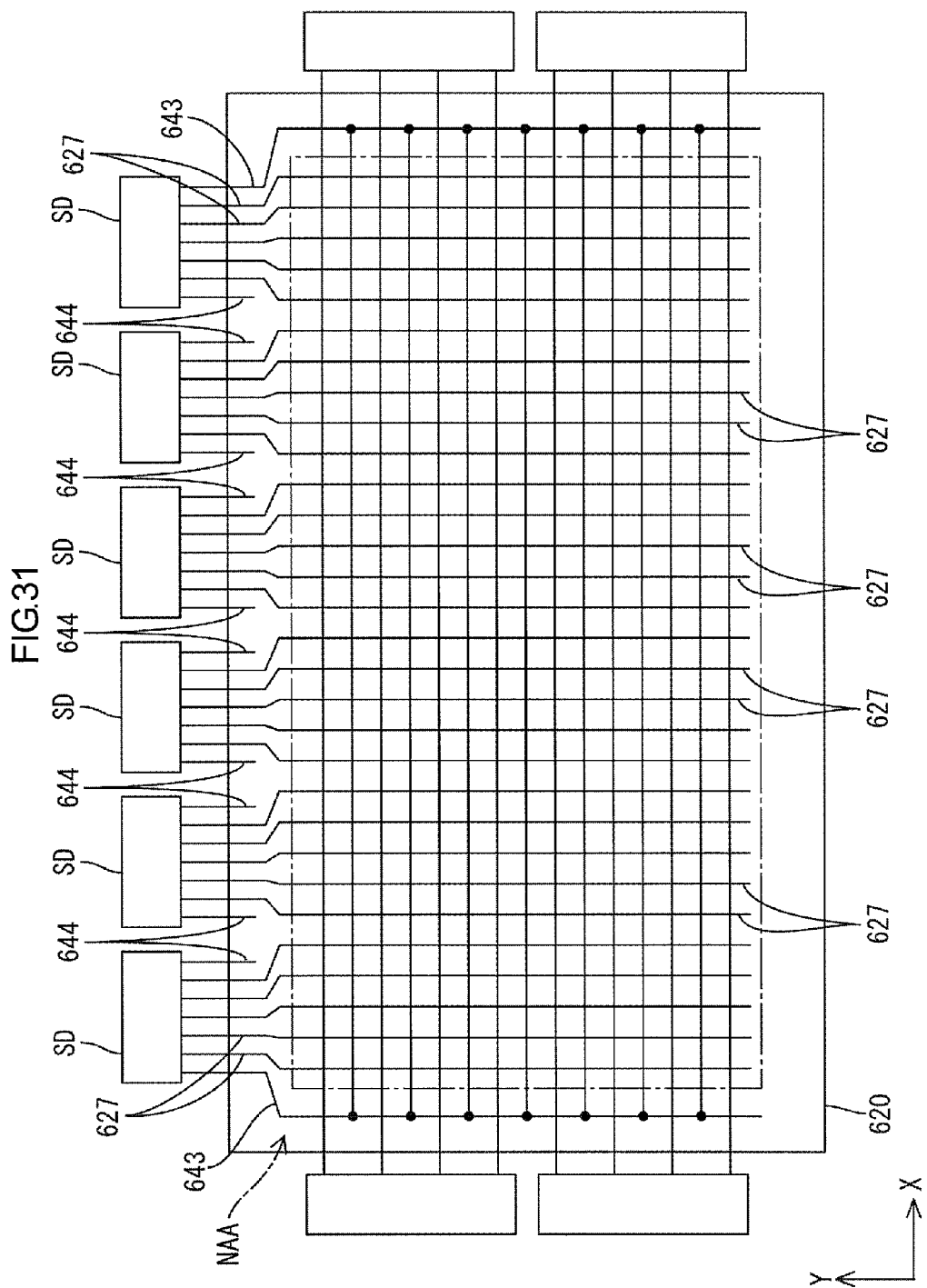
FIG. 31 is a plan view generally illustrating a wiring configuration of an array substrate according to a seventh embodiment of the present invention.

According to this embodiment, as illustrated in FIG. 31, six source drivers SD are arranged in the X-axis direction along one long-side end of an array substrate 620. The common line 644 is arranged on the array substrate 620 corresponding to an end portion of each source driver SD, and an end of the common line 644 is connected to each source driver SD. Specifically, in a pair of source drivers SD that are arranged on two ends in the long side direction of the array substrate 620 among the six source drivers SD, the common line 644 is arranged in an end portion of the source driver SD that is opposite to the end portion of the source driver SD to which a common stem line 643 is connected. The common lines 644 are arranged to be connected to two end portions of the four middle source drivers SD. Therefore, a group of the source lines 627 that are connected to one source driver SD are arranged in the non-display area NAA and between the common stem line 643 arranged on an end side of the source driver SD and the common line 644 or between the common lines 644 arranged on the source driver SD. The wiring configurations same as those in the first embodiment can be applied to the array substrate 620.

Eighth Embodiment

An eighth embodiment of the present invention will be explained with reference to FIG. 32. In the eighth embodiment, source lines 727 are formed in different layers of metal films in the display area AA and in the non-display area NAA. The configurations, operations, and effects that are same as those in the first embodiment will not be explained.

Figure 32:
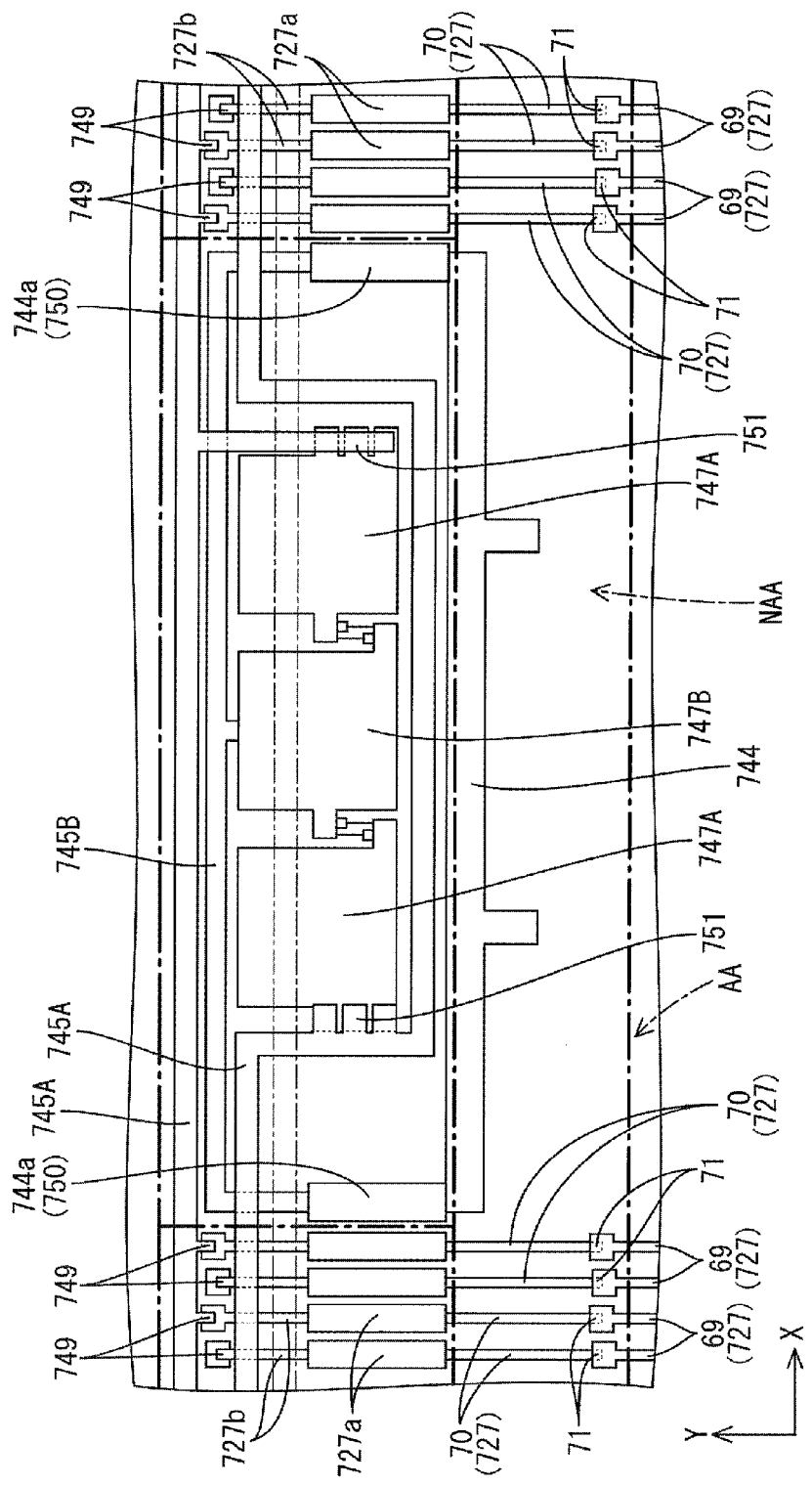
FIG. 32 is a plan view illustrating a wiring configuration of a source driver-side end portion of an array substrate according to a eighth embodiment of the present invention.

As illustrated in FIG. 32, a part of each source line 727 arranged in the display area AA is arranged on an upper layer-side of the gate insulation film 35 and is a display area side line portion 69. The display area side line portion 69 is formed in a two-layer structure including the lower layer side metal film 39 made of titanium (Ti) and the upper layer side metal film 40 made of aluminum (Al) (refer to FIGS. 5 and 7). A part of each source line 727 arranged in the non-display area NAA is arranged on a lower layer-side of the gate insulation film 35 and is a non-display area side line portion 70 that is formed of the same material as the gate electrodes 24a (refer to FIGS. 5 and 7). A long and short alternate dash line extending in the X-axis direction illustrated at the lowest portion in FIG. 32 represents a border between the display area AA and the non-display area NAA. An end portion of each display area side line portion 69 extends to the non-display area NAA and overlaps an end portion of the non-display area side line portion 70 with a plan view. In such an overlapped portion, a source line connection portion 71 is formed. The source line connection portion 71 connects the display area side line portion 69 and the non-display area side line portion 70 that are arranged in different layers via the gate insulation film 35. A specific connection structure of the source line connection portions 71 is similar to the connection structure of the first line connection portions 49 and the third line connection portions 51 (refer to FIGS. 11 and 12) as described in the first embodiment and will not be explained.

Each source line 727 includes a source terminal 727a and an extended portion 727b that are formed of the same material as the non-display area side line portions 70 and they are formed in the same layer. The source terminal 727a is configured such that a surface of the metal film of the gate electrode 24a is covered with a transparent electrode material such as ITO or IZO that is same as a material of the pixel electrodes 25. A first source driver side check line 745A is connected to the extended portions 727b that are the non-display area side line portions 70 of the source lines 727. The first source driver side check line 745A is formed of the same material as the display area side line portions 69 of the source lines 727 and is formed in a two-layer structure including the lower layer-side metal film 39 and the upper layer-side metal film 40. First line connection portions 749 that connect the extended portions 727b of the source lines 727 and the first source driver side check line 745A have the same structure as that of the first embodiment (refer to FIGS. 11 and 12) and will not be explained.

On the other hand, a common line 744 is formed of the same material as the gate electrodes 24a and includes a common terminal 744a (a second line connection portion 750). The common terminal 744a is configured such that a surface of the metal film of the gate electrode 24a is covered with the transparent electrode material such as ITO or IZO that is a same material as the pixel electrodes 25. A second source driver side check line 745B that is connected to the common line 744 is formed of the same material as the gate electrodes 24a and the common line 744.

A first source driver side check signal input portion 747A and a second source driver side check signal input portion 747B are formed of the same material as the gate electrodes 24a and configured such that surfaces thereof are covered with the transparent electrode material such as the ITO or IZO that is same as the pixel electrodes 25. A third line connection portion 751 connects the first source driver side check line 745A and the first source driver side check input portion 747A and has a similar structure as the first embodiment (refer to FIGS. 11 and 12) and will not be explained.

Other Embodiments

The present invention is not limited to the above embodiments described in the above description and the drawings.

The following embodiments are also included in the technical scope of the present invention, for example.

Figure 33:
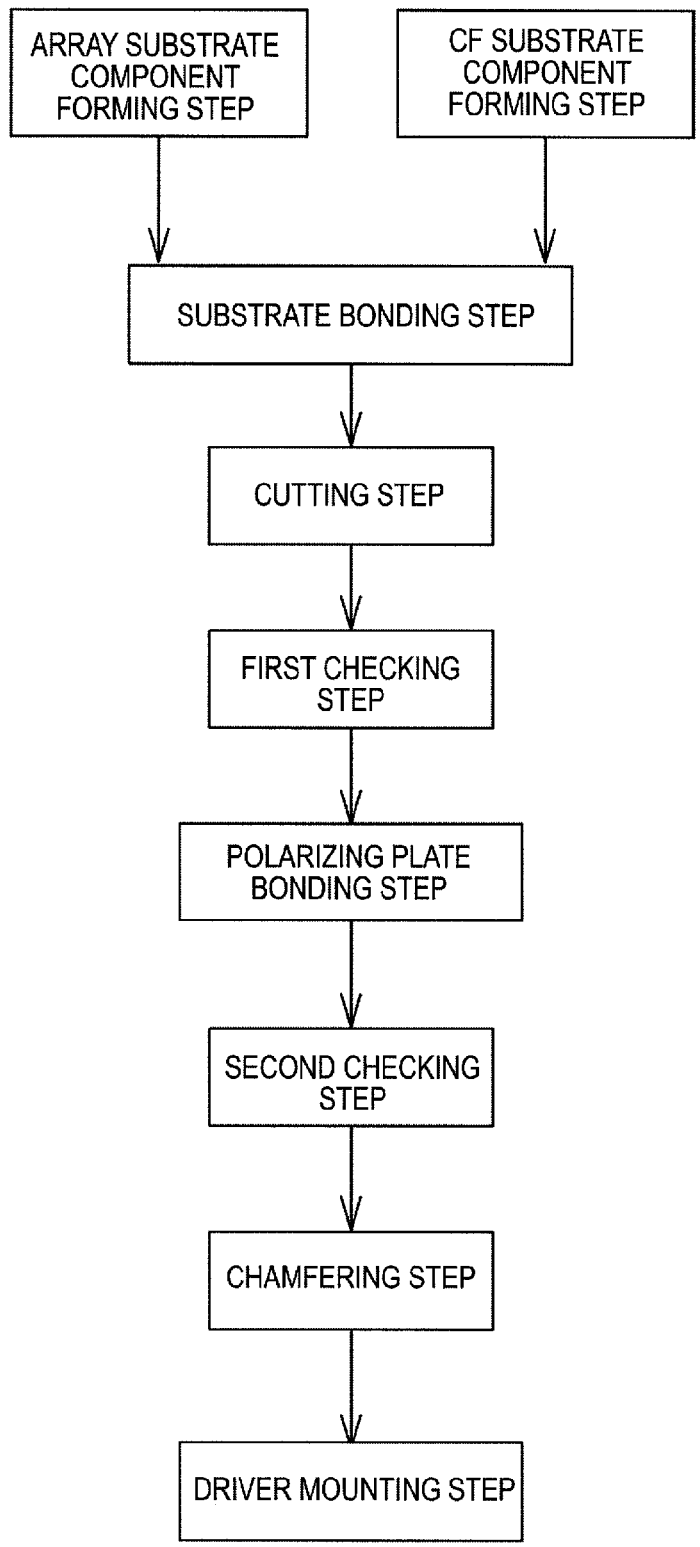
FIG. 33 is a flowchart illustrating a method of manufacturing a liquid crystal panel according to another embodiment (1) of the present invention.

(1) Other than the above embodiments, the method of manufacturing the liquid crystal panel (the array substrate) may be altered if necessary. For example, as illustrated in FIG. 33, the checking step with using the check lines and the check signal input portions may be performed twice. A first checking step may be performed after performing the cutting step and a second checking step may be performed after performing the polarizing plate bonding step.

Figure 34:
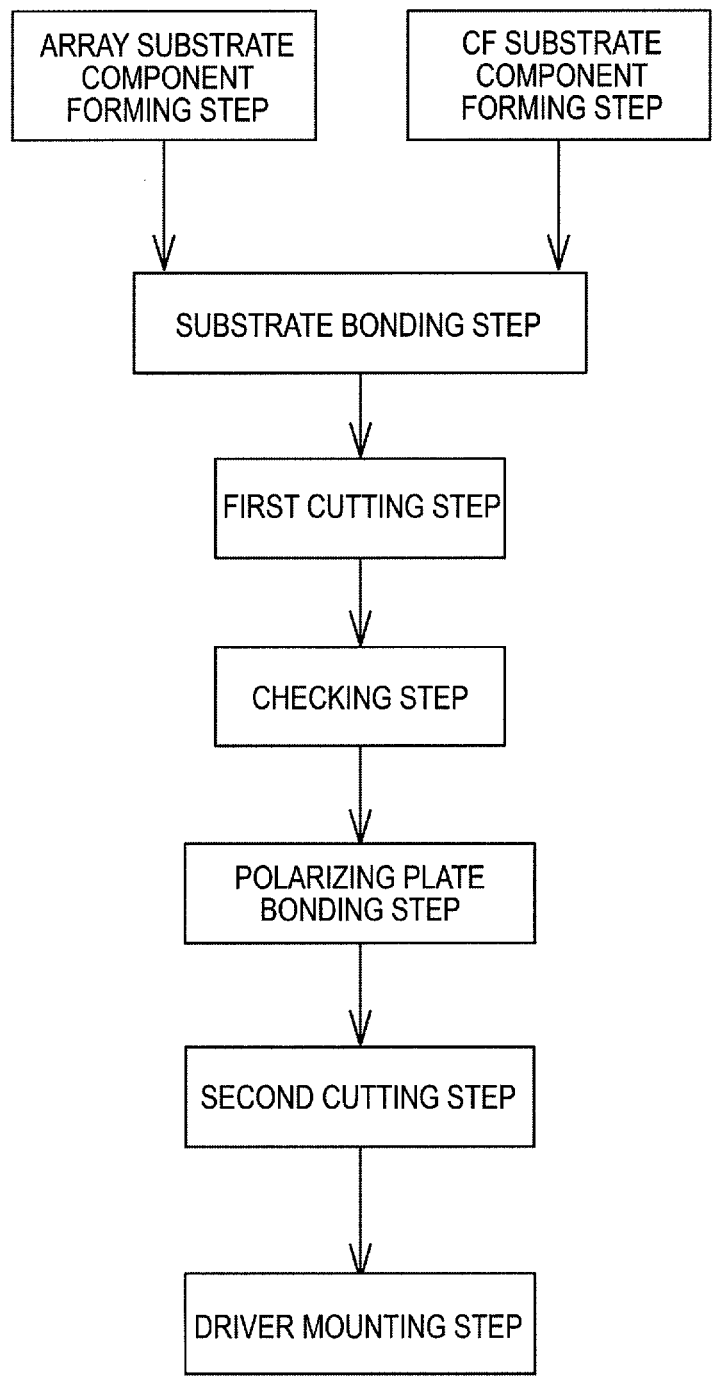
FIG. 34 is a flowchart illustrating a method of manufacturing a liquid crystal panel according to another embodiment (2) of the present invention.

(2) Other than the above (1), instead of the chamfering step, the glass substrate may be cut to remove the check lines. Specifically, as illustrated in FIG. 34, a first cutting step is performed after performing the substrate bonding step to cut the mother glass into a plurality of liquid crystal panels, and a second cutting step (the removing step) may be performed after performing the polarizing plate bonding step to cut end portions of the glass substrate and remove the check lines.

(3) In the above embodiments, the first line connection portions that connect the source driver side check line and the source lines are arranged to be offset from the source driver side check line with respect to the Y-axis direction. However, the first line connection portions may be arranged to overlap the source drive side check line with a plan view.

(4) In the above embodiments, the first source driver side check line is arranged to cross the second region and the third region, and the first line connection portions are arranged in the second region, and the second source driver side check line and the second line connection portions are arranged in the third region. Such arrangement configurations may be applied to the gate driver side check line and the line connection portions.

(5) In the above embodiments, one gate driver side check line is connected to one end of one gate line, and another gate driver side check line is connected to another end of another gate line. Such arrangement configurations may be applied to the source driver side check line and the source lines.

(6) In the above embodiments, the source driver is connected to only one side end portion of the array substrate and each of the source lines is driven at one side by the source driver. However, the source driver may be mounted to two end portions of the array substrate such that the each of source lines may be driven at two sides thereof.

(7) In the above embodiments, the gate driver is mounted to two end portions of the array substrate such that each of the gate lines is driven at two sides thereof by the gate drivers. However, the gate driver may be mounted to only one side end portion of the array substrate to drive each of the gate lines at one side thereof.

(8) In the second embodiment, the gate driver side check lines are arranged to cross the cutting position for the glass substrates. Such a configuration may be applied to the source driver side check lines such that the source driver side check liens are arranged to cross the cutting position for the glass substrates. Further, the adjacent source driver side check lines may be connected by the check line connection portions.

(9) In the second embodiment, the removal check signal input portions and the removal check connection lines are arranged in the source driver side end portion of the array substrate. However, the removal check signal input portions and the removal check connection lines may be arranged in the gate driver side end portion of the array substrate.

(10) In the above embodiments, the first line connection portions and the third line connection portions that connect different layers are formed of the same material as the pixel electrodes and they are formed in the same layer. However, the first line connection portions and the third line connection portions may be formed of a conductive material different from the pixel electrodes and formed in a different layer from the pixel electrodes.

(11) Other than the above embodiments, a specific configuration of the ESD protection circuit may be altered if necessary and a varistor element, for example, may be used for the ESD protection circuit.

(12) In the above embodiments, a reference potential is supplied from the source driver to the capacity line via the capacity stem line. However, the capacity connection line that is connected to the gate driver may be formed on the array substrate and a reference potential may be supplied from the source driver to the capacity line via the capacity connection line and the gate driver.

(13) In the above embodiments, the checking step with using the check lines and the check signal input portions is performed after performing the substrate bonding step. However, the checking step may be performed after performing the array substrate component forming step, and thereafter the substrate bonding step may be performed.

(14) In the above embodiments, cold cathode tubes are used for a light source of the backlight device of the liquid crystal display device. However, other light source such as hot cathode tubes or LEDs may be used.

(15) In the above embodiments, a direct-type backlight device is included in the liquid crystal display device. However, an edge light type backlight device may be used.

(16) In the above embodiments, a transmissive type liquid crystal display device including a backlight device that is an external light source is used. However, the present invention may be applied to a reflective type liquid crystal display device capable of displaying with using natural light and in such a case, the backlight device is not necessary.

(17) In the above embodiments, the TFT is used as the switching element of the liquid crystal display device. However, the present invention may be applied to liquid crystal display devices including switching elements other than the TFT (for example, a thin film diode (TFD)). The present invention may be also applied to liquid crystal display device displaying black and white images other than the liquid crystal display device displaying color images.

(18) In the above embodiments, the liquid crystal display device using a liquid crystal panel as the display panel. However, the present invention may be applied to display devices using other kinds of display panels (such as PDP or an organic EL panel). In such a case, the backlight device may not be necessary.

(19) The configuration described in the seventh embodiment (in which the common line is connected to an end portion of the source driver) may be applied to any of the second to sixth embodiments, and eighth embodiment (including the modifications of the fourth embodiment) other than the first embodiment and the modifications thereof.

(20) The configuration described in the eighth embodiment (in which the source line is configured with the metal films which are formed in different layers in the display area and the non-display area) may be applied to any one of the second to seventh embodiments (Including the modifications of the fourth embodiment) other than the first embodiment and the modifications thereof.

(21) Other than the above embodiments, the specific number of the source drivers and the gate drivers arranged for the array substrate may be changed if necessary.

(22) In the above embodiments, a plurality of source driver side check lines are arranged for each source driver. However, the source driver side check line may be arranged to cross an area in which a plurality of source drivers are arranged. For example, two source driver side check lines may be arranged to extend in an area in which all the source drivers are arranged. One of the source driver side check lines may be connected to the odd numbered source lines and another one of the source driver side check lines may be connected to the even numbered source lines. In such a configuration, a total number of the source driver side check lines arranged on the array substrate may be more than two and, for example, may be less than the twice of the number of the source drivers.

(23) In the first embodiment, all the source lines are formed of the same metal film in the display area and the non-display area. In the eighth embodiment, all the source lines are formed of metal films in a different layer in the display area and in the non-display area. However, for example, the source lines having the configuration of the first embodiment and the source lines having the configuration of the eighth embodiment may be arranged on one array substrate.

EXPLANATION OF SYMBOLS

20: array substrate (element substrate), 23: polarizing plate, 25: pixel electrode, 26: gate line (line, a pair of lines), 27: source lines (first line, line), 35: gate insulation film (insulation layer), 35a: opening, 43: capacity stem line (second line), 44: common line (second line), 45: source driver side check line (check line), 45A: first source driver side check line (first check line), 45B: second source driver side check line (second check line), 46: gate driver side check line (check line, one check line, another check line), 47: source driver side check signal input portion, 48: gate driver side check signal input portion, 49: first line connection portion (line connection portion), 50: second line connection portion (line connection portion), 53: ESD protection circuit, 53a: protection circuit TFT (transistor), 54: check line connection portion, 55: removal check signal input portion, 56: first removal check connection line (removal check connection line), 57: second removal check connection line (removal check connection line), 144: common line (second line), 146B: second gate driver side check line (second check line), 148B: second gate driver side check signal input portion (removal check signal input portion), AA: display area (substrate), MGS: mother glass (substrate parent material), NAA: non-display area (outer peripheral side area), NRA: non-removing area, RA1: first removing area, RA2: second removing area

The invention claimed is:

1. A method of manufacturing an element substrate comprising:
    a line forming step of forming lines on a substrate, the line forming step including:
        forming a plurality of first lines extending from a first region of the substrate to a second region that is adjacent to the first region on an outer side of the first region;
        forming a plurality of first check lines extending from the second region to a third region that is adjacent to the first region on the outer side of the first region and adjacent to the second region;
        forming a plurality of first line connection portions in the second region, the first line connection portions connecting the first lines and the first check lines;
    forming a second line extending from the first region to the third region; and
    forming a second check line and a second line connection portion in the third region, the second line connection portion connecting the second line and the second check line;
    a checking step of inputting a check signal to the plurality of first check lines and the second check line and checking the plurality of first lines and the second line; and
    a removing step of removing at least a part of one of the first check line and the second check line in the second region and the third region and disconnecting the first line and the first check line and disconnecting the second line and the second check line; wherein
    in the line forming step,
        the first check lines are formed of a same material and formed in a same layer, and
        the second check line is formed of a material different from the first check line and is formed in a layer different from a layer in which the first check line is formed with having an insulation layer between the second check line and the first check line.

2. The method of manufacturing an element substrate according to claim 1, wherein in the line forming step,
    the first lines and the second line are formed with a same material as the second check line and they are formed in a same layer,
    an opening is formed at a portion of the insulation layer overlapping one of the first line and the first check line, and
    the first line connection portion is formed so as to cover the opening, the first line connection portion configured to connect the first line and the first check line that are formed in different layers.

3. The method of manufacturing an element substrate according to claim 1, wherein in the line forming step, pixel electrodes are formed and the first line connection portions are formed with a same material and in a same layer as the pixel electrodes.

4. The method of manufacturing an element substrate according to claim 1, wherein in the line forming step, an ESD protection circuit is formed, the ESD protection circuit configured to be connected to the plurality of first check lines and the second check line.

5. The method of manufacturing an element substrate according to claim 4, wherein in the line forming step, a transistor is formed as the ESD protection circuit, the transistor configured to connect the first check lines each other and connect the first check line and the second check line, and the transistor having a threshold voltage value relatively higher than a voltage value of the check signal that is input to the first check line and the second check line in the checking step.

6. The method of manufacturing an element substrate according to claim 1, wherein in the line forming step,
    at least a pair of first check lines are formed so as to be parallel to an outer end of the second region as the plurality of the first check lines, and
        the plurality of first line connection portions are arranged between the pair of first check lines that are parallel to the outer end of the second region and along an extending direction in which the first check lines extend.

7. The method of manufacturing an element substrate according to claim 1, wherein in the line forming step,
    at least a pair of first check lines are formed so as to be parallel to an outer end of the second region as the plurality of the first check lines, and
        the plurality of first line connection portions are formed so as to sandwich at least one of the pair of first check lines that are parallel to the outer end of the second region.

8. A method of manufacturing an element substrate comprising:
    a line forming step of forming lines on a substrate, the line forming step including:

forming a line extending from a non-removing area of the substrate to a first removing area that is adjacent to the non-removing area on an outer side;

forming a check line extending from the first removing area to a second removing area that is adjacent to the non-removing area on an outer side and adjacent to the first removing area;

forming a line connection portion in the first removing area, the line connection portion connecting the line and the check line; and forming a check signal input portion extending from the non-removing area to the second removing area, the check signal input portion being connected to the check line;

a checking step of inputting a check signal to the check signal input portion and checking the line via the check line; and a removing step of removing at least a part of at least the line check line and the line connection portion and disconnecting the line from the check line and removing a part of the check signal input portion.

9. A method of manufacturing an electrode substrate comprising:

a line forming step of forming lines on a substrate, the line forming step including:

forming at least a pair of lines extending from an inner peripheral side area of the substrate to a pair of outer peripheral side areas that are located to sandwich the inner peripheral side area from outer sides;

forming one check line in one of the pair of outer peripheral side areas, the one check line being connected to one end side of one of the pair of lines; and forming another check line in another one of the pair of outer peripheral side areas, the other check line being connected to another end side of the pair of lines; and a checking step of inputting a check signal to the one check line and the other check line and checking at least the pair of lines; and a removing step of removing at least a part of each of the one check line and the other check line in the pair of outer peripheral side areas and disconnecting the one line from the one check line and disconnecting the other line from the other check line.

10. The method of manufacturing an electrode substrate according to claim 9, further comprising:

a substrate cutting step of cutting a substrate parent material into a plurality of substrates, the substrate cutting step being performed between the line forming step and the checking step, wherein in the line forming step, at least one of the one check line and the other check line are formed so as to cross a cutting position of the substrate in the substrate cutting step.

11. The method of manufacturing an electrode substrate according to claim 10, wherein in the line forming step, a second line is formed in one of the pair of outer peripheral side areas, a second check line is formed to cross the cutting position of the substrate in the substrate cutting step, the second check line being connected to the second line, and a check line connection portion is formed in an area that is on an outer side from the cutting position of the substrate in the substrate cutting step, the check line connection portion being connected to the second check line and one of the one check line and the other check line, and in the substrate cutting step, removing the check line connection portion from the substrate according to the cutting of the substrate parent material into the substrates.

12. The method of manufacturing an electrode substrate according to claim 1, wherein in the line forming step, a plurality of removal check signal input portions are formed in an area of the substrate in which a part of the substrate is not to be removed in the removing step, a removal check connection line is formed in a part of the substrate that is to be removed in the removing step, the removal check connection line connecting the removal check signal input portions each other, and after the removing step, the removal checking step is performed and in the removal checking step, it is judged whether the removing step is correctly performed based on a current flowing state between the removal check signal input portions.

13. The method of manufacturing an electrode substrate according to claim 1, in the removing step, a part of the substrate having a predetermined area ranging from an outer end is chamfered.

14. The method of manufacturing an electrode substrate according to claim 1, further comprising:

a polarizing plate mounting step of mounting a polarizing plate on a surface of the substrate opposite to a line forming surface thereof, wherein the polarizing plate mounting step is performed prior to the removing step.

15. The method of manufacturing an electrode substrate according to claim 8, wherein in the line forming step, a plurality of removal check signal input portions are formed in an area of the substrate in which a part of the substrate is not to be removed in the removing step, a removal check connection line is formed in a part of the substrate that is to be removed in the removing step, the removal check connection line connecting the removal check signal input portions each other, and after the removing step, the removal checking step is performed and in the removal checking step, it is judged whether the removing step is correctly performed based on a current flowing state between the removal check signal input portions.

16. The method of manufacturing an electrode substrate according to claim 8, in the removing step, a part of the substrate having a predetermined area ranging from an outer end is chamfered.

17. The method of manufacturing an electrode substrate according to claim 8, further comprising:

a polarizing plate mounting step of mounting a polarizing plate on a surface of the substrate opposite to a line forming surface thereof, wherein the polarizing plate mounting step is performed prior to the removing step.

18. The method of manufacturing an electrode substrate according to claim 9, wherein in the line forming step, a plurality of removal check signal input portions are formed in an area of the substrate in which a part of the substrate is not to be removed in the removing step, a removal check connection line is formed in a part of the substrate that is to be removed in the removing step, the removal check connection line connecting the removal check signal input portions each other, and after the removing step, the removal checking step is performed and in the removal checking step, it is judged whether the removing step is correctly performed based on a current flowing state between the removal check signal input portions.

19. The method of manufacturing an electrode substrate according to claim 9, in the removing step, a part of the substrate having a predetermined area ranging from an outer end is chamfered.

20. The method of manufacturing an electrode substrate according to claim 9, further comprising:
  a polarizing plate mounting step of mounting a polarizing plate on a surface of the substrate opposite to a line forming surface thereof,
  wherein the polarizing plate mounting step is performed prior to the removing step.

* * * * *